(12) United States Patent
Awaya et al.

(10) Patent No.: US 8,450,713 B2
(45) Date of Patent: May 28, 2013

(54) NONVOLATILE SEMICONDUCTOR MEMORY DEVICE AND MANUFACTURING METHOD FOR SAME

(75) Inventors: Nobuyoshi Awaya, Osaka (JP); Yoshiji Ohta, Osaka (JP); Yoshiaki Tabuchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 195 days.

(21) Appl. No.: 12/713,223

(22) Filed: Feb. 26, 2010

(65) Prior Publication Data

US 2010/0219392 A1   Sep. 2, 2010

(30) Foreign Application Priority Data

Feb. 27, 2009 (JP) ................................ 2009-046221
May 12, 2009 (JP) ................................ 2009-115509
Oct. 21, 2009 (JP) ................................ 2009-241995

(51) Int. Cl.
*H01L 45/00* (2006.01)
*H01L 21/822* (2006.01)

(52) U.S. Cl.
USPC ............... 257/3; 257/536; 257/4; 257/537; 257/E29.32; 257/E45.003; 438/28; 438/382; 438/237

(58) Field of Classification Search ........... 257/536, 257/E29.326, 4, 537, E29.32, 3, E45.003, 257/E21.614, 315, 326, 42; 438/128, 382, 438/237
See application file for complete search history.

(56) References Cited

U.S. PATENT DOCUMENTS

| 2004/0202041 A1 | 10/2004 | Hidenori |
| 2005/0230724 A1 | 10/2005 | Hsu |
| 2008/0175032 A1 | 7/2008 | Tanaka et al. |
| 2008/0265235 A1* | 10/2008 | Kamigaichi et al. ............ 257/2 |
| 2009/0321878 A1* | 12/2009 | Koo et al. ..................... 257/536 |

FOREIGN PATENT DOCUMENTS

| JP | 2004-319587 A | 11/2004 |
| JP | 2008-181978 A | 8/2008 |
| JP | 2008-277543 A | 11/2008 |
| JP | 2009-4725 A | 1/2009 |

* cited by examiner

*Primary Examiner* — Cathy N Lam
(74) *Attorney, Agent, or Firm* — Birch, Stewart, Kolasch & Birch, LLP

(57) ABSTRACT

A three-dimensional memory cell array of memory cells with two terminals having a variable resistive element is formed such that: one ends of memory cells adjacent in Z direction are connected to one of middle selection lines extending in Z direction aligned in X and Y directions; the other ends of the memory cells located at the same point in Z direction are connected to one of third selection lines aligned in Z direction; a two-dimensional array where selection transistors are aligned in X and Y directions is adjacent to the memory cell array in Z direction; gates of selection transistors adjacent in X direction, drains of selection transistors adjacent in Y direction and sources of selection transistors are connected to same first selection line, second selection line, and different middle selection lines, respectively; and first, second and third selection lines are connected to X, Y and Z decoders, respectively.

11 Claims, 38 Drawing Sheets

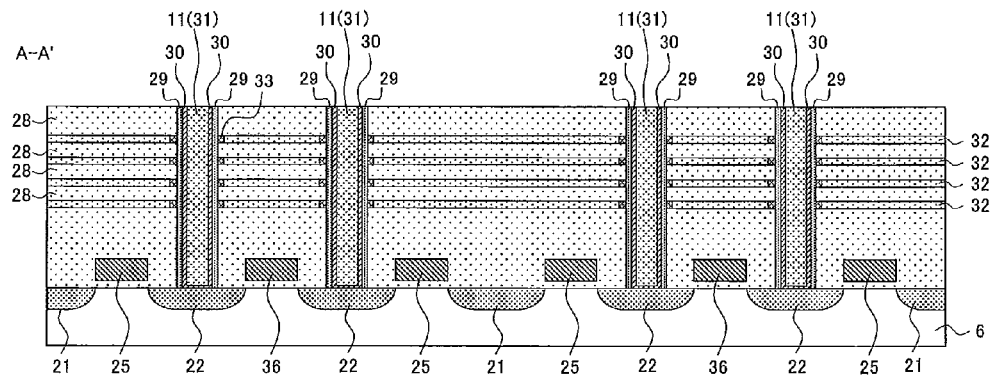
FIG. 13A
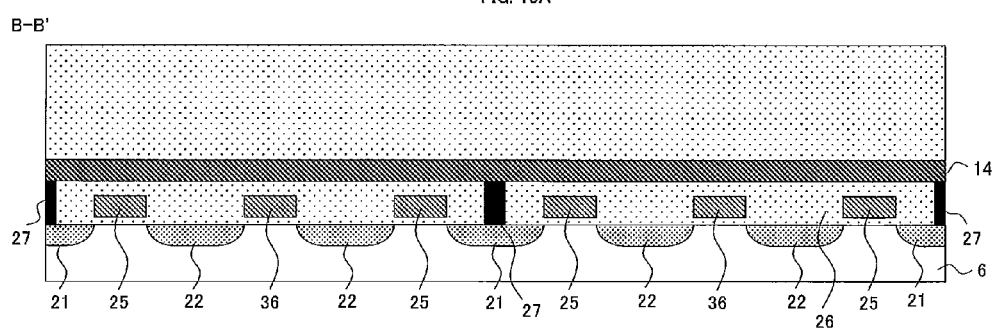
FIG. 13B
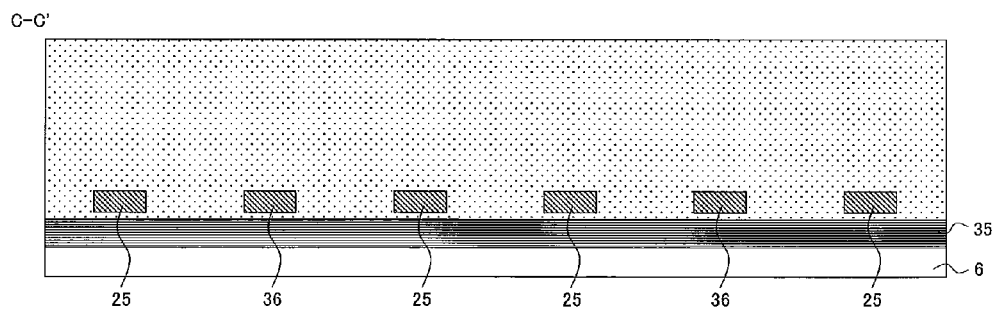
FIG. 13C
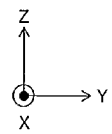

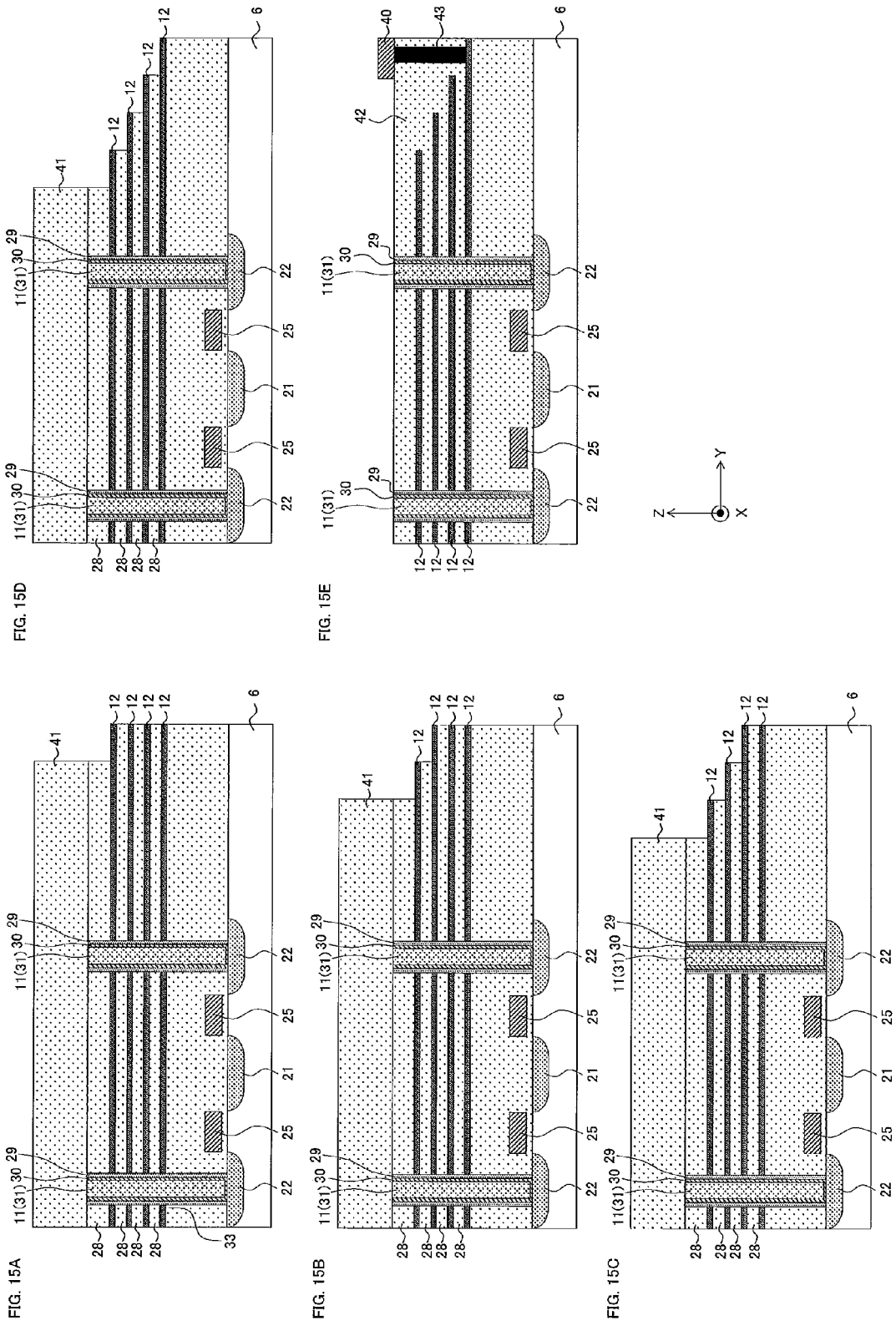

| Operation | Selected Bit Line VBL1 | Non-selected Bit Line VBL0 | Selected Word Line VWL1 | Non-selected Word Line VWL0 | Selected Common Plate VCP1 | Non-selected Common Plate VCP0 |
|---|---|---|---|---|---|---|
| Initialize | 0V | 5V | 1.2V | 0V | 5V | 0V |
| Set | 0V | 3V | 1.8V | 0V | 3V | 0V |
| Reset | 0V | 1.2V | 3V | 0V | 1.2V | 0V |
| Read Out | 0V | 0.5V | 3V | 0V | 0.4V | 0V |

FIG. 17

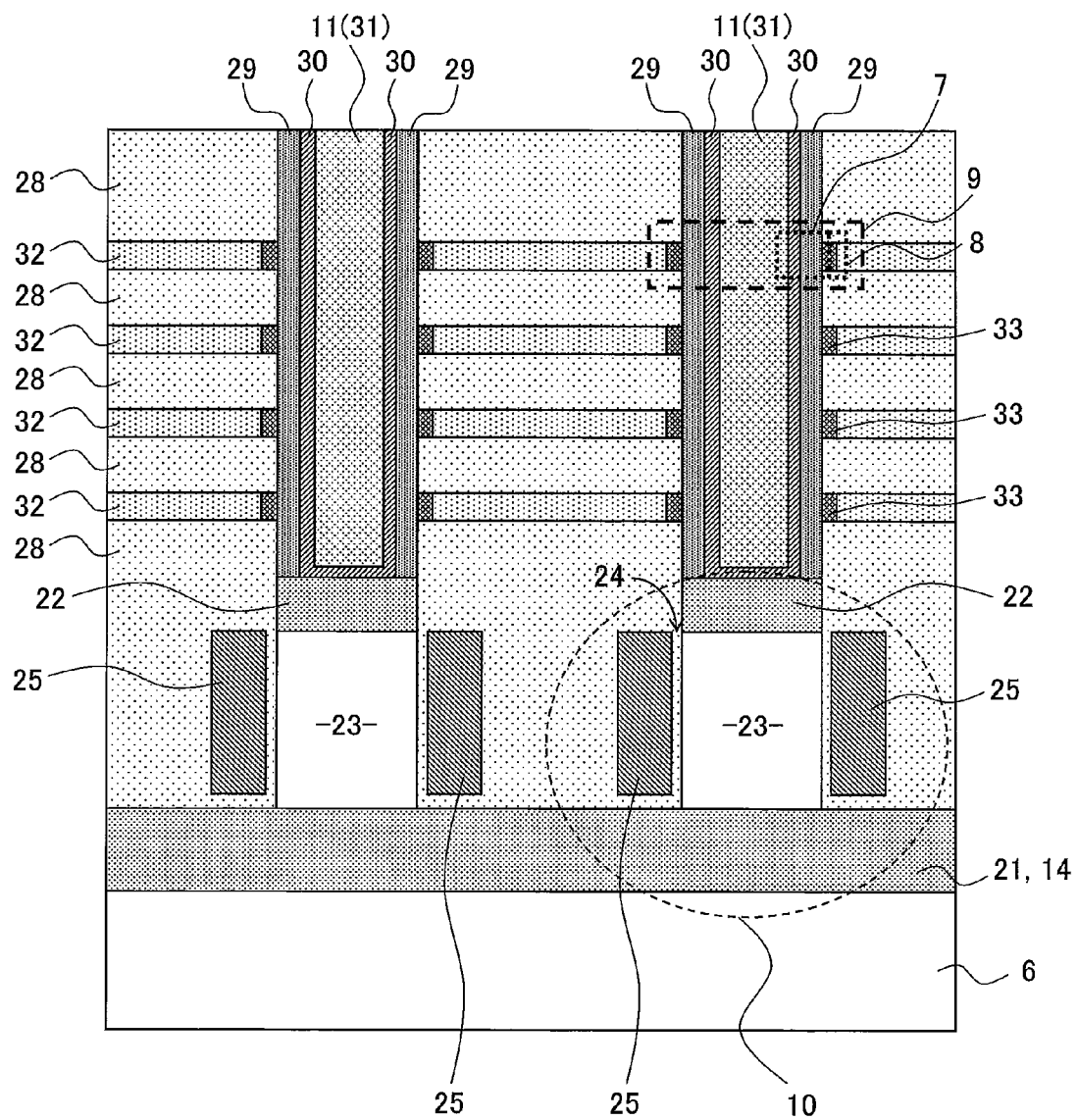
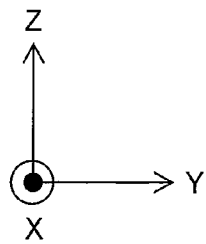
FIG. 18

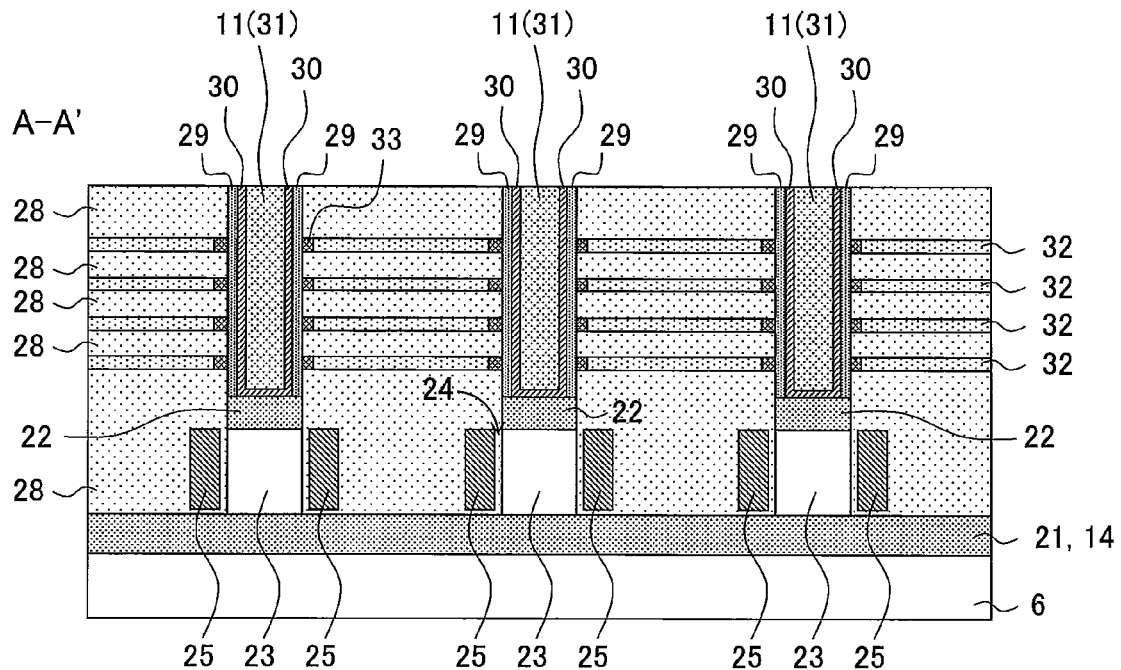
FIG. 20A
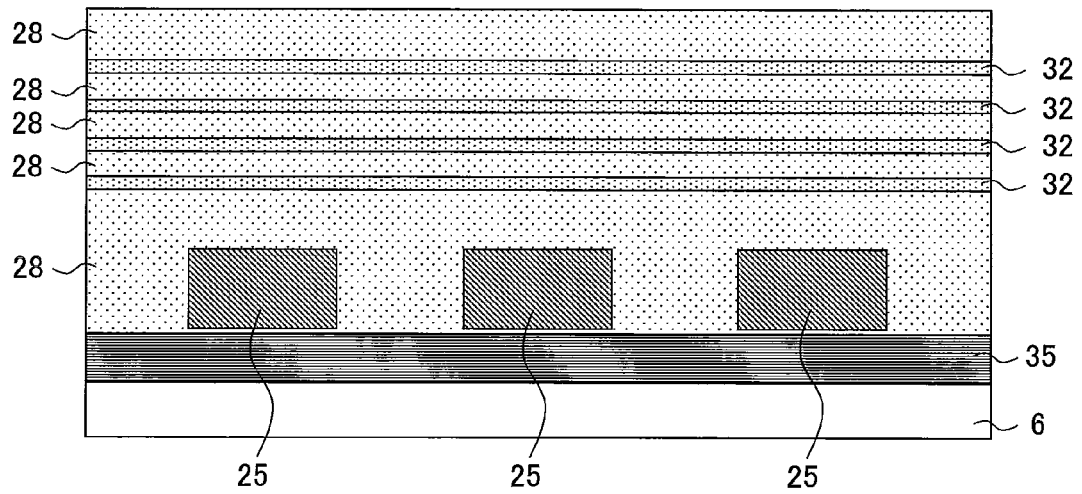
FIG. 20B
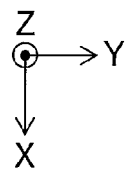

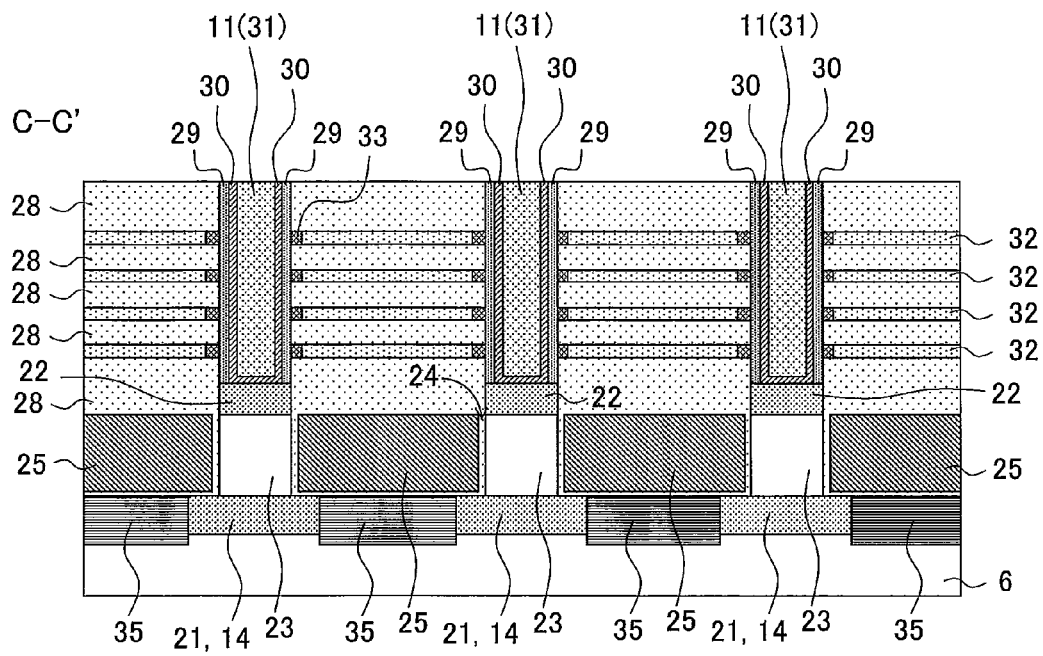
FIG. 21A
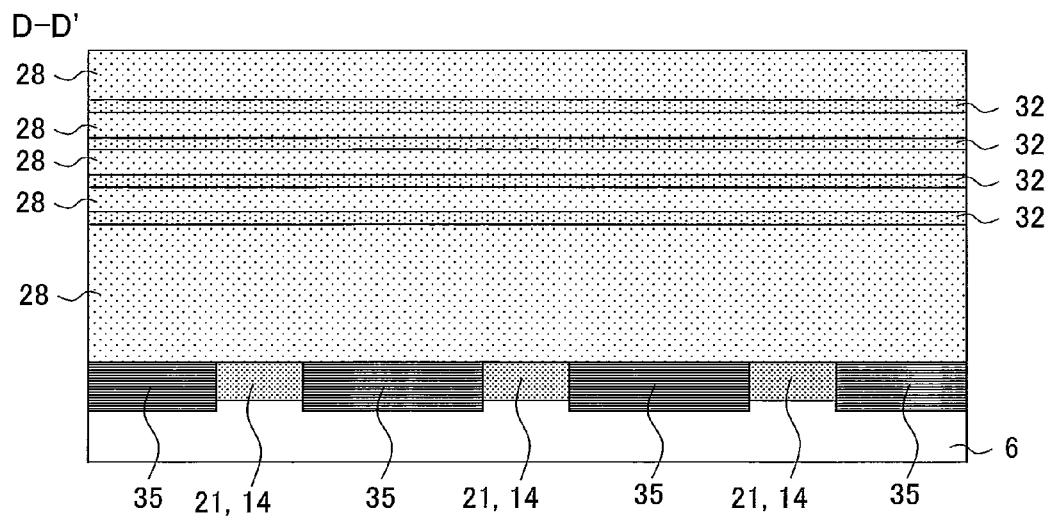
FIG. 21B
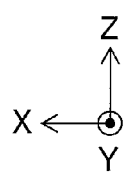

| Operation | Selected Bit Line | Non-selected Bit Line | Selected Word Line | Non-selected Word Line | Selected Common Plate | Non-selected Common Plate |
|---|---|---|---|---|---|---|
| Set | 3V | 0V | 1.8V | 0V | 0V | 3V |
| Reset | 0V | 1.2V | 3V | 0V | 1.2V | 0V |
| Initialize | 5V | 3V | 1.2V | 0V | 0V | 3V |

FIG. 36

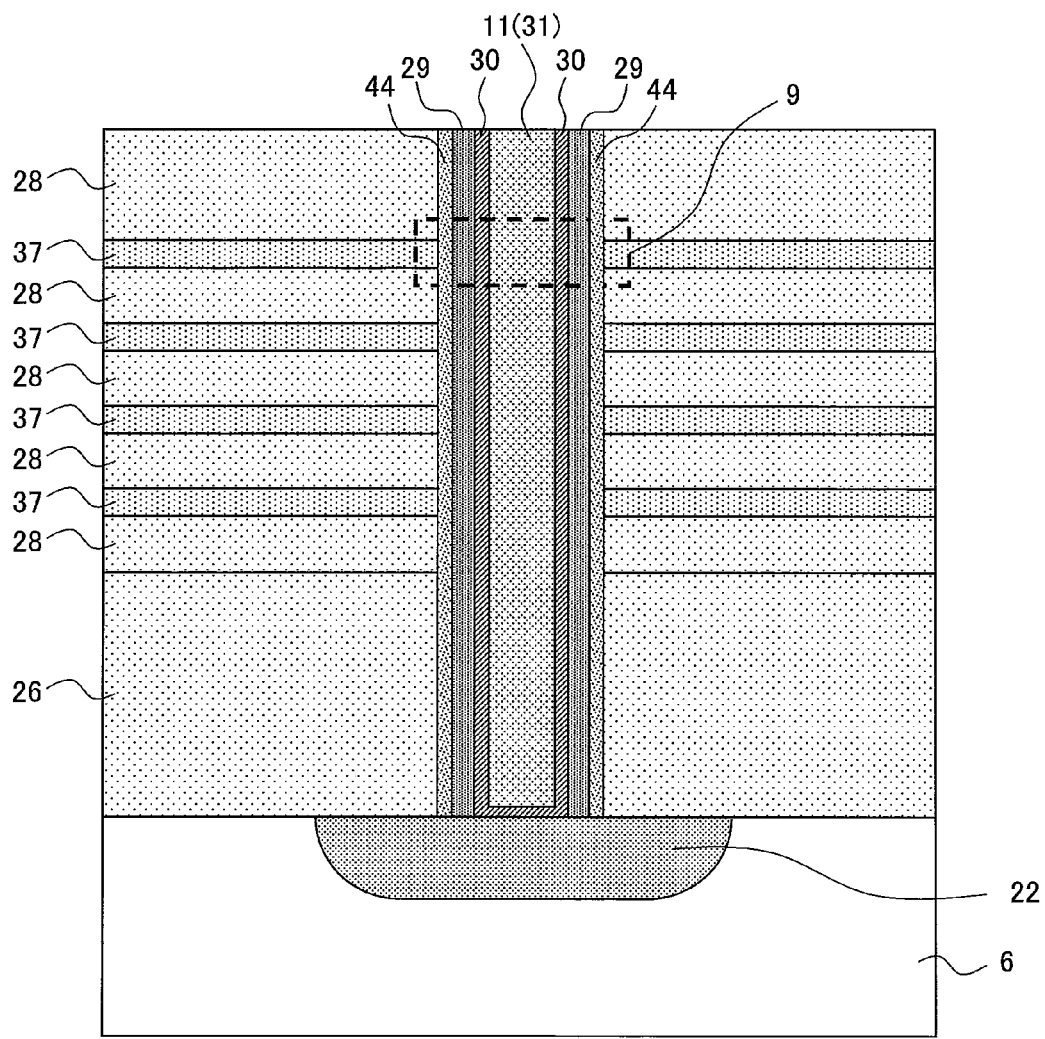
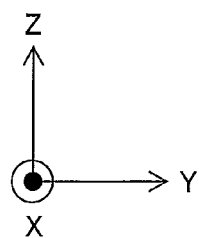
FIG. 37

NONVOLATILE SEMICONDUCTOR MEMORY DEVICE AND MANUFACTURING METHOD FOR SAME

CROSS REFERENCE TO RELATED APPLICATION

This Nonprovisional application claims priority under 35 U.S.C. §119(a) on Patent Applications No. 2009-046221 filed in Japan on 27 Feb. 2009, No. 2009-115509 filed in Japan on 12 May, 2009, and No. 2009-241995 filed in Japan on 21 Oct. 2009 the entire contents of which are hereby incorporated by reference.

BACKGROUND OF THE INVENTION

1. Field of the Invention

The present invention relates to a nonvolatile semiconductor memory device having a three-dimensional memory cell array where memory cells with two terminals having a nonvolatile variable resistive element are aligned in a three-dimensional matrix where the first direction, second and third direction are perpendicular to each other, as well as a manufacturing method for the same, and in particular, to a nonvolatile semiconductor memory device where the variable resistive element with two terminals that forms the memory cells reversibly changes between two or more different resistive states determined by the electrical resistance between the two terminals, and the states reversibly change when a voltage is applied and can be held in a nonvolatile manner, as well as a manufacturing method for the same.

2. Description of the Related Art

Flash memories, which are inexpensive nonvolatile memories having a large capacity that can store data even with the power turned off, are coming more widely into use together with the spread of mobile devices, such as portable electronics. In recent years, however, the limit as to how far flash memories can be miniaturized has become evident, and nonvolatile memories, such as MRAMs (magnetoresistance variable memories), PCRAMs (phase variable memories), CBRAMs (solid electrolyte memories) and RRAMs (resistance variable memories), have been in development full steam. From among these nonvolatile memories, RRAMs have been drawing attention because of their advantages, such as the fact that they make high speed rewriting possible, simple binary transition metal oxides can be used as the material, making fabrication easy, and they are highly compatible with existing CMOS processes.

From among memory devices formed of memory cells having variable resistive elements with two terminals, such as RRAMs, the combination of a memory cell structure and memory cell array structure that makes the greatest capacity possible provides a cross-point type memory cell array where 1R type memory cells each formed of a single variable resistive element are provided at the intersections between perpendicular wires. 1R type memory cells do not have any element that limits the current flowing through the variable resistive element, and therefore, can easily form a three-dimensional memory cell array where a number of layers of cross point type memory cell arrays are layered on top of each other (see for example US Unexamined Patent Publication 2005/0230724). However, 1R type memory cells do not have a current limiting element, and a parasitic current (leak current) flows through memory cells connected to unselected wires other than the memory cell formed between the two selected wires, and therefore, the parasitic current overlaps with the readout current that flows through the selected memory cell, and a problem arises, such that it becomes difficult, or impossible, to detect the readout current.

Measures against parasitic currents in 1R type memory cells include a method for providing a 1T1R type memory cell structure by connecting transistors to the variable resistive elements in series, and a method for providing a 1D1R type memory cell structure by connecting current limiting elements, such as diodes or barristers, to the variable resistive elements in series. Though 1T1R type memory cells are excellent in terms of controllability because it is possible to control the strength and direction of the current that flows through the variable resistive elements, they occupy a large area and cannot easily provide a multilayer structure, and therefore, the memory capacity is largely limited by the chip area and design rules. Meanwhile, 1D1R type memory cells can provide unit elements with a minimal area due to their cross point structure by optimizing the process, and as shown in Japanese Unexamined Patent Publication 2009-4725, for example, multiple layers are also possible, and thus, they are appropriate for large capacity.

In the case where a three-dimensional memory cell array is formed by providing multiple layers of conventional cross point type memory cell arrays, however, the photolithographic steps of forming patterns with a minimal size using an expensive state of the art stepper increase in proportion to the number of layers, and therefore, the cost is high when there are a large number of layers.

Furthermore, irrespectively of whether the memory cell array has a two-dimensional structure or a three-dimensional structure, a decoder for writing in and reading out information in memory cells with certain addresses in the memory cell array is required. In the case where conventional cross point type memory cell arrays are provided in multiple layers, as shown in FIGS. 5 to 7 in Japanese Unexamined Patent Publication 2009-4725, for example, a circuit for two-dimensionally decoding at least the word lines or the bit lines becomes necessary, and the circuit structure of the decoder becomes complex and occupies a large area, and thus the cost of the chip increases, because each of the word lines and the bit lines is aligned two-dimensionally, as well as in the direction of the layer, in the three-dimensional structure, though each of the word lines and bit lines is aligned one-dimensionally; that is, in one direction, in the two-dimensional structure.

Accordingly, a new memory cell array structure and a simple decoder circuit structure where 1D1R type memory cells can be used and it is not necessary to increase the number of masking steps together with the number of layers are required in order to implement an inexpensive RRAM having a large capacity.

SUMMARY OF THE INVENTION

The present invention is provided in order to solve the problems with three-dimensional memory cell arrays where conventional cross point type memory cell arrays are layered, and an object thereof is to provide a nonvolatile semiconductor memory device having a three-dimensional memory cell array having a large capacity that can be fabricated at low cost.

In order to achieve the above described object, the present invention provides a nonvolatile semiconductor memory device having a three-dimensional memory cell array where memory cells with two terminals are aligned in a three-dimensional matrix where the first direction, the second direction and the third direction are perpendicular to each other, the memory cells each having a nonvolatile variable resistive element of which the resistive properties change when a voltage is applied, characterized in that two or more plate electrodes are layered in the third direction with interlayer insulating films in between, the plate electrodes being formed of conductors or semiconductors in plate form that expand planewise in the first and second directions, a number of through holes are created in each of the plate electrodes, the through holes penetrating through the two or more layered plate electrodes and the interlayer insulating films between the plate electrodes in the third direction, columnar electrodes formed of conductors in columnar form extend in the third direction and penetrate through the through holes without making contact with the plate electrodes, each annular portion sandwiched between one of the plate electrodes and one of the columnar electrodes corresponds to one of the memory cells, a variable resistive material that becomes the variable resistive element is formed in annular form in the annular portion so that the outer peripheral surface of the variable resistive material in annular form is electrically connected to each of the plate electrodes and the inner peripheral surface is electrically connected to each of the columnar electrodes, and thus the variable resistive element is formed for each of the memory cells, the memory cells aligned at the same point in the third direction are connected to each other via one of the plate electrodes, the memory cells aligned at the same point in the first and second directions are connected to each other via one of the columnar electrodes, and an interface with a Schottky junction is formed on either the outer peripheral surface or the inner peripheral surface of the variable resistive material in the annular portion, and at least part of the variable resistive material on the Schottky junction side is formed so as to be separate in the third direction. Here, it is preferable for the through holes to be aligned in a two-dimensional matrix in the first and second directions. In addition, it is preferable for at least part of the variable resistive material on the Schottky junction side to be separate in the third direction with a non-active region formed of the same material as the variable resistive material or an interlayer insulating film in between.

In the above characterized nonvolatile semiconductor memory device, in the case where two-dimensional memory cell arrays having a number of memory cells aligned in the first and second directions in a two-dimensional matrix are layered in the third direction so that a three-dimensional memory cell array is formed, only plate electrodes are connected to the memory cells in each two-dimensional memory cell array in a plane parallel to the two-dimensional memory cell array, each plate electrode is connected to all of the memory cells in each two-dimensional memory cell array, and the other wire connected to each memory cell is a columnar electrode that is perpendicular to a plane parallel to the two-dimensional memory cell array, and therefore, it is not necessary to form the plate electrodes with minimal dimensions for processing when the two-dimensional memory cell arrays are formed, and thus, it is not necessary to use photolithographic steps for forming each layer in a three-dimensional memory cell array using an expensive state of the art stepper, and the cost of manufacture can be prevented from increasing.

Furthermore, memory cells are separated in the third direction by means of interlayer insulating films, and therefore, the distance between memory cells in the third direction is determined by the film thickness of the interlayer insulating films. Accordingly, variable resistive elements, in the case of 1R type memory cells, or variable resistive elements and current controlling elements (diodes or the like), in the case of 1D1R type memory cells, are formed in annular form along the outer peripheral surface of the columnar electrodes, so that the width of the elements is determined by the film thickness of the plate electrodes, while the length of the elements is determined by the thickness of the films formed along the outer peripheral surface of the columnar electrodes, and therefore, memory cells can be formed three-dimensionally, and the precision of the etching process poses no limitations, unlike in the prior art.

Incidentally, plate electrodes may be made of a metal or a semiconductor in which an impurity is diffused so as to lower the resistance, and a metal may be used in the case of 1R type memory cells, and a conductive material may be used in accordance with the formed current controlling elements in the case of 1D1R type memory cells. When the third selection lines are formed in plate form, which is different from linear selection lines in conventional cross point type memory cell arrays, it is possible to provide wires with low resistance, even when the third selection lines are formed of polycrystal silicon in which an impurity is diffused, and thus, the electrical properties of memory cells can be improved for better write-in and readout performance for data.

Furthermore, in the above characterized nonvolatile semiconductor memory device, it is preferable for each of the memory cells to be formed such that the variable resistive element and a current controlling element with two terminals are connected in series, and for the current controlling element to be formed in annular form around the outer periphery of the variable resistive material in annular form as a diode with a PN junction of polycrystal silicon, a Schottky junction between polycrystal silicon and a metal or a metal silicide, or a Schottky junction between a metal oxide semiconductor and a metal.

Concretely, it is preferable that a PN junction is formed in annular form in the interface between the end portion in annular form of each of the plate electrodes which makes contact with the variable resistive material in annular form and the main body portion excluding the end portion, and one of the end portion and the main body portion is polycrystal silicon in which a p type impurity is diffused, and the other thereof is polycrystal silicon in which an n type impurity is diffused. Alternatively, it is preferable that the main body portion of each of the plate electrodes excluding the end portion in annular form which makes contact with the variable resistive material in annular form is formed of polycrystal silicon in which a p type or n type impurity is diffused, a metal or a metal silicide is formed in the end portion in annular form, and a Schottky junction is formed in the interface between the polycrystal silicon and the metal or the metal silicide.

The three-dimensional memory cell array according to the present invention is a three-dimensional cross point type memory cell array between middle selection lines and third selection lines. When so-called 1R type memory cells are employed, a problem with a parasitic current arises, as in conventional two-dimensional cross point type memory cell arrays, and therefore, it is necessary to devise a circuit for securing an operation margin at the time of readout, for example. In the present invention, the problem with a parasitic current can be solved by providing so-called 1D1R type memory cells where a variable resistive element and a current controlling element are connected in series. Here, when the current controlling elements are formed of diodes having a PN junction of polycrystal silicon, a Schottky junction between polycrystal silicon and a metal or a metal silicide, or a Schottky junction between a metal oxide semiconductor and a metal, 1R type memory cells can be converted to 1D1R by adding a simple manufacturing step, which is more preferable.

Furthermore, in the above characterized nonvolatile semiconductor memory device, it is preferable for the variable resistive material in annular form to be a metal oxide, and for the metal oxide to have a distribution of oxygen deficiency in the direction of the diameter of the ring so that the oxygen deficiency on the outer peripheral side is lower than that on the inner peripheral side. Metal oxides having little oxygen deficiency exhibit properties similar to those of insulators, while metal oxides having high oxygen deficiency exhibit properties similar to those of semiconductors and conductors, and therefore, a metal oxide having high oxygen deficiency and the electrode material on its inner peripheral side make ohmic contact, while a metal oxide having little oxygen deficiency and the electrode material on its outer peripheral side make non-ohmic contact. When a voltage is applied across the electrodes on the inner and outer peripheral sides, the properties in the interface with non-ohmic contact change, so that the resistance properties between the two electrodes also change. Here, it becomes impossible or difficult to control the element in the case where the resistance changes when a voltage is applied in the two interfaces between a metal oxide and the electrode material on its inner peripheral side, as well as between a metal oxide and the electrode material on its outer peripheral side, and therefore, it is preferable for one interface to be ohmic. As a result, the metal oxides have a distribution of oxygen deficiency in the direction of the diameter, and thus, excellent resistance changing properties can be gained.

Furthermore, it is also preferable for a tunnel insulating film to be inserted in annular form in a border portion between the outer peripheral surface of the variable resistive material in annular form having oxygen deficiency and each of the plate electrodes, so that the current controlling element has such a structure that the tunnel insulating film is sandwiched between the variable resistive material and each of the plate electrodes. As a result, a bidirectional current controlling element having such a structure that a tunnel insulating film is sandwiched between the variable resistive material and the plate electrode is formed, and thus, a 1D1R type memory cell through which a write-in current can pass in two directions can be formed. As a result, a bipolar operation in which voltages applied across the two ends have opposite polarities between when the resistance of the variable resistive element is lowered and when the resistance is raised becomes possible during the operation for writing in data.

Furthermore, in the above characterized nonvolatile semiconductor memory device, it is preferable for the plate electrodes to be formed of metal conductors, for the variable resistive material in annular form to be a metal oxide, and for the metal oxide to be an oxide of a conductive material that forms the plate electrodes. In this case, the end portions in annular form that face the through holes in the plate electrodes are oxidized and become variable resistive elements, and therefore, the variable resistive elements can also be separated in the third direction by interlayer insulating films, just as the plate electrodes.

Furthermore, it is preferable for a tunnel insulating film to be inserted in annular form in a border portion between the inner peripheral surface of the variable resistive material in annular form, which is an oxide of the conductive material that forms the plate electrodes, and each of the columnar electrodes, so that the current controlling element has a structure where the tunnel insulating film is sandwiched between the variable resistive material and each of the columnar electrodes. As a result, bidirectional current controlling elements having a structure where a tunnel insulating film is sandwiched between the variable resistive material and the columnar electrode is formed, so that 1D1R type memory cells through which a write-in current can pass in two directions can be formed. As a result, bipolar operation where the voltages applied across the two ends have opposite polarities between when the resistance of the variable resistive element lowers and when the resistance increases becomes possible during the operation for writing in data.

Furthermore, in the above characterized nonvolatile semiconductor memory device, it is preferable for the variable resistive material in annular form to be a metal oxide, and for the metal oxide to be made of an oxide of one element selected from among Ni, Co, Ti, Ta, Hf, Cu, Zr, Al and Nb.

This nonvolatile semiconductor memory device can provide an RRAM with a large capacity where high-speed rewriting is possible at low cost. In particular, when a simple binary transition metal oxide is used as the material for the variable resistive elements, fabrication of the variable resistive elements is simpler, and it is possible to further reduce the cost of manufacture.

Furthermore, in order to achieve the above described object, the present invention provides a manufacturing method for manufacturing a nonvolatile semiconductor memory device having a three-dimensional memory cell array where memory cells with two terminals are aligned in a three-dimensional matrix where the first direction, the second direction and the third direction are perpendicular to each other, the memory cells each having a nonvolatile variable resistive element of which the resistance properties change when a voltage is applied. Concretely, a manufacturing method for a nonvolatile semiconductor memory device is characterized in that the process for forming the three-dimensional memory cell array includes the steps of: forming a multilayer film structure on a predetermined substrate by depositing interlayer insulating films and plate electrodes made of a conductor or a semiconductor alternately in the third direction perpendicular to the surface of the substrate; creating through holes aligned in a two-dimensional matrix in the first and second directions, the through holes penetrating through the multilayer film structure in the third direction; forming a variable resistive material in annular form that becomes the variable resistive element on each of the side walls of the through holes; and forming columnar electrodes extending in the third direction by filling the through holes with a conductor, wherein each of the memory cells is formed in an annular portion sandwiched between one of the plate electrodes and one of the columnar electrodes. Here, the variable resistive material forming step and the columnar electrode forming step include forming an interface with a Schottky junction on either the outer peripheral surface or the inner peripheral surface of the variable resistive material in the annular portion. Furthermore, it is preferable to provide the step of initializing the resistance properties in a high resistance state so that a switching operation is possible on the variable resistive material in the annular portion, in order to separate at least part of the variable resistive material on the Schottky junction side in the third direction.

In the case where conventional cross point type memory cell arrays are layered on top of each other so as to form a three-dimensional memory cell array, it is necessary to form variable resistive elements and current controlling elements in the memory cells in the two-dimensional memory cell array layer by layer, and therefore, it is necessary to repeat the manufacturing process for memory, cells as many times as there are layers. In accordance with the manufacturing method according to the present invention, memory cells in a number of layers can be formed at the same time, and thus, the manufacturing process can be simplified, and the cost of manufacture can be reduced.

Furthermore, in the above characterized manufacturing method for a nonvolatile semiconductor memory device, it is preferable that the multilayer film structure forming step includes depositing polycrystal silicon layers in which p type or n type impurities are diffused, and which become the plate electrodes, and interlayer insulating films alternately, the through holes creating step is followed by forming a diode having a PN junction or a Schottky junction in annular form in each of annular end portions of the polycrystal silicon layers that are exposed from the side walls of the through holes, the variable resistive material forming step includes forming the variable resistive material in annular film form on the side walls of the through holes after the formation of the diode so that the outer side surface of the variable resistive material makes contact with the inner side surface of the diode, and the columnar electrodes are formed after the variable resistive material deposited at the bottoms of the through holes is removed. Furthermore, it is preferable that the diode forming step includes forming a diode having a PN junction in annular form by diffusing an impurity of the opposite conductivity type to the impurity diffused in the polycrystal silicon layers in advance from the annular end surfaces of the polycrystal silicon layers exposed from the side walls of the through holes. In addition, it is preferable that the diode forming step includes forming a silicide in a self-aligning manner on each of the annular end surfaces of the polycrystal silicon layers exposed from the side walls of the through holes, so that a diode having a Schottky junction is formed in annular form in each interface between the polycrystal silicon layers and the silicide. This manufacturing method makes it possible to form 1D1R type memory cells where a variable resistive element and a current controlling element are connected in series by adding a simple manufacturing step, and therefore, the problem with a parasitic current can be solved at low cost.

It is preferable that the variable resistive material forming step includes: forming annular films of the variable resistive material made of a metal oxide that makes contact with an inner side surface of the side walls of the through holes; and forming a metal that is easier to oxidize than the metal oxide so that the metal makes contact with the inner side walls of the annular films of the variable resistive material, and the surface of the metal oxide on the inner periphery side is reduced through a solid phase reaction so that the oxygen deficiency in the metal oxide is higher on the inner peripheral side than on the outer peripheral side. As a result of this manufacturing method, the metal oxide having little oxygen deficiency exhibits properties similar to that of an insulator, while the metal oxide having high oxygen deficiency exhibits properties similar to those of semiconductors or conductors, the metal oxide having high oxygen deficiency and the electrode material on its inner peripheral side make ohmic contact, while the metal oxide having low oxygen deficiency and the electrode material on its outer peripheral side make non-ohmic contact. When a voltage is applied across the electrode on the inner peripheral side and the electrode on the outer peripheral side, the properties in the interface with non-ohmic contact change, and the resistance properties between the two electrodes also change. Here, it is difficult, or impossible, to control the element in the case where the resistance changes due to voltage application in the interfaces between the metal oxide and the electrode material on its inner peripheral side, as well as between the metal oxide and the electrode material on its outer peripheral side, and therefore, it is preferable for one interface to be ohmic. As a result, the metal oxide has a distribution of oxygen deficiency in the direction of the diameter, and thus, excellent resistance changing properties can be gained.

Furthermore, in the above characterized manufacturing method for a nonvolatile semiconductor memory device, it is preferable that the multilayer film structure forming step includes depositing a predetermined metal material as the plate electrodes, and the variable resistive material forming step includes forming the variable resistive material of a metal oxide on the outer peripheral side of the side walls of the through holes by oxidizing the metal material of the plate electrodes exposed from the side walls of the through holes from the through hole side. As a result of this manufacturing method, the end portions in annular form facing the through holes in the plate electrodes are oxidized and converted to variable resistive elements, and therefore, the variable resistive elements can be separated in the third direction by interlayer insulating films, as with the plate electrodes.

The present invention can provide a nonvolatile semiconductor memory device with a three-dimensional memory cell array with a large capacity that can be fabricated at low cost. In particular, it becomes possible for RRAMs using 1R type or 1D1R type memory cells to have a multilayer structure, and the a memory cell array can be manufactured without increasing the number of masking steps due to increase in the number of layers. Part of conventional decoders is formed as a two-dimensional array of selection transistors, and most of the peripheral circuits overlap with the memory cell array, so that the area occupied by the peripheral circuit is minimized and an RRAM with a large capacity can be implemented at low cost.

BRIEF DESCRIPTION OF THE DRAWINGS

FIG. 13 is a schematic cross sectional diagram showing the structure of the three-dimensional memory cell array and the two-dimensional array of selection transistors according to the first embodiment in a YZ plane;

FIG. 15 is a cross sectional diagram showing the steps in a connection method for signal wires that are connected to the common plates and the Z decoders in the layers of the three-dimensional memory cell array 1 according to the first embodiment;

FIG. 17 is a table showing a list of examples of the conditions for the voltage applied to a selected bit line, non-selected word lines, a selected word line, non-selected word lines, a selected common plate and non-selected common plates during the operation for initializing memory cells, the operation for writing in data (set operation and reset operation) and the operation for reading out data;

FIG. 18 is a schematic cross sectional diagram showing the structure of the main portion of the three-dimensional memory cell array and the two-dimensional array of selection transistors according to the second embodiment in a YZ plane that passes through the middle selection lines;

FIG. 20 is a schematic cross sectional diagram showing the structure of the three-dimensional memory cell array and the two-dimensional array of selection transistors according to the second embodiment in a YZ plane;

FIG. 21 is a schematic cross sectional diagram showing the structure of the three-dimensional memory cell array and the two-dimensional array of selection transistors according to the second embodiment in an XZ plane;

FIG. 36 is a table showing a list of examples of the conditions for the voltage applied to a selected bit line, non-selected word lines, a selected word line, non-selected word lines, a selected common plate and non-selected common plates during the operation for initializing memory cells, and the operation for writing in data (set operation and reset operation);

FIG. 37 is a schematic cross sectional diagram showing the structure of the main portion of the three-dimensional memory cell array according to the fifth embodiment in a YZ plane.

DETAILED DESCRIPTION OF THE INVENTION

The embodiments of the nonvolatile semiconductor memory device according to the present invention (hereinafter referred to as device of the present invention) are described below in reference to the drawings. Here, important portions are highlighted whenever necessary in the cross sectional diagrams, plan diagrams and bird's eye views showing the structure of the device of the present invention, and therefore, the dimensions in the figures do not necessarily match the dimensions of the real product.

First Embodiment

Figure 1:
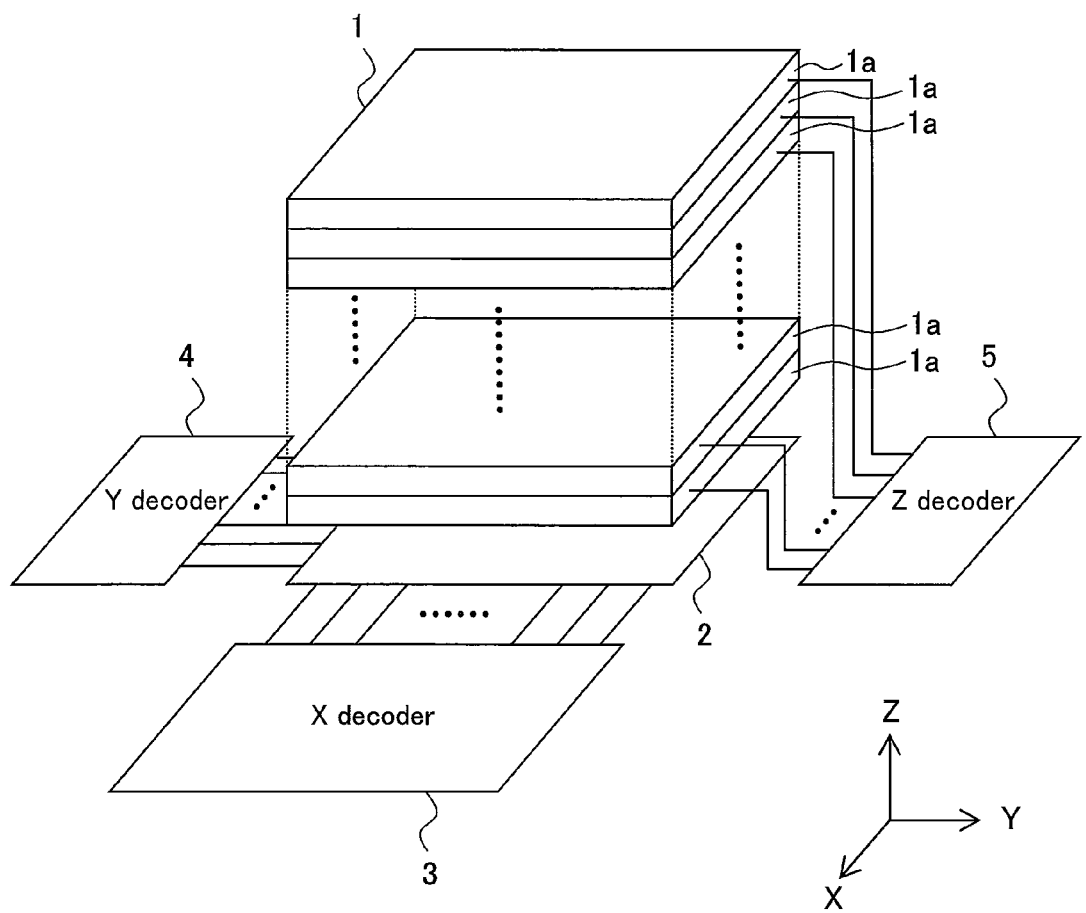
FIG. 1 is a schematic block diagram showing the configuration the nonvolatile semiconductor memory device according to the present invention.

As schematically shown in FIG. 1, the device of the present invention is formed of a three-dimensional memory cell array 1, a two-dimensional array 2 of selection transistors, an X decoder 3, a Y decoder 4 and a Z decoder 5. The two-dimensional array 2, the X decoder 3 (corresponding to the first decoder), the Y decoder 4 (corresponding to the second decoder) and the Z decoder 5 (corresponding to the third decoder) are formed on the same substrate 6, and the three-dimensional memory cell array 1 is located above the two-dimensional array 2. Here, in the following description, the first direction and the second direction, which are parallel to the surface of the substrate 6 and perpendicular to each other, are the X direction and the Y direction, respectively, while the third direction, which is perpendicular to the surface of the substrate 6, is the Z direction.

In the present embodiment, the three-dimensional memory cell array 1 is formed of a number of memory cells 9 with two terminals where a variable resistive element 7 and a diode 8, which is a current controlling element with two terminals, are connected in series are aligned in the X direction, the Y direction and the Z direction. FIG. 2 is an equivalent circuit diagram showing the three-dimensional memory cell array 1 as viewed in the X direction, the Y direction and the Z direction. Here, the polarities of the diodes 8 may be reversed.

Figure 2A:
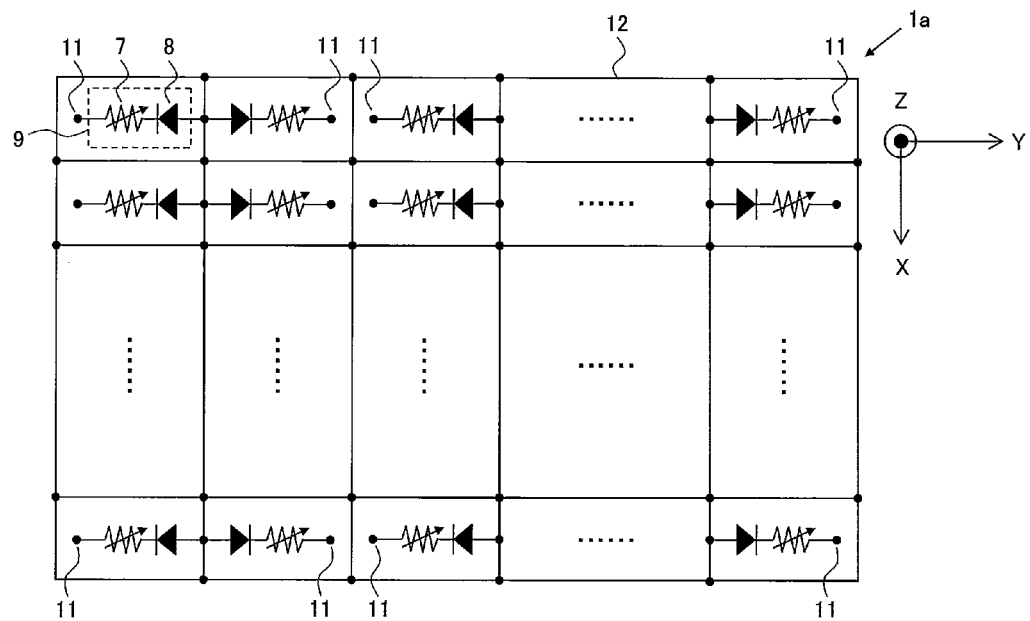
FIG. 2 is an equivalent circuit diagram showing the three-dimensional circuit structure of a three-dimensional memory cell array formed of 1D1R type memory cells.
Figure 2B:
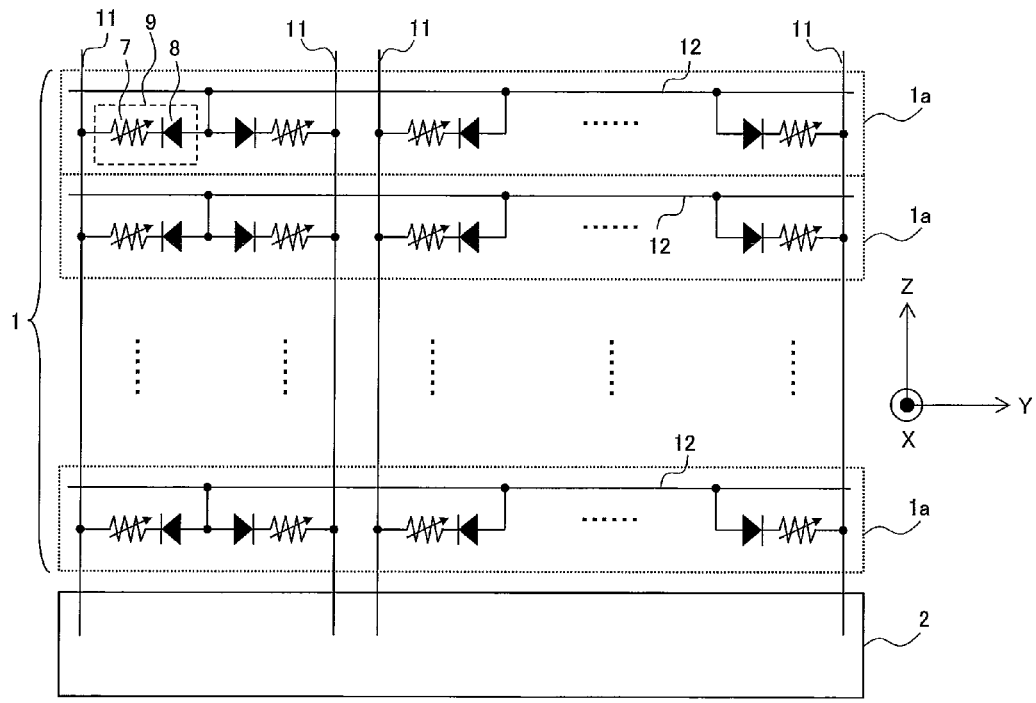

The three-dimensional memory cell array 1 has a structure where a number of two-dimensional memory cell arrays 1a which are the same as that in the XY plane in FIG. 2A are layered in the Z direction, as shown in FIG. 2B. As shown in FIG. 2A, the two-dimensional memory cell array 1a in each layer is formed of a number of memory cells 9 with two terminals that are aligned in the X direction and the Y direction, where one end of each memory cell 9 is connected to one of the middle selection lines 11 (corresponding to the columnar electrodes), of which there are the same number as memory cells 9 in the XY plane, and which correspond to the respective memory cells 9 and extend in the Z direction, while the other end of each memory cell 9 is connected to a common plate 12 (corresponding to third selection lines or plate electrodes), and one common plate 12 is provided in each layer. The first terminals of the memory cells 9 provided at the same point in the two-dimensional memory cell arrays 1a in different layers are connected to the same middle selection line 11.

Though FIG. 2A shows the common plate 12 as a group of lines in grid form that extend in the X direction and Y direction for the sake of convenience, it does not show the shape of the actual common plate 12, and the common plate 12 can be formed as a plane, a mesh or stripes, and is not limited to any specific shape, as long as the second terminals of the memory cells 9 are electrically connected to each other and lead out so as to be connected to the Z decoder 5 for each layer in the configuration.

Figure 3:
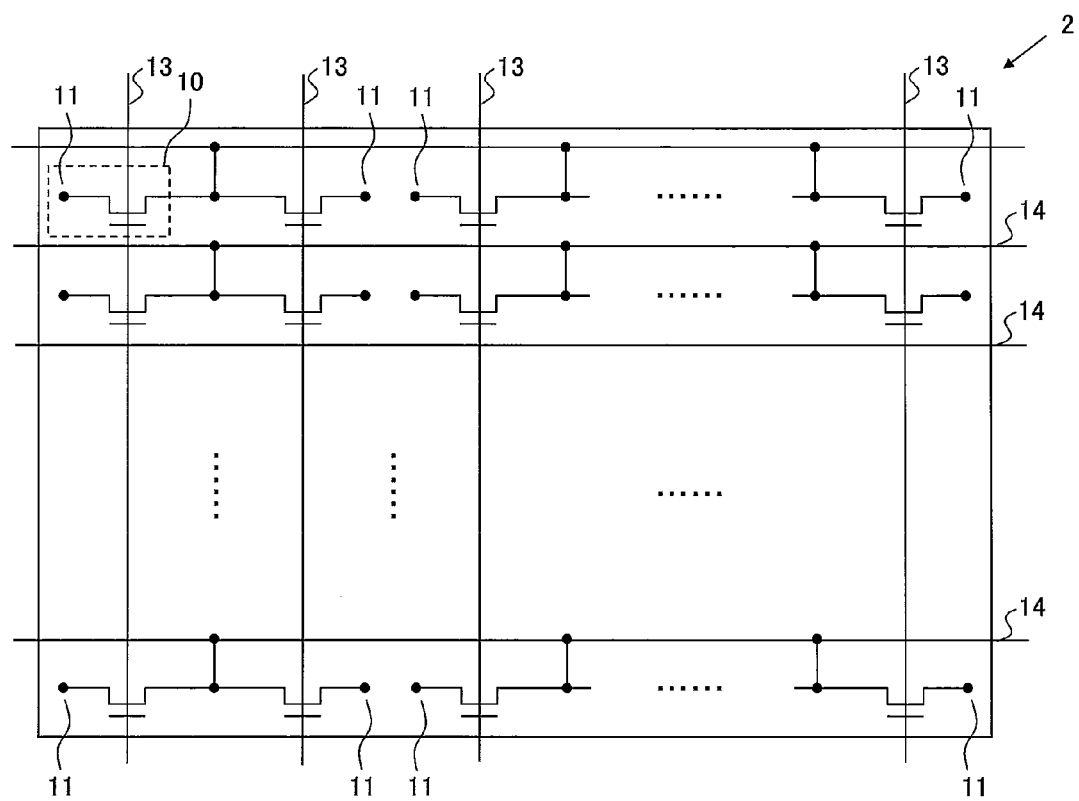
FIG. 3 is an equivalent circuit diagram showing the circuit structure of a two-dimensional array of selection transistors.

As shown in FIG. 3, the two-dimensional array 2 is formed of a number of selection transistors 10 made of MOS transistors that are aligned in the X direction and the Y direction in an XY plane. Here, the number of selection transistors 10 aligned in the X direction and the Y direction is the same as the number of two-dimensional memory cell arrays 1a aligned in the X direction and the Y direction, respectively. The gates of the series of selection transistors 10 that are adjacent in the X direction are connected to the same word line 13 (corresponding to the first selection line). In addition, the drains (or sources) of the series of selection transistors 10 that are adjacent in the Y direction are connected to the same bit line 14 (corresponding to the second selection line). The sources (or drains) of the selection transistors 10 are connected to the middle selection line 11 that is connected to the first end of memory cells 9 that are located at the same point in the XY plane.

The X decoder 3 is connected to a number of word lines 13 and applies a selected word line voltage VWL1 and a non-selected word line voltage VWL0 separately to the selected word line and the non-selected word lines for each of the below described operations for initializing the memory cells, writing in data in the memory cells and reading out data from the memory cells. The word line to which the selected word line voltage VWL1 is applied is selected, and the word lines to which the non-selected word line voltage VWL0 is applied are not selected. The Y decoder 4 is connected to a number of bit lines 14 and applies a selected bit line voltage VBL1 and a non-selected bit line voltage VBL0 separately to the selected bit line and the non-selected bit lines for each of the above described operations. The bit line to which a selected bit line voltage VBL1 is applied is selected, and the bit lines to which the non-selected bit line voltage VBL0 is applied are not selected. The Z decoder 5 is connected to a number of common plates 12 and applies a selected common plate voltage VCP1 and a non-selected common plate voltage VCP0 separately to the selected common plate and the non-selected common plates for each of the above described operations. The common plate to which the selected common plate voltage VCP1 is applied is selected, and the common plates to which the non-selected common plate voltage VCP0 is applied are not selected.

Incidentally, in the case where the data that is written into the memory cells has two values, there are two types of operations for write-in: a set operation for converting the resistive state of the variable resistive element from a high resistance state to a low resistance state, and a reset operation for converting the resistive state of the variable resistive element from a low resistance state to a high resistance state. In the following, the set operation and the reset operation are collectively referred to as write-in operation.

The three-dimensional memory cell array 1 shown in FIG. 2 has a such a configuration that one of the middle selection lines 11 aligned in a two-dimensional matrix in an XY plane is selected by the X decoder 3 and the Y decoder 4 via the two-dimensional array 2 of the selection transistors 10, and a common plate 12 is selected by the Z decoder 5. This configuration makes it possible for any memory cell 9 aligned in the three-dimensional matrix in the three-dimensional memory cell array 1 to be selected.

Figure 4:
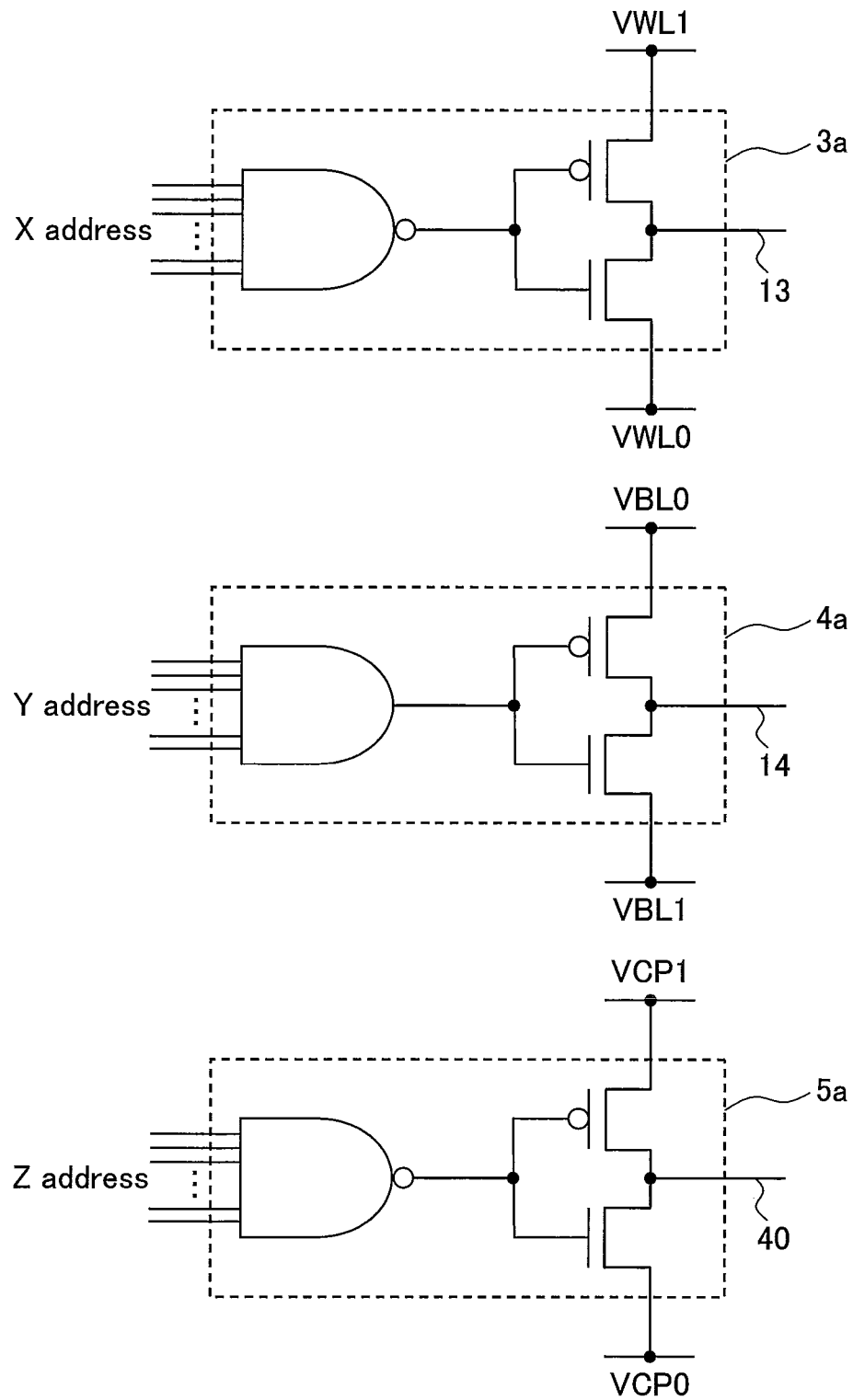
FIG. 4 is a circuit diagram showing an example of a logic circuit structure with an X decoder, a Y decoder and a Z decoder.

FIG. 4 shows an example of a logic circuit structure of an X decoder unit 3a in an X decoder 3, a Y decoder unit 4a in a Y decoder 4 and a Z decoder unit 5a in a Z decoder 5, each connected to a word line 13, a bit line 14 and a common plate 12. Here, the example of the circuit structure in FIG. 4 corresponds to the voltages in each operation under the conditions for the voltages shown in FIG. 17 below.

Figure 5:
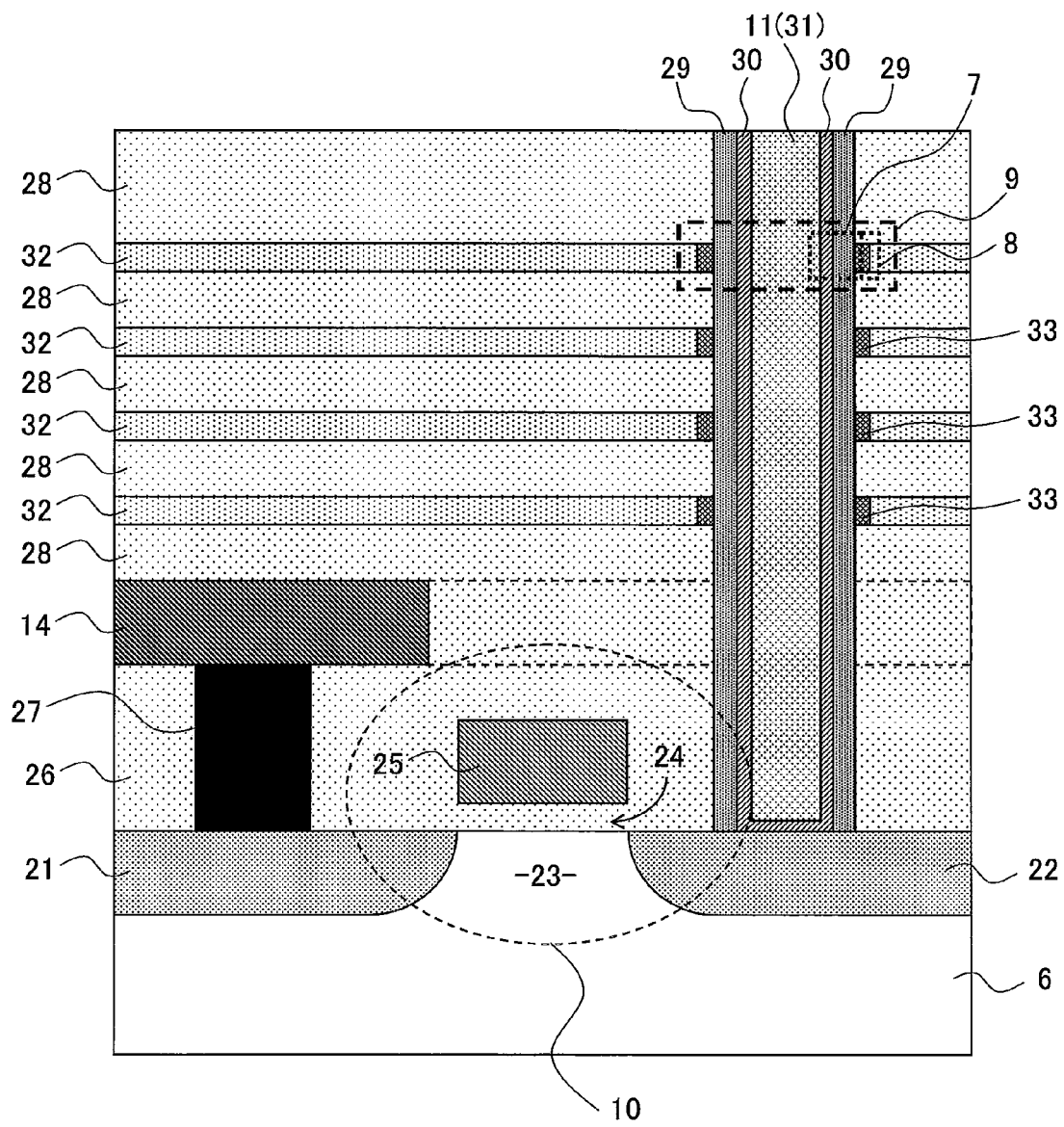
FIG. 5 is a complex schematic cross sectional diagram showing the structure of the main portions of a three-dimensional memory cell array and a two-dimensional array of selection transistors according to the first embodiment in two YZ planes.

FIG. 5 shows an example of the structure of one selection transistor 10, one middle selection line 11 that is connected to the selection transistor 10, and a number of memory cells 9 that are aligned in the Z direction and connected to the middle selection line 11 in a cross section. FIG. 5 is a complex cross sectional diagram where two cross sections along a first YZ plane that passes through the bit line 14 and a second YZ plane that passes through the middle selection line 11 are combined. In addition, FIG. 5 shows an example where the memory cells 9 are layered in four layers in the Z direction.

The selection transistors 10 in the present embodiment are n type MOS transistors having a standard planar structure formed of a drain 21 and a source 22 formed on the surface of a silicon substrate 6 through diffusion of an n type impurity, for example, and a gate 25 formed above the channel region 23 between the drain 21 and the source 22 with a gate oxide film 24 in between. The selection transistors 10 are fabricated through a standard process for forming MOS transistors, which is the same as for the MOS transistors used in the peripheral circuit, including the X decoder 3, and Y decoder 4 and the Z decoder 5. Bit lines 14 that extend in the Y direction are formed on the first interlayer insulating film 26 that covers the selection transistors 10, and are connected to the drains 21 of the selection transistors 10 via contact holes 27 created in the interlayer insulating film 26. Here, bit lines 14 are shown as broken lines in the second YZ plane. In addition, in FIG. 5, the gate 25 extends in the X direction (direction perpendicular to the paper in FIG. 5) and forms a word line 13.

A three-dimensional memory cell array 1 is formed above the bit lines 14 and the interlayer insulating film 26. In the three-dimensional memory cell array 1, variable resistors 29 made of a metal oxide film for forming a variable resistive element 7 and first electrodes 30 made of a metal electrode film are formed in order inside the side walls of the through holes that penetrate through the multilayer structure where the second interlayer insulating films 28 and the common plates 12 are layered alternately and the first interlayer insulating film 26 and extend to the surface of the sources 22 of the selection transistors 10, and the inside of the first electrodes 30 is filled with a metal material 31, such as tungsten, which becomes middle selection lines 11 that are connected to the sources 22 of the selection transistors 10.

The common plates 12 are formed of p type polycrystal silicon films 32 in which a p type impurity is diffused, and the end portions 33 on the variable resistor 29 side are converted to n type through diffusion of an n type impurity from the through hole side. As a result, diodes 8 are formed of a PN junction in the end portion of the common plates 12 on the variable resistor 29 side. Accordingly, the common plates 12 are integrated with the anode electrodes of the diodes 8, and the cathode electrodes of the diodes 8 are integrated with the second electrodes of the variable resistive elements 7. The second electrodes of the resistive elements 7 that forms the memory cells 9 and the diodes 8 are electrically isolated from each other in the Z direction by the second interlayer insulating films 28. Here, the metal oxide films that form the variable resistor 29 are formed so as to be connected in the Z direction, and as described below, the variable resistive elements 7 are in a high resistance state before the initialization process, and the portions that face the second interlayer insulating films 28 are not initialized, and therefore, the variable resistive elements 7 are separated from each other in the Z direction.

In addition, the common plate 12 may be formed of an n type polycrystal silicon film in which an n type impurity is diffused. In this case, the end portions on the variable resistor 29 side are converted to p type through diffusion of a p type impurity from the through hole side. Accordingly, the polarities of the diodes 8 are opposite to those in the equivalent circuit shown in FIG. 2, and the common plate 12 is integrated with the cathode electrodes of the diodes 8 while the anode electrodes of the diodes 8 are integrated with the second electrodes of the variable resistive elements 7.

In the following, the manufacturing process for the three-dimensional memory cell array 1 and the two-dimensional array 2 of selective transistors 10 having the structure shown in FIG. 5 is described in reference to FIGS. 6 to 11. Here, FIGS. 6 to 10 are complex cross sectional diagrams where cross sections along the first YZ plane that passes through the bit lines 14, which are the same as in FIG. 5, and along the second YZ plane that passes through the middle selection lines 11 are combined.

Figure 6:
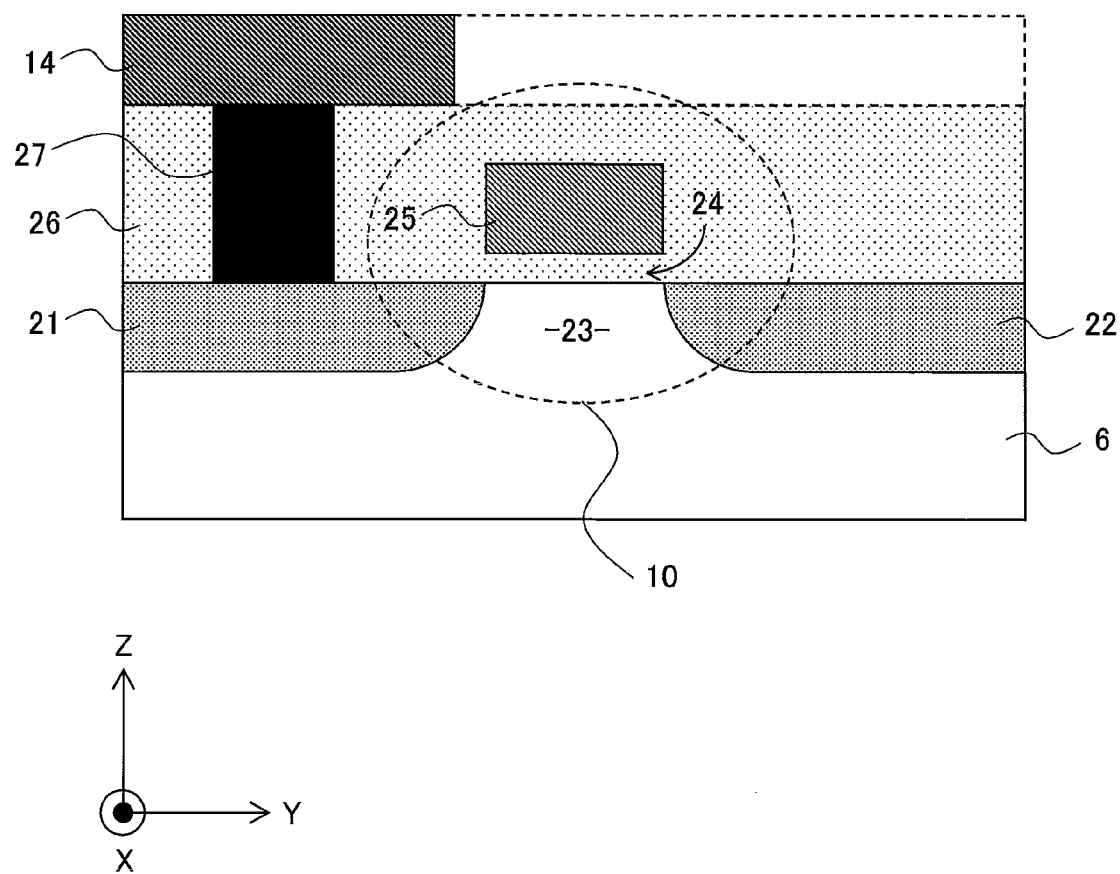
FIG. 6 is a schematic cross sectional diagram showing a step which is part of the manufacturing process for a three-dimensional memory cell array and a two-dimensional array of selection transistors according to the first embodiment.

First, as shown in FIG. 6, selection transistors 10 are fabricated on a silicon substrate 6 in accordance with a process for forming general MOS transistors and a first interlayer insulating film 26 is deposited in accordance with a manufacturing process for a general LSI, and after that, contact holes 27 are created and bit lines 14 are formed. Here, a number of selection transistors 10 are formed in the X direction and Y direction. The gates 25 of the selection transistors 10 which are adjacent in the X direction are connected to each other to form common word lines 13. In addition, the drains 21 of the selection transistors 10 which are adjacent in the Y direction are connected to common bit lines 14.

Here, when the selection transistors 10, the word lines 13, the contact holes 27 and the bit lines 14 are formed, the MOS transistors for forming the X decoder 3, the Y decoder 4 and the Z decoder 5 in the peripheral circuit and the wires connecting these transistors are formed at the same time, and in addition, it is preferable to form the wires connecting the word lines 13 and the bit lines 14 to the X decoder 3 and the Y decoder 4, respectively.

Figure 7:
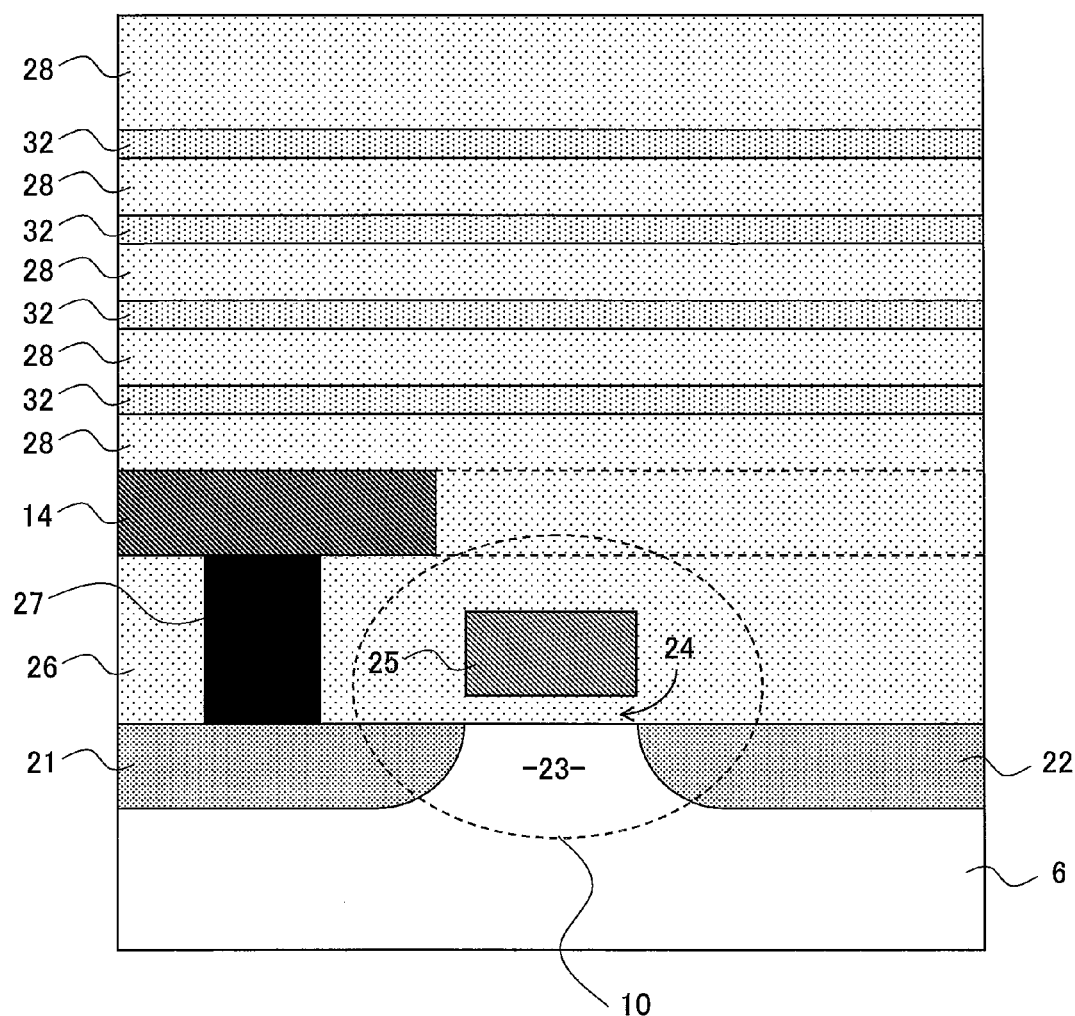
FIG. 7 is a schematic cross sectional diagram showing a step which is part of the manufacturing process for a three-dimensional memory cell array and a two-dimensional array of selection transistors according to the first embodiment.

Next, as shown in FIG. 7, a number of second interlayer insulating films 28 made of $SiO_2$ or the like and a number of p type polycrystal silicon films 32 which become the common plates 12 are deposited alternately on top of the two-dimensional array 2 after the formation of the bit lines 14. The film thickness of the interlayer insulating films 28 is approximately 50 nm to 500 nm and the film thickness of the polycrystal silicon films 32 is also approximately 50 nm to 500 nm. The polycrystal silicon films 32 have a conductance because approximately $10^{18}/cm^3$ to $10^{20}/cm^3$ of a p type impurity is doped. The number of the layered polycrystal silicon films 32 is ultimately the number of layers of the memory cells 9 in the Z direction. FIG. 7 shows an example where four layers of memory cells 9 are layered in the Z direction. In the case where the polarities of the diodes 8 are reversed, n type polycrystal silicon films doped with an n type impurity are deposited at this stage instead of p type polycrystal silicon films.

Figure 8:
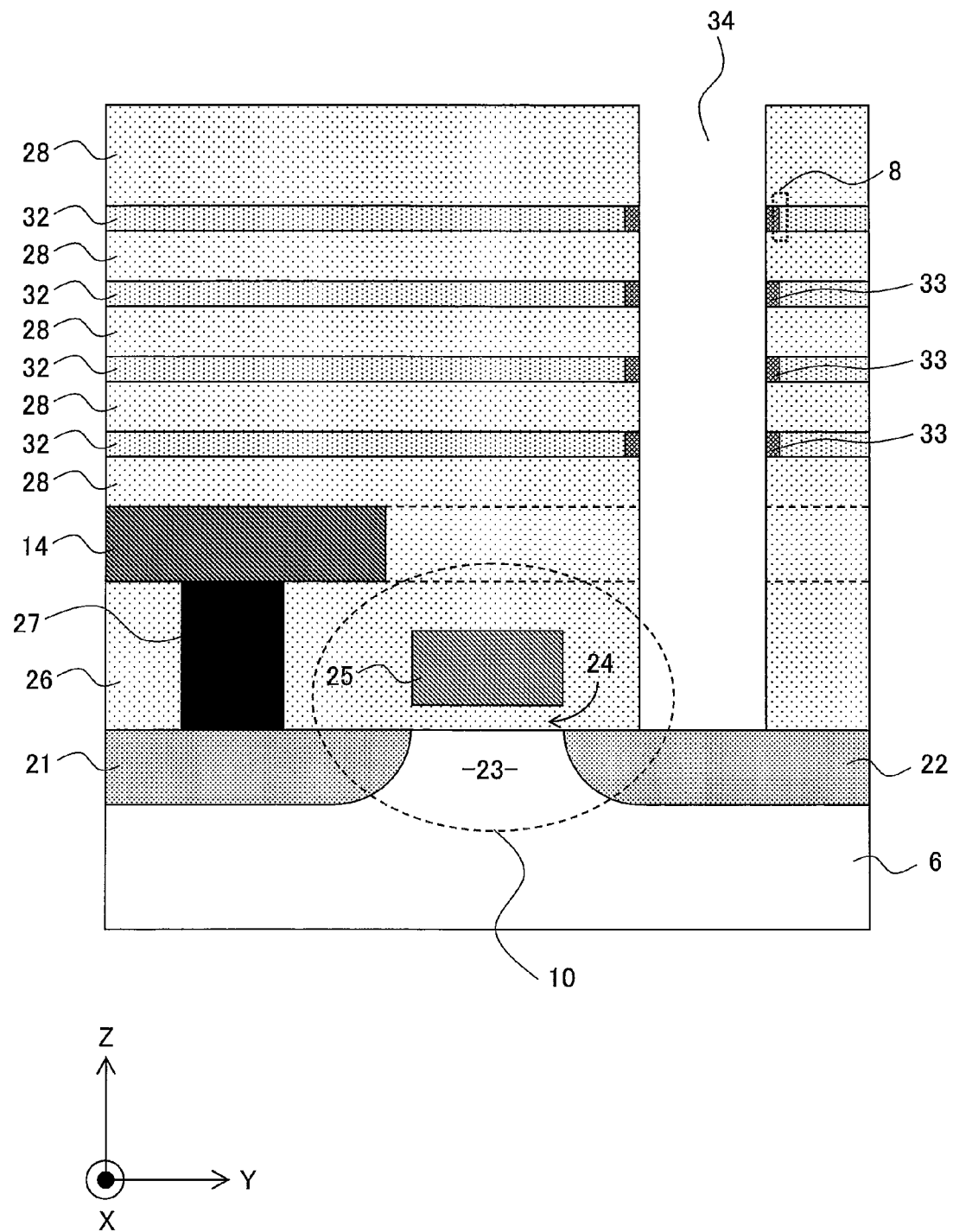
FIG. 8 is a schematic cross sectional diagram showing a step which is part of the manufacturing process for a three-dimensional memory cell array and a two-dimensional array of selection transistors according to the first embodiment.

Next, as shown in FIG. 8, through holes 34 which penetrate through the multilayer structure of the second interlayer insulating films 28 and the polycrystal silicon films 32 and the first interlayer insulating film 26 so as to reach the surface of the sources 22 of the selection transistors 10 are created through publicly known dry etching or the like. Here, the shape of the through holes 34 in a cross section may preferably be circular, but may also be rectangular. In addition, it is preferable for the through holes 34 to be created such that the outer peripheral length in an XY cross section is uniform in the Z direction. After the creation of the through holes 34, approximately $10^{19}/cm^3$ to $10^{20}/cm^3$ of an impurity of the conductivity opposite to that of the impurity introduced into the polycrystal silicon films 32 in advance is introduced through the end surface of the polycrystal silicon films 32 exposed from the side walls of the through holes 34 in accordance with an ion injection or diffusion method so that polycrystal silicon films 33 having an opposite polarity are formed. In the example shown in FIG. 8, n type polycrystal silicon films 33 are formed, and thus, diodes 8 are formed on the two sides of the PN junctions which are formed in annular form in the interface between the n type polycrystal silicon films 33 and the p type polycrystal silicon films 32.

Figure 9:
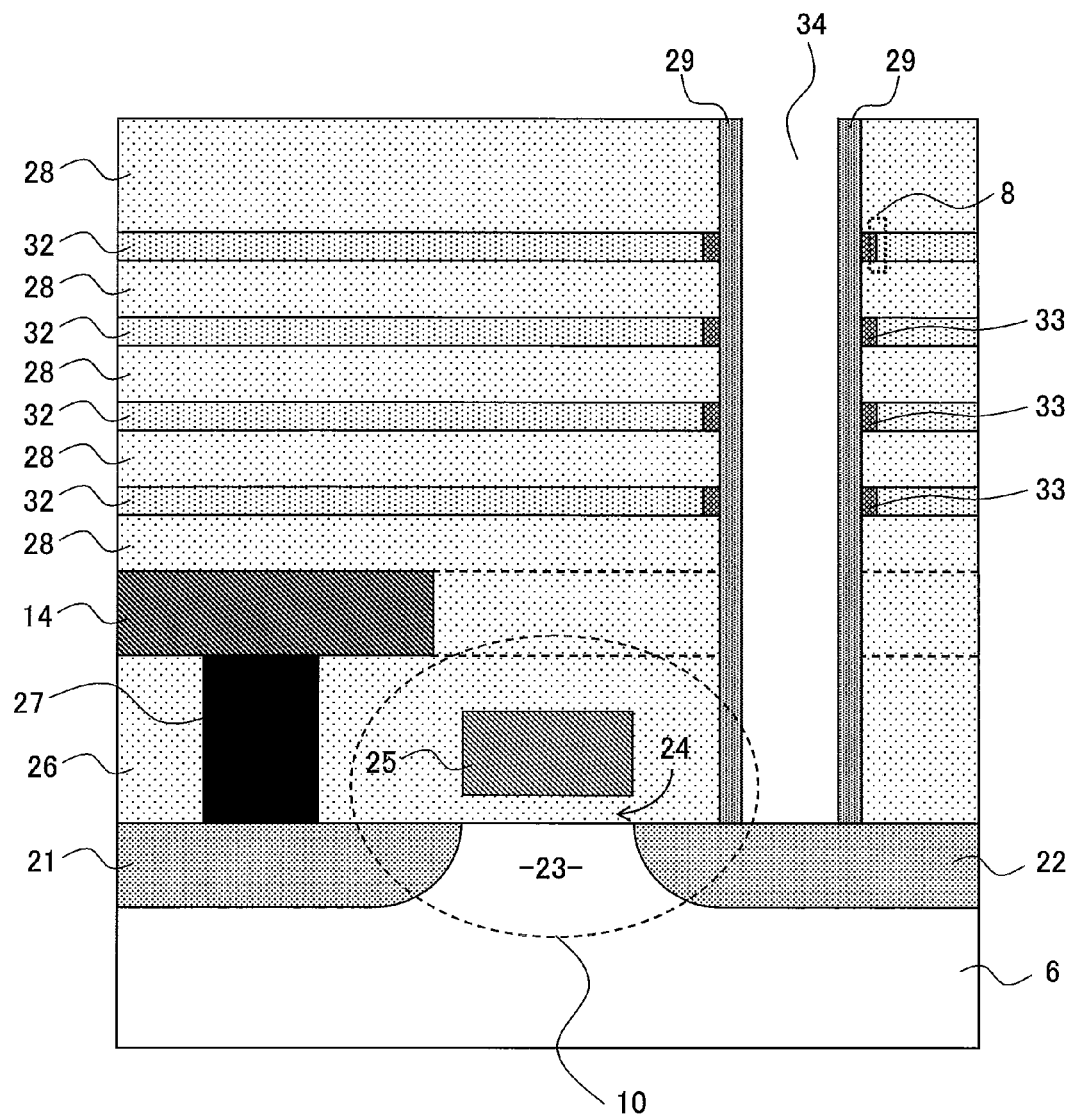
FIG. 9 is a schematic cross sectional diagram showing a step which is part of the manufacturing process for a three-dimensional memory cell array and a two-dimensional array of selection transistors according to the first embodiment.

Next, as shown in FIG. 9, metal oxide films that become the variable resistors 29 are deposited on the side walls of the through holes 34 after the formation of the diodes 8 through CVD (chemical vapor deposition method) or ALD (atomic layer deposition method), and after that, the metal oxide films deposited at the bottom of the through holes 34 are removed through RIE (reactive ion etching) so that the surface of the sources 22 of the selection transistors 10 is exposed.

Publicly known variable resistor materials of which the resistance changes through the application of a voltage, such as CoO, NiO, TaOx, TiOx, HfOx, ZrOx, AlOx, CuOx and NbOx, can be used as the metal oxides that becomes the variable resistors 29. It is desirable for the method for forming a film of a metal oxide to be a chemical film forming method which allows for isotropic film formation on the side walls of the through holes 34, such as CVD or ALD as described above. Here, the optimal structure of the diodes 8, which are current controlling elements used in combination with a polycrystal silicon film, differs between p type metal oxides, such as NiO and CoO, and n type metal oxides, such as TiOx and TaOx. When a p type metal oxide, such as NiO or CoO, is used, it is desirable for the polycrystal silicon films 32 to be p type, the polycrystal silicon films 33 to be n type, and the diodes 8 to be biased in the forward direction when the voltage on the diode 8 side is higher than that on the metal oxide film side in order for the memory cells 9 to operate stably. Conversely, when an n type metal oxide, such as TiOx or TaOx, is used, it is desirable for the polycrystal silicon films 32 to be n type and for the polycrystal silicon films 33 to be p type. The greater the film thickness of the metal oxide is, the higher the voltage value required for the write in operation is, and therefore, it is desirable for the film thickness of the metal oxide to be in a range of approximately 5 nm to 20 nm in order to maintain the voltage at approximately 2 V.

Figure 10:
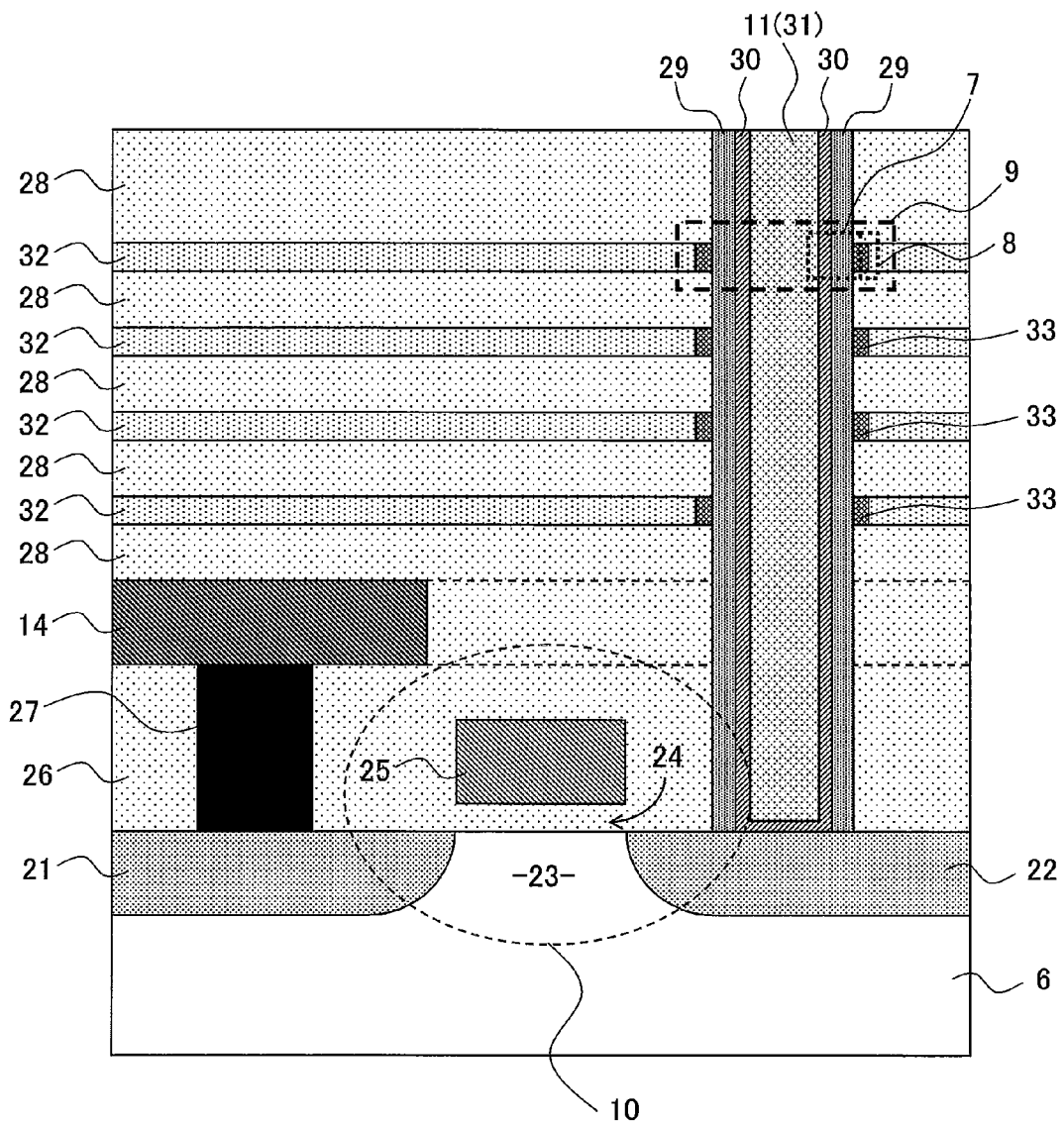
FIG. 10 is a schematic cross sectional diagram showing a step which is part of the manufacturing process for a three-dimensional memory cell array and a two-dimensional array of selection transistors according to the first embodiment.

Next, as shown in FIG. 10, metal electrode films 30, which become the first electrodes of the variable resistive elements 7, are formed on the side walls of the through holes 34 on which the variable resistors 29 are formed. Different materials are used for the metal electrode films 30 depending on whether the metal oxide that forms the variable resistors 29 is an n type semiconductor or a p type semiconductor. In the case where the variable resistors 29 are made of an n type semiconductor, such as TiOx or TaOx, a metal of which the work function is greater than 4.5 eV, such as Pt or TiN, is used as the material for the metal electrode films 30, and in the case where the variable resistors 29 are made of a p type semiconductor, such as CoO or NiO, a metal of which the work function is smaller than 4.5 eV, such as Ti or Ta, is used as the material for the metal electrode films 30. Combinations that allow the metal oxides that form the metal electrode films 30 and the variable resistors 29 to provide a Schottky barrier between the two can provide excellent switching properties for the variable resistive elements 7 (transition properties of the resistance state between high resistive state and low resistive state), which is preferable. When a metal oxide for the variable resistors 29 and metal electrode films 30, which become the first electrodes, are combined as described above, variable resistive elements 7 having a stable switching operation when a voltage is applied can be formed. Next, after the formation of metal electrode films 30, the hollow portions remaining in the through holes 34 are filled in with a metal material 31, such an tungsten, in accordance with a CVD method so that middle selection lines 11 are formed of a metal 31 in columnar form that rises from the sources 22 of the selection transistors 10 in the Z direction.

Figure 11:
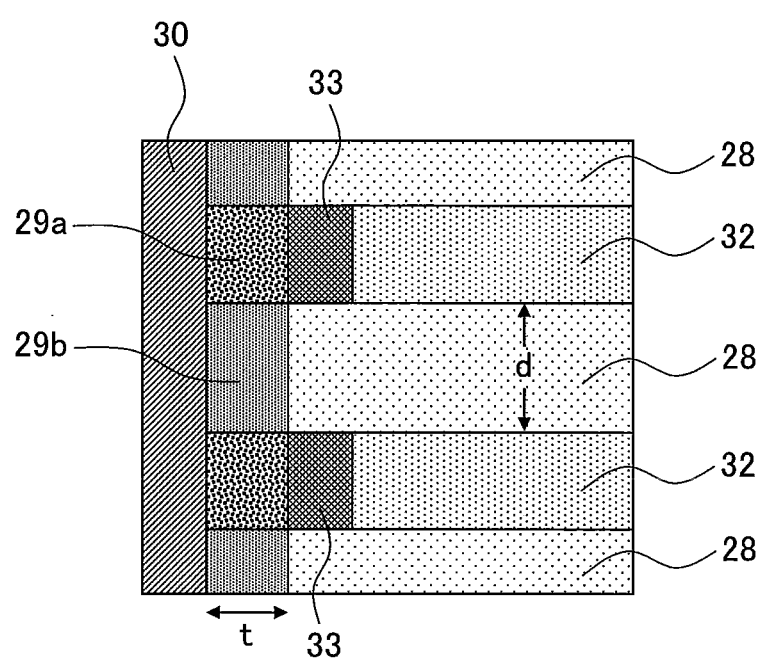
FIG. 11 is a schematic cross sectional diagram showing an enlargement of the main portion, where a memory cell is formed as shown in FIG. 10.

FIG. 11 is a diagram showing an enlargement of the main portion of a variable resistor 29 in the state after the below described initialization in a portion where the memory cell 9 in FIG. 10 is formed. In the structure in the cross section shown in FIG. 11, it is desirable for the relationship between the thickness t of the metal oxide film 29, which is a variable resistor, and the distance d between the layered diodes 8 (that is to say, the film thickness of the second interlayer insulating film 28) to be d>t. Furthermore, it is desirable for the metal oxide film 29 to be in a high resistive state initially after the film is formed and to require the application of a voltage of a certain threshold value or higher in order to convert from the high resistive state to a low resistive state through the application of a voltage. It is possible to design the memory cells when d>t such that no switching operation (transition of resistance state) is carried out on the variable resistive elements in the memory cells which are not selected when a voltage is applied across common plates 12 in layers different from the metal electrode film 30 of the first electrode. As a result, as shown in FIG. 11, the metal oxide films 29 function as variable resistors 29a that can carry out a switching operation in the direction of the radius of the through holes 34 (X direction in FIG. 11) only in portions which make contact with a polycrystal silicon film 33 while exhibiting the properties of an insulator in the Z direction in the portions 29b which do not make contact with a polycrystal silicon film 33, and thus, the layered diodes 8 can be electrically separated from each other.

Figure 12:
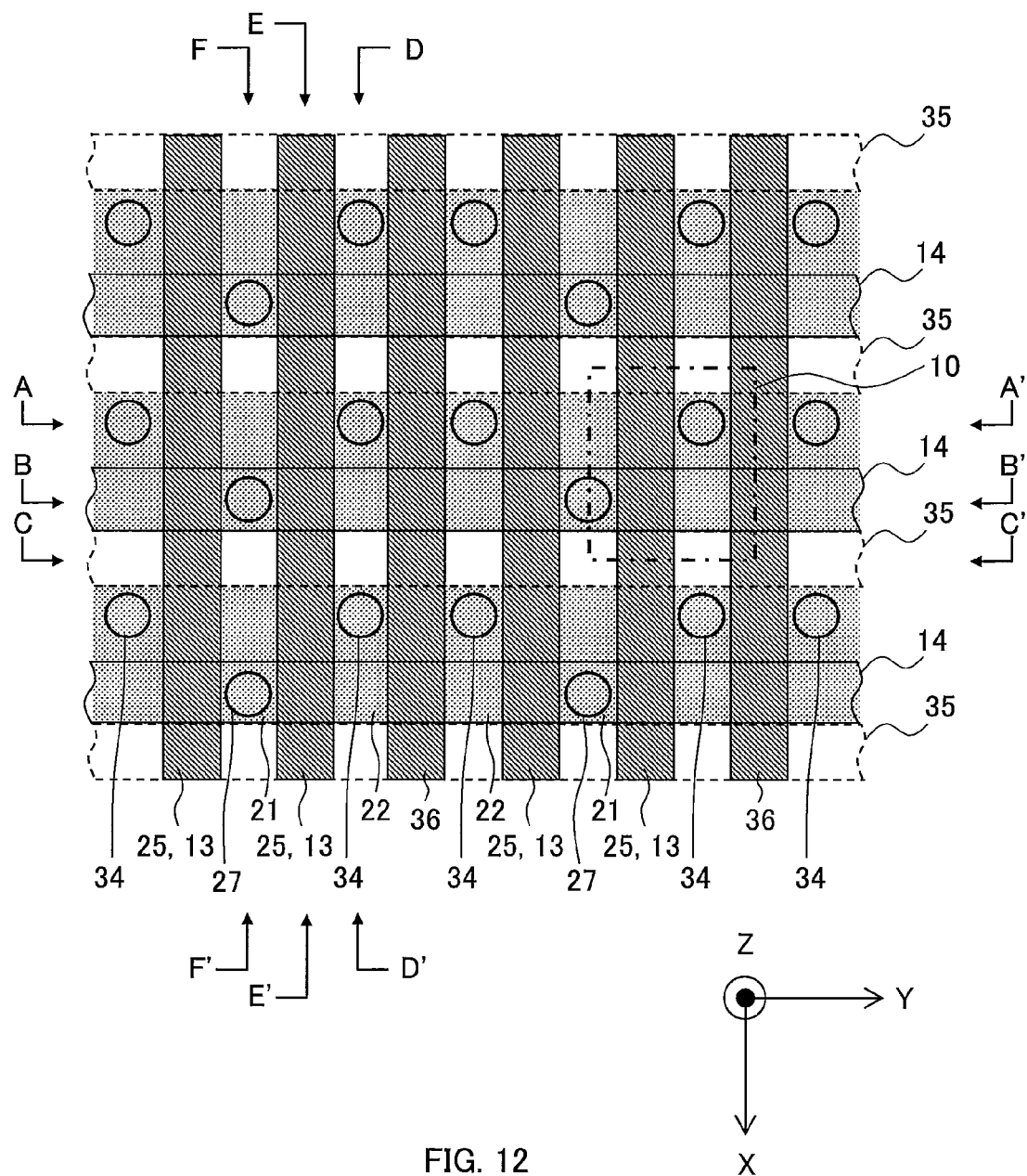
FIG. 12 is a diagram showing the layout of the two-dimensional array of selection transistors according to the first embodiment in an XY plane.

Next, the array structures of the three-dimensional memory cell array 1 and the two-dimensional array 2 of selection transistors 10 fabricated in the above described manner are described in further detail. FIG. 12 is a diagram showing the layout of the two-dimensional array 2 of selection transistors 10 in an XY plane, and the figure shows a number of selection transistors 10 aligned in a two-dimensional matrix, word lines 13 (gates 25), bit lines 14, contact holes 27, through holes 34, element isolating regions 35 and dummy gates 36 for separating elements.

As shown in FIG. 12, the active region for forming drains 21, sources 22 and channel regions 23 of the selection transistors 10 is separated into a number of regions in the X direction by element isolating regions 35 in stripe form that extend in the Y direction. In order to make it easier to understand, the drains 21 and the sources 22 are hatched, and the element isolating regions 35 are surrounded by broken lines. The sources 22 are electrically disconnected by the dummy gates 36 between the selection transistors 10 which are adjacent in the Y direction. That is to say, a predetermined potential (for example, grounding potential) is applied to the dummy gates 36 so that no inversion layer is formed in the channel regions 23 beneath the dummy gates 36. In addition, the drains 21 are integrated between the selection transistors 10 which are adjacent in the Y direction and are connected to the same bit lines 14 which extend in the Y direction via the common contact holes 27. Two selection transistors 10 that are adjacent in the Y direction have the drains 21 connected and integrated on one side and the sources 22 that are electrically disconnected with a dummy gate 36 in between on the other side.

The gates 25 and the dummy gates 36 extend in the X direction in such a manner that dummy gates 36 are formed with a source 22 in between on both sides of two gates 25 formed with a drain 21 in between. The drains 21 of two selection transistors 10 that are adjacent in the Y direction are formed so as to be surrounded by two gates 25 and two element isolating regions 35, while the source 22 of one selection transistor 10 is formed so as to be surrounded by one gate 25, one dummy gate 36 and two element isolating regions 35. Contact holes 27 for the connection to the bit lines 14 are created above the drains 21, and through holes 34 are created above the sources 22. A variable resistor 29 in annular form (metal oxide film), a first electrode 30 in annular form (metal electrode film) and a middle selection line 11 made of a metal in columnar form are formed inside the through holes 34, but these are omitted in FIG. 12. As shown in FIG. 12, the bit lines 14 extend linearly in the Y direction, and therefore, the contact hole 27 and the through hole 34 within the same selection transistor 10 are staggered in the X direction so that the bit lines 14 do not make contact with the through holes 34.

The region surrounded by the one-dot chain line (thick line) in FIG. 12 is occupied by one selection transistor 10, and this is equal to the region in the XY plane occupied by one memory cell 9 in the three-dimensional memory cell array 1 located above the one selection transistor 10.

FIGS. 13A to 13C respectively show the structure in the cross sections in three YZ planes that pass through the line sections A-A', B-B' and C-C' in FIG. 12. FIG. 13A shows the structure in a cross section in a YZ plane where four selection transistors 10 are aligned in the Y direction, and four memory cells 9 made of a variable resistive element 7 in annular form and a diode 8 in annular form formed on the outer peripheral portion of middle selection lines 11 made of four metal columns are aligned in the Y and Z directions. As shown in FIG. 13A, four middle selection lines 11 are connected to the sources 22 of four selection transistors 10. In addition, the sources 22 of the selection transistors 10 that are adjacent in the Y direction are separated by the dummy gates 36. FIG. 13B shows the structure in a cross section in a YZ plane where four selection transistors 10 are aligned in the Y direction, and the drains 21 and bit lines 14 that extend in the Y direction are connected via the contact holes 27. As shown in FIG. 13B, the drains 21 are connected and integrated so as to share contact holes 27 between the selection transistors 10 which are adjacent in the Y direction. FIG. 13C shows the structure in a cross section in a YZ plane where four gates 25 and two dummy gates 36 cross in the X direction an element isolating region 35 that extends in the Y direction.

Figure 14A:
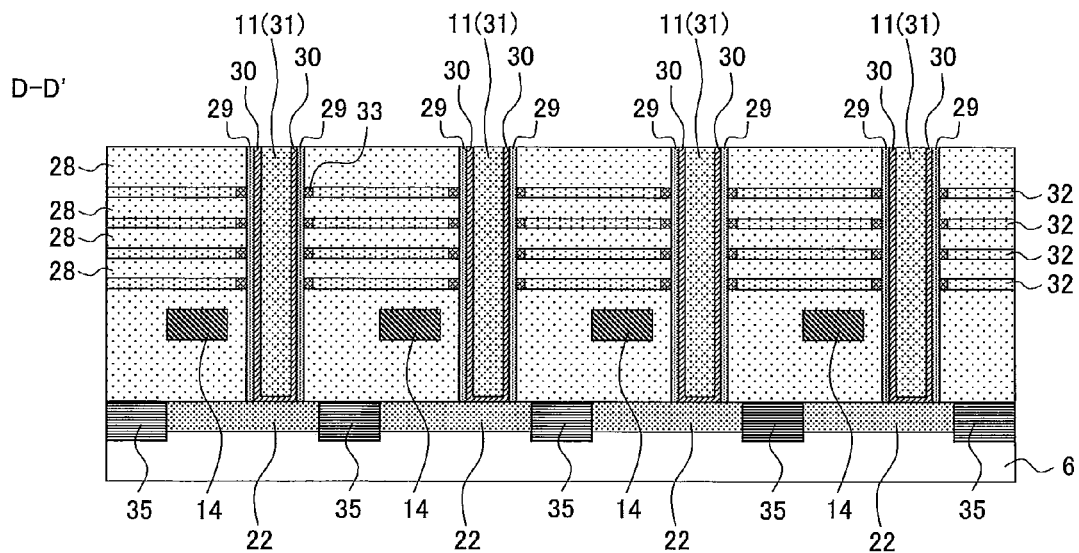
FIG. 14 is a schematic cross sectional diagram showing the structure of the three-dimensional memory cell array and the two-dimensional array of selection transistors according to the first embodiment in an XZ plane.
Figure 14B:
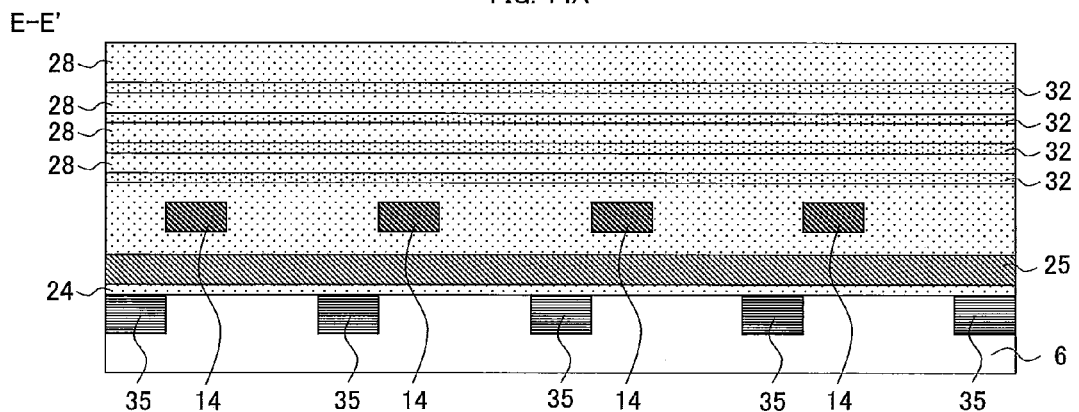
Figure 14C:
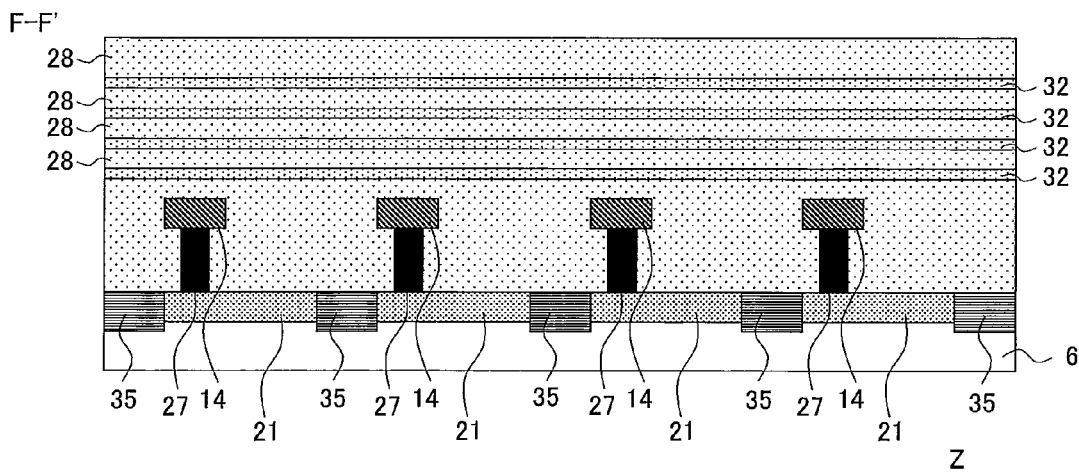

FIGS. 14A to 14C show the structure in a cross section in three XZ planes which pass through the line sections D-D', E-E' and F-F' in FIG. 12. FIG. 14A shows the structure in a cross section in an XZ plane where four selection transistors 10 (sources 22 are shown) are aligned in the X direction, and four memory cells 9 made of a variable resistive element 7 in annular form and a diode 8 in annular form formed on the outer peripheral portion of the middle selection lines 11 made of four metal columns are aligned in the X and Z directions. As shown in FIG. 14A, the four middle selection lines 11 are connected to the sources 22 of the four selection transistors 10. The four bit lines 14 extend along the side of four middle selection lines 11 in the Y direction while being separated from each other in the X direction. In addition, the sources 22 of the selection transistors 10 which are adjacent in the X direction are separated by the element isolating regions 35. FIG. 14B shows the structure in a cross section in an XZ plane where four selection transistors 10 (channel regions 23 and the gates 25 are shown) are aligned in the X direction and four common plates 12 are layered in the Z direction. As shown in FIG. 14B, the gates 25 of the selection transistors 10 cross the element isolating regions 35 and are connected to each other so as to form one word line 13. FIG. 14C shows a structure in a cross section in an XZ plane where four selection transistors 10 (drains 21 are shown) are aligned in the X direction and four common plates 12 are layered in the Z direction. As shown in FIG. 14C, the drains 21 of the selection transistors 10 which are adjacent in the X direction are separated by the element isolating regions 35, and the drains 21 are connected to the bit lines 14 which extend in the Y direction via contact holes 27.

Next, a method for connecting the common plates 12 in the layers of the three-dimensional memory cell array 1 to signal wires 40 for the connection to the Z decoder 5 is described in reference to FIGS. 15A to 15E. Though the lead out wires for connecting the common plates 12 in the layers to the Z decoder 5 may be formed in accordance with a photolithographic and etching process using other mask patterns, as shown in FIG. 15, one mask pattern is resized without using photolithography, and thus, the number of steps for photolithography can be reduced. First, as shown in FIG. 15A, the common plate 12 in the top layer is exposed from the resist pattern 41 that is patterned in the photolithographic step, and after that, as shown in FIGS. 15B to 15D, the ashing step in which the resist pattern 41 is recessed and the dry etching step in which the interlayer insulating films 28 and the common plates 12 are etched are carried out in sequence so that the common plates 12 in the respective layers are exposed in step form. After that, as shown in FIG. 15E, an insulating film 42 is deposited and flattened through CMP (chemical mechanical polishing), and after that, contact holes that reach the surface of the common plates 12 in the respective layers are created in the insulating film 42 and are filled in with a contact metal 43 for the connection to the signal wires 40. After that, signal wires 40 are formed and connected to the Z decoder 5 (not shown) in conventional photolithographic and etching steps.

Figure 16:
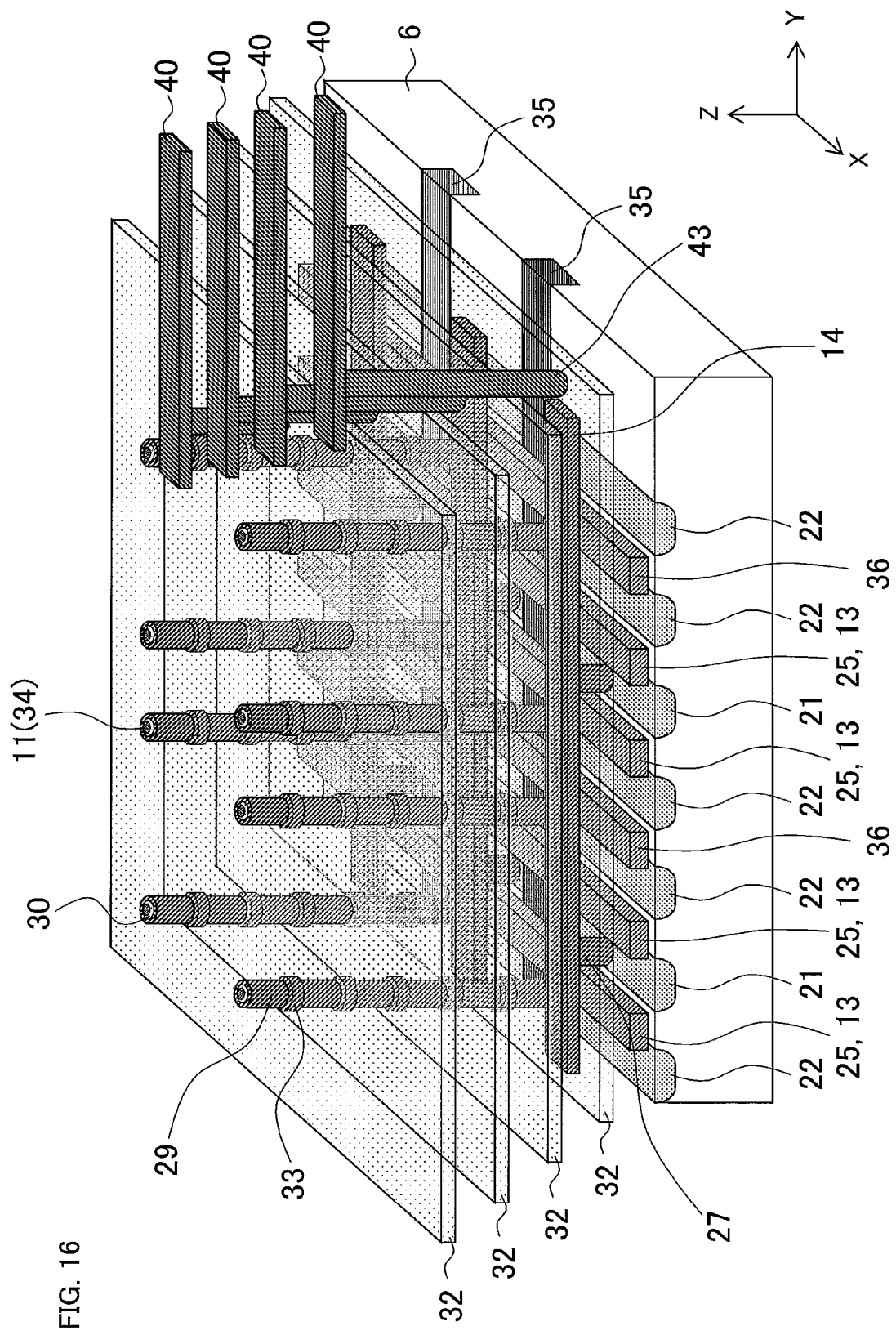
FIG. 16 is a three-dimensional bird's eye view showing the three-dimensional memory cell array and the two-dimensional array of selection transistors according to the first embodiment.

FIG. 16 is a bird's eye view showing a three-dimensional memory cell array 1 and a two-dimensional array 2 of selection transistors 10, which are fabricated in the above described manner. The three-dimensional memory cell array 1 is formed above the two-dimensional array 2 of selection transistors 10 which are aligned in a two-dimensional matrix in an XY plane. The layered variable resistive elements 7 and diodes 8 are formed in border portions between the middle selection lines 11 and the common plates 12 made of a metal in pillar form in a self-aligned manner. Thus, a three-dimensional memory cell array of 1D1R type memory cells can be formed with a minimal number of photo masks. The layered common plates 12 are processed in step form at the end of the three-dimensional memory cell array 1, so that signal wires 40 for connection to the contact metal 43 and the Z decoder 5 lead out from the common plates 12 in the respective layers.

Next, the initialization operation for each memory cell in the three-dimensional memory cell array 1 fabricated in the above described manner, the write-in operation (set operation and reset operation) for data on each memory cell and the readout operation of data for each memory cell are described.

The above described operations in the device of the present invention are basically the same as publicly known 1D1R type memory cells aligned in a two-dimensional matrix. That is to say, the present invention relates to a structure and a manufacturing method which allow a three-dimensional memory cell array where memory cells with two terminals having a variable resistive element are aligned in a three-dimensional matrix to be implemented without increasing the number of photo masks. Therefore, though the above described operations are basically the same as in the prior art, examples of the conditions for the respective operations of the three-dimensional memory cell array structure according to the present invention are described here in reference to the table in FIG. 17. FIG. 17 shows a list of conditions for the voltage applied to the selected bit line, the non-selected word lines, the selected word line, the non-selected word lines, the selected common plate and the non-selected common plates in the respective operations.

Initialization Operation (Forming)

In the memory cell structure shown in FIG. 5, the metal oxide that becomes the variable resistor 29 is in many cases in a high resistance state that is close to that of an insulating film at the time of film formation. In particular, oxides of a p type metal, such as Co or Ni, tend to be like this in accordance with a conventional film forming method. It is necessary to initialize the variable resistive elements using the above described metal oxide by applying a predetermined voltage that is higher than the operation voltage at the time of write-in across the two ends of the variable resistive elements before the usual write-in operation, so that the variable resistors 29 are converted to such a state that a switching operation is possible. This initialization operation is generally referred to as forming.

In the following, an embodiment using a Co oxide for the variable resistors 29 is described. Here, the Co oxide is cobalt monoxide (CoO) having a film thickness of 10 nm. In this embodiment, Ta is used for the metal electrode film 30 that becomes the first electrode. Here, the conditions for the voltage listed in FIG. 17 are for variable resistive elements 7 having a variable resistor 29 and a metal electrode film 30 in this embodiment, and the shown conditions for the voltage are only examples, and the conditions for the voltage should be adjusted for variable resistive elements 7 having different structures.

At the time of initialization, first a word line 13 and a bit line 14 are selected using the X decoder 3 and the Y decoder 4, respectively, in the circuit configuration in FIG. 1, so that a particular selection transistor 10 that is connected to the selected word line 13 and bit line 14 is converted to an on state, and the middle selection line 11 that is connected to the selected transistor 10 in an on state is selected. In addition, the Z decoder 5 is used to select a common plate 12. As a result, the memory cell 9 formed between the selected middle selection line 11 and common plate 12 is selected.

The column for the initialization operation in FIG. 17 shows the conditions for the voltage applied to the selected bit line, the non-selected word lines, the selected word line, the non-selected word lines, the selected common plate and the non-selected common plates. The voltage for the selected bit line is applied at one end of the variable resistive element in the selected memory cell via the selected middle selection line 11, and the voltage for the selected common plate is applied at the other end via a diode. Since the voltage for the selected bit line is 0 V, a voltage gained by subtracting the voltage drop through the diode from the voltage for the selected common plate is applied across the two ends of the variable resistive element. Here, the time during which the voltage is applied is defined by the length of the period during which the voltage for the selected bit line, the voltage for the selected word line and the voltage for the selected common plate are applied simultaneously. In the present embodiment, the time during which the voltage is applied is 1 μs, and the current that flows through the variable resistive element selected at the time of initialization is 100 μA or less when the desired initialization is complete.

Here, it is necessary to initialize all the memory cells within the three-dimensional memory cell array 1, and therefore, a number of memory cells may be selected by selecting a number of bit lines, word lines and common plates simultaneously, and thus initialized at the same time, and this operation for initialization for a number of memory cells may be repeated, so that the initialization for all the memory cells is completed. As a result, the total time required for initialization can be shortened.

FIG. 11 schematically shows a variable resistor 29 in the state after initialization. Only the portions of the metal oxide film 29 that is a variable resistor that make contact with the polycrystal silicon film 33 are initialized and thus converted to regions 29a that make the switching operation possible, and these regions 29a that make the switching operation possible are electrically separated from each other by insulating regions 29b which are not initialized in the longitudinal direction.

Write-in Operation (Set Operation and Reset Operation)

The respective rows for the set operation and the reset operation in FIG. 17 show examples of the conditions for the voltage applied to the selected bit line, the non-selected word lines, the selected word line, the non-selected word lines, the selected common plate and the non-selected common plates in the set operation and the reset operation, respectively. The memory cell to be written into is selected by applying the operation voltages shown in FIG. 17 to the selected bit line, the non-selected word lines, the selected word line, the non-selected word lines, the selected common plate and the non-selected common plates, as in the operation for initialization. The voltage for the selected bit line is applied at one end of the variable resistive element in the selected memory cell via the selected middle selection line, and the voltage for the selected common plate is applied at the other end via a diode in the set operation and the reset operation, respectively. Since the voltage for the selected bit line is 0 V, the voltage for the set operation or the voltage for the reset operation gained by subtracting the voltage drop in the diode in a forward biased state from the selected common plate voltage is applied across the two ends of the variable resistive element. As a result, a set operation current or a reset operation current that passes through the selected memory cell, the selected middle selection line, the selected transistor in an on state and the selected bit line from the selected common plate flows through the variable resistive element in the selected memory cell.

Meanwhile, the selection transistors that are connected to the non-selected word lines are in an off state, and no set operation current or reset operation current flows through the non-selected memory cells connected to the non-selected middle selection lines connected to the selection transistors in an off state, and therefore, there is no set operation or reset operation. In addition, as described below, there is no set operation or reset operation in the non-selected memory cells that are connected to the middle selection lines connected to the selection transistors in an on state connected to the selected word lines. The voltage for the non-selected bit lines is the same as the voltage for the selected common plate in both the set operation and the reset operation, and therefore, no voltage is applied across the two ends of non-selected memory cells that are electrically connected to the non-selected bit lines via the selection transistors in an on state and the middle selection lines, and connected to the selected common plate, and thus, there is no set operation or reset operation. In addition, the voltage for the non-selected common plates is the same as the voltage for the selected bit line in both the set operation and the reset operation, and therefore, no voltage is applied across the two ends of non-selected memory cells that are electrically connected to the selected bit line via the selection transistors in an on state and the middle selection lines and connected to the non-selected common plates, and thus, there is no set operation or reset operation. Furthermore, the voltage for the non-selected bit lines is higher than the voltage for the non-selected common plates in both the set operation and the reset operation, and therefore, a backward bias is applied across the two ends of the diodes in the non-selected memory cells that are electrically connected to the non-selected bit lines via the selection transistor in an on state and the middle selection lines and connected to the non-selected common plates, so that there is no current for the set operation or the reset operation, and thus there is no set operation or reset operation.

In the present embodiment, at the time of the set operation, that is to say, in the case where the variable resistive element in the selected memory cell transitions from a high resistance state to a low resistance state, the voltage for the selected common plate is set to approximately 3 V, which is a higher voltage than the threshold voltage for the set operation, and the voltage for the selected word line is set to 1.8 V, which is low, so that the on resistance of the selected transistor is set high, and thus, the current that flows through the memory cell can be restricted after the resistance of the variable resistive element lowers. Meanwhile, at the time of the reset operation, that is to say, in the case where the variable resistive element in the selected memory cell transitions from a low resistance state to a high resistance state, the direction of the current that flows through the variable resistive element is the same, and the voltage for the selected word line is set to 3 V, which is higher than during the set operation, the on resistance of the selected transistor is set low, the drive current is set high, so that a operation current of not lower than the threshold current for the reset operation when the variable resistive element is in a low resistive state flows through the selected memory cell, and the voltage for the selected common plate is kept at approximately 1.2 V, which is lower than during the set operation, and thus, the voltage applied across the two ends of the variable resistive element can be prevented from exceeding the threshold voltage for the set operation after the resistance of the variable resistive element increases. In the above described conditions for the applied voltage, a desired set operation and reset operation can be completed when the time during which a write-in voltage is applied is 50 ns or less and the current that flows through the variable resistive element that is selected at the time of write-in is 100 µA or less. In the present embodiment, the voltage for the selected common plate is adjusted, and at the same time, the voltage for the selected word line is adjusted so that the on resistance of the selected memory cell is controlled between the set operation and the reset operation, and thus, two write-in operations are possible without changing the direction in which the current flows through the variable resistive element and the time during which the write-in voltage is applied between the set operation and the reset operation.

Readout Operation

The readout operation row in FIG. 17 shows examples of the conditions for the voltage applied to the selected bit line, the non-selected word lines, the selected word line, the non-selected word lines, the selected common plate and the non-selected common plates during the readout operation. The memory cell to be read out from is selected by applying the operation voltages shown in FIG. 17 to the selected bit line, the non-selected word lines, the selected word line, the non-selected word lines, the selected common plate and the non-selected common plates, as in the initialization operation and the write-in operation. The voltage for the selected bit line is applied at one end of the variable resistive element in the selected memory cell via the selected middle selection line, and the voltage for the selected common plate is applied at the other end via a diode. Since the voltage for the selected bit line is 0 V, the voltage for readout gained by subtracting the voltage drop of the diode in a forward biased state from the voltage for the selected common plate is applied across the two ends of the variable resistive element. As a result, a readout current that passes through the selected memory cell, the selected middle selection line, the selected transistor in an on state and the selected bit line from the selected common plate flows through the variable resistive element in the selected memory cell. When this readout current is detected by a current detection circuit provided on the bit line side or the common plate side so that the resistance state in the variable resistive element is determined, the data stored in the memory cell is read out.

Here, it is necessary for the voltage for the selected common plate to be sufficiently low compared to during the set operation and the reset operation, so that a voltage lower than the threshold voltage for the set operation and reset operation is applied to the variable resistive element as the above described voltage for the readout operation, and in the present embodiment, it is set to 0.4 V. Furthermore, it is preferable to prevent an unnecessary parasitic current from flowing through the non-selected middle selection lines that are connected to the selected transistors in an on state connected to the selected word line for precise readout operation. In the present embodiment, the voltage for the non-selected bit lines is set slightly higher than the voltage for the selected common plate, so that an unnecessary parasitic current can be prevented from flowing through the non-selected middle selection lines, in order to prevent a forward bias from being applied to the diodes in the non-selected memory cells that are connected to the non-selected middle selection lines and the selected common plate due to interference from other memory cells.

Though the initialization operation, the write-in operation and the readout operation are described in detail citing concrete numbers for the conditions for the applied voltage and the film thickness for an embodiment where Co oxide is used for the resistive resistors 29 and Ta is used for the metal electrode film 30 which becomes the first electrodes, the present invention is characterized by the three-dimensional form, arrangement and manufacturing process for the three-dimensional memory cell array, where memory cells with two terminals having a variable resistive element are aligned in a three-dimensional matrix, and not limited by the material that forms the variable resistive elements, and therefore, it should be clear that the essence of the present invention remains unchanged if a different material is used, as long as memory cells with two terminals have a structure with a variable resistive element.

Second Embodiment

Next, the device according to the second embodiment of the present invention is described. According to the first embodiment shown in the above, selection transistors are formed of standard planar MOS transistors. In the case where selection transistors 10 are formed of planar MOS transistors in a two-dimensional array 2 having the wiring structure shown in FIG. 3, as shown in FIGS. 5 and 12, the electrodes for the drains 21, the sources 22 and the gates 25 are provided in a plane, and it is necessary to separate the contact holes 27 for connecting the drains 21 to the bit lines 14 and the through holes 34 for forming the middle selection lines 11 that are connected to the sources 22 from each other in the plane, and thus, a problem arises, such that the area occupied by each selection transistor 10, that is to say, the area occupied by each memory cell in the XY plane, is large in the three-dimensional memory cell array. When publicly known vertical MOS transistors are used as the selection transistors in order to solve this problem, the wiring structure around the selection transistors can be made simpler.

FIG. 18 is a cross sectional diagram showing the main portion in a cross section in a YZ plane that passes through the middle selection lines 11 in the three-dimensional memory cell array 1 and the two-dimensional array 2 of the selection transistors 10 according to the second embodiment. FIG. 18 shows an example of the structure of two selection transistors 10, two middle selection lines 11 and one bit line 14 that are connected to the selection transistors, and a number of memory cells 9 that are connected to the middle selection lines 11 and aligned in the Z direction. Here, the example shows four memory cells 9 layered on top of each other in the Z direction. In addition, in FIG. 18, the same symbols are used for parts of the vertical MOS transistors that form the selection transistors 10 corresponding to those of the planar MOS transistors according to the first embodiment, in order to make the description easier to understand.

The MOS transistors used for the selection transistors 10 are vertical MOS transistors with a gate 25 surrounding the outer periphery of a channel region 23 in columnar form extending in the Z direction with a gate oxide film 24 in between, and a source 22 and a drain 21 are provided above and below the channel region 23, respectively. In the second embodiment, the selection transistors 10 are fabricated through a publicly known process for forming a vertical MOS transistor separately from the MOS transistors used in the peripheral circuit, including the X decoder 3, the Y decoder 4 and the Z decoder 5. The structure and method for manufacturing the three-dimensional memory cell array 1 above the two-dimensional array 2 of selection transistors 10 are the same as in the first embodiment, and therefore not described.

Figure 19:
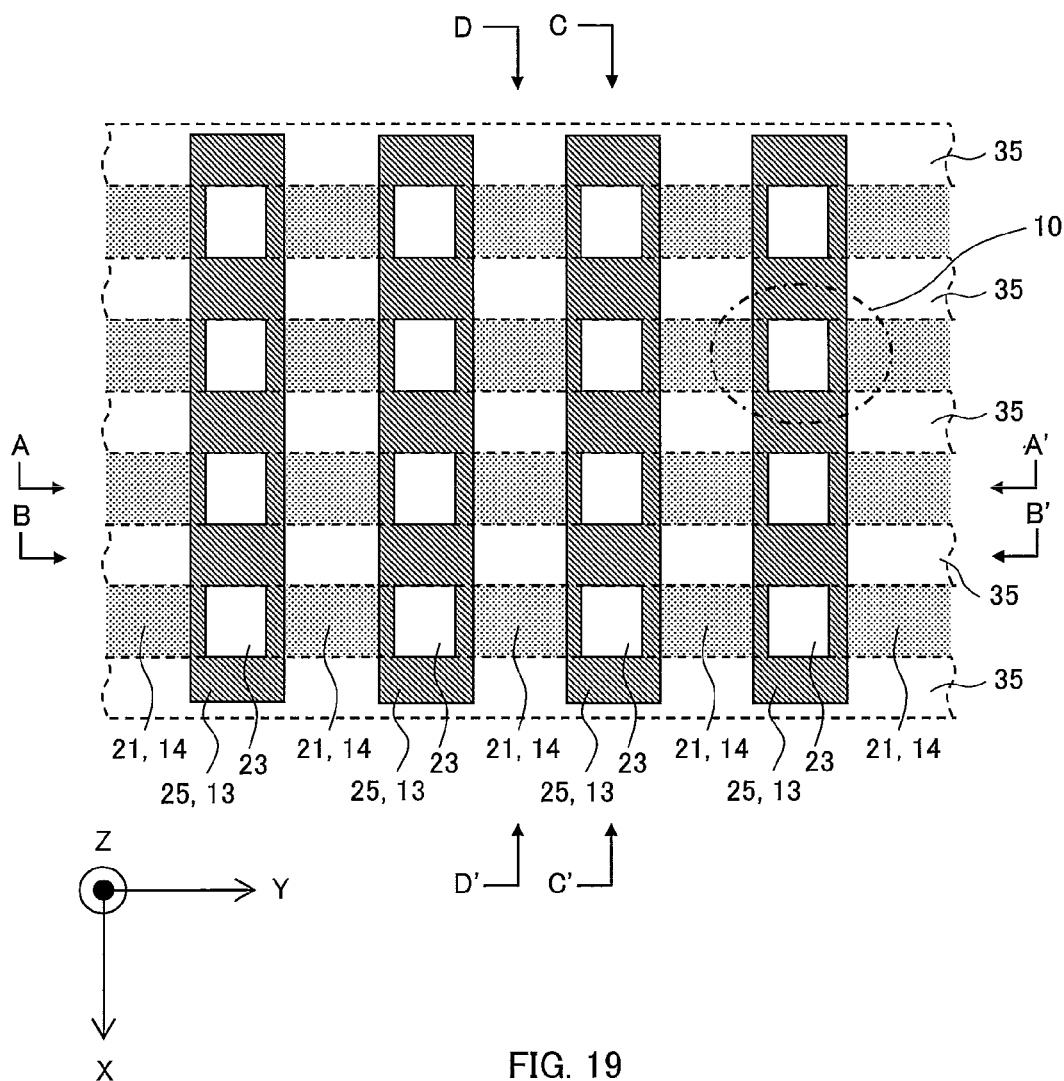
FIG. 19 is a diagram showing the layout of the two-dimensional array of selection transistors formed of vertical MOS transistors according to the second embodiment in an XY plane.

FIG. 19 shows the layout of the two-dimensional array 2 of selection transistors 10 formed of vertical MOS transistors in an XY plane. FIG. 19 shows the drains 21, the channel regions 23 and the gate oxide film 24 of a number of selection transistors 10 arranged in a two-dimensional matrix, as well as the word lines 13 (gates 25), the bit lines 14 and the element isolation regions 35. The region surrounded by a one-dot chain line (thick line) in FIG. 19 is the region occupied by one selection transistor 10, and it has the same area as the region occupied by each memory cell 9 in the three-dimensional memory cell array 1 that is located above the circled region in the XY plane. It is clear that the area can be reduced in comparison with the region occupied by the selection transistor 10 formed of a planar MOS transistor shown in FIG. 12 for the first embodiment.

In addition, FIGS. 20A and 20B show the structure in a cross section in two YZ planes that pass through the sections A-A' and B-B' in FIG. 19, respectively, while FIGS. 21A and 21B show the structure in a cross section in two XZ planes that pass through the sections C-C' and D-D' in FIG. 19, respectively.

As shown in FIGS. 19 and 20, a number of element isolation regions 35 extending in the Y direction on the silicon substrate 6 are aligned in stripes in the X direction, and an impurity (for example an n type impurity) is implanted in the active regions separated by the element isolation regions 35 so that the drains 21 for the selection transistors 10 are formed, and bit lines 14 extending in the Y direction are formed so that the drains 21 of adjacent selection transistors 10 in the Y direction are connected to each other. As shown in FIGS. 18, 19, 20A and 21A, silicon columns are provided along a number of bit lines 14 made of impurity diffusion regions at constant intervals in the Y direction, and channel regions 23 are then formed. An impurity of the same conductivity type as the drains 21 is implanted in the silicon columns on the channel regions 23, so that the sources 22 of the selection transistors 10 are formed. The gates 25 surround the outer periphery of the channel regions 23 with gate oxide films 24 in between. Adjacent gates 25 in the X direction are connected to each other so as to form word lines 13 extending in the X direction. Thus, a two-dimensional array 2 of selection transistors 10 is formed of a number of vertical MOS transistors aligned in the X and Y direction on a silicon substrate 6.

Figure 22:
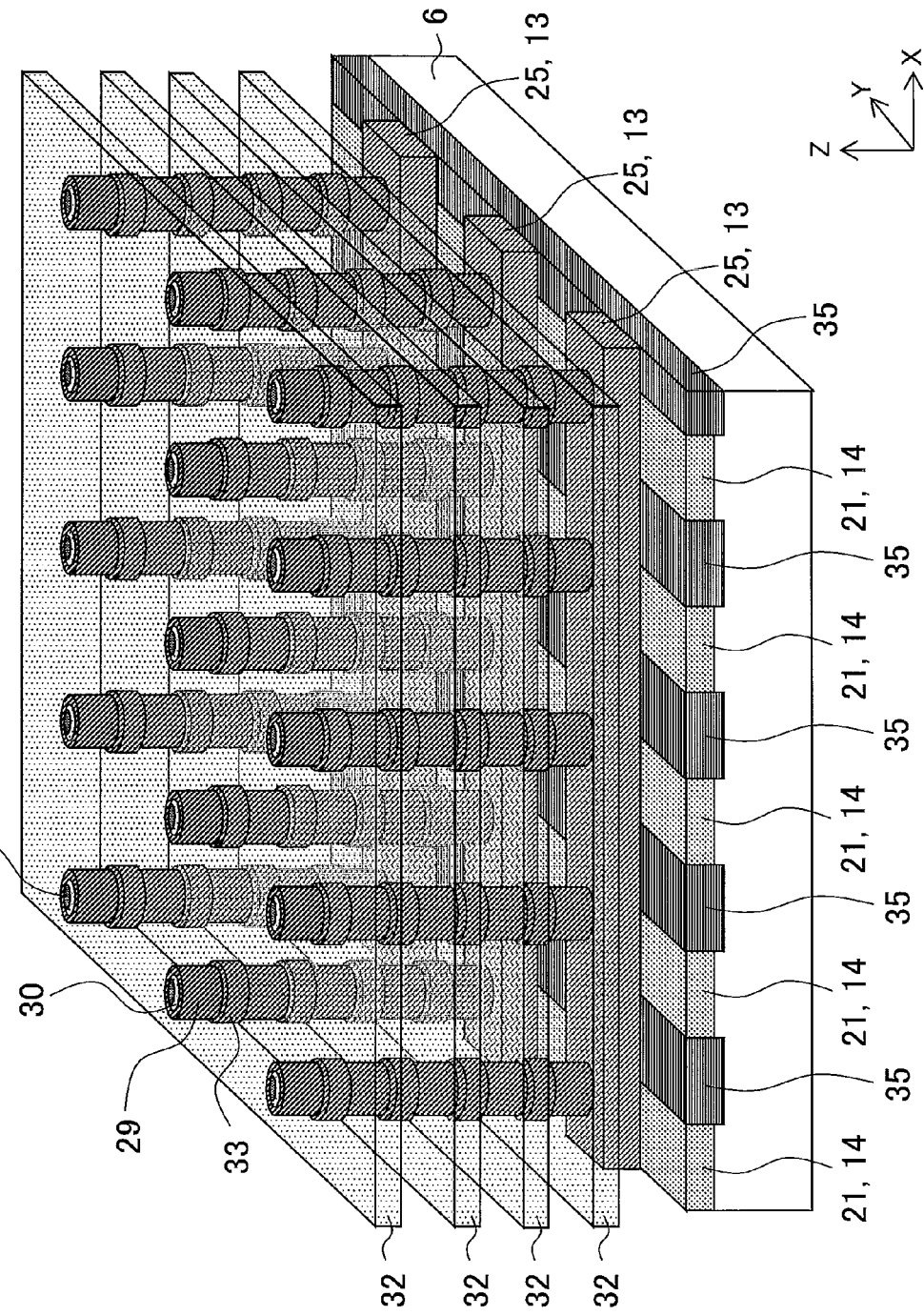
FIG. 22 is a three-dimensional bird's eye view showing the three-dimensional memory cell array and the two-dimensional array of selection transistors according to the second embodiment.

FIG. 22 is a bird's eye view showing a three-dimensional memory cell array 1 and a two-dimensional array 2 of selection transistors 10 fabricated as described above. These are the same as in the first embodiment in that the three-dimensional memory cell array 1 is formed above the two-dimensional array 2 of selection transistors 10 aligned in a two-dimensional matrix in an XY plane, and the layered variable resistive element 7 and diode 8 are formed in a self-aligning manner in the border portion between the middle selection lines 11 and the common plates 12 made of metal columns.

Furthermore, in the second embodiment, the same three-dimensional memory cell array 1 is used as in the first embodiment, and therefore, the method for connecting the common plates 12 in the respective layers in the three-dimensional memory cell array 1 to the signal wires 40 connected to the Z decoder 5 described in the first embodiment can be applied also to the second embodiment.

Here, wiring between the word lines 13 and the X decoder 3, as well as between the bit lines 14 and the Y decoder 4, may be carried out at the same time as the wiring between the MOS transistors within the X decoder 3, the Y decoder 4 and the Z decoder 5 after forming the selection transistors 10, or at the same time as the wiring between the Z decoder 5 and the signal wires 40, for example.

Third Embodiment

Next, the device according to the third embodiment of the present invention is described. Though 1D1R type memory cells are used as memory cells with two terminals in the above described first and second embodiments, the device of the present invention having the structure shown in FIG. 1 is possible even in the case where 1R type memory cells are used. This should be clear from the fact that the present invention does not relate to whether memory cells are of a 1R type or a 1D1R type, because the present invention is first characterized in that the three-dimensional memory cell array 1 and the two-dimensional array 2 of selection transistors 10 are combined via middle selection lines 11, so that the selection lines of the three-dimensional memory cell array 1 are formed only of the common plates 12 in an XY plane, and therefore, it is not necessary to use a photolithographic step using an expensive, state of the art stepper in order to form a two-dimensional memory cell array in each layer, and thus, the cost of manufacturing the three-dimensional memory cell array 1 can be kept low, and second characterized in that a decoding process for selecting a memory cell from the three-dimensional memory cell array 1 are shared by three decoders: an X decoder 3, a Y decoder 4 and a Z decoder 5, and the decoders can carry out the decoding process on the corresponding selection lines (word lines, bit lines, common plates) each aligned one-dimensionally, so that they can be implemented in a simple circuit structure.

Here, in the case where 1R type memory cells are used, it is not necessary to form current control elements at the ends of the common plates 12, and therefore, the common plates 12 can be formed of conductors with low resistance other than polycrystal silicon films in which an impurity is diffused, so that ohmic contact is possible with the variable resistors 29. Combinations of variable resistors 29 and common plates 12 that can make ohmic contact include combinations of an n type metal oxide, such as $TiO_2$, $Ta_2O_5$ or $HfO_2$ and a metal having a low work function value, such as Ti or Ta.

Here, when the common plates 12 are formed of metal films that can make Schottky contact with variable resistors 29, diodes are formed of a Schottky junction in the interface between the metal oxide film of the variable resistor 29 and the metal film of the common plate 12, and thus, 1D1R memory cells can be formed instead of 1R type memory cells.

Combinations of a metal oxide film of a variable resistor 29 and a metal film of a common plate 12 that can form a diode for a Schottky junction include combinations of an n type metal oxide, such as $TiO_2$, $Ta_2O_5$ or $HfO_2$ and a metal having a high work function value, such as Pt or TiN.

In either case where the memory cells are of 1R type or of 1D1R type, it is preferable for the contacts in the interface between the two electrodes provided at both ends of each variable resistor 29 and the variable resistor 29 to be ohmic contact in one interface and non-ohmic contact in the other. The third embodiment with 1R type memory cells having variable resistors 29 having ohmic contact in the interface between one electrode and the variable resistor 29 and non-ohmic contact in the interface between the other electrode and the variable resistor 29 is described below. Here, in the following FIGS. 23 to 30, the same symbols are used for the parts that form the three-dimensional memory cell array 1 corresponding to the parts in the first and second embodiments in order to make the description easier to understand.

Figure 23A:
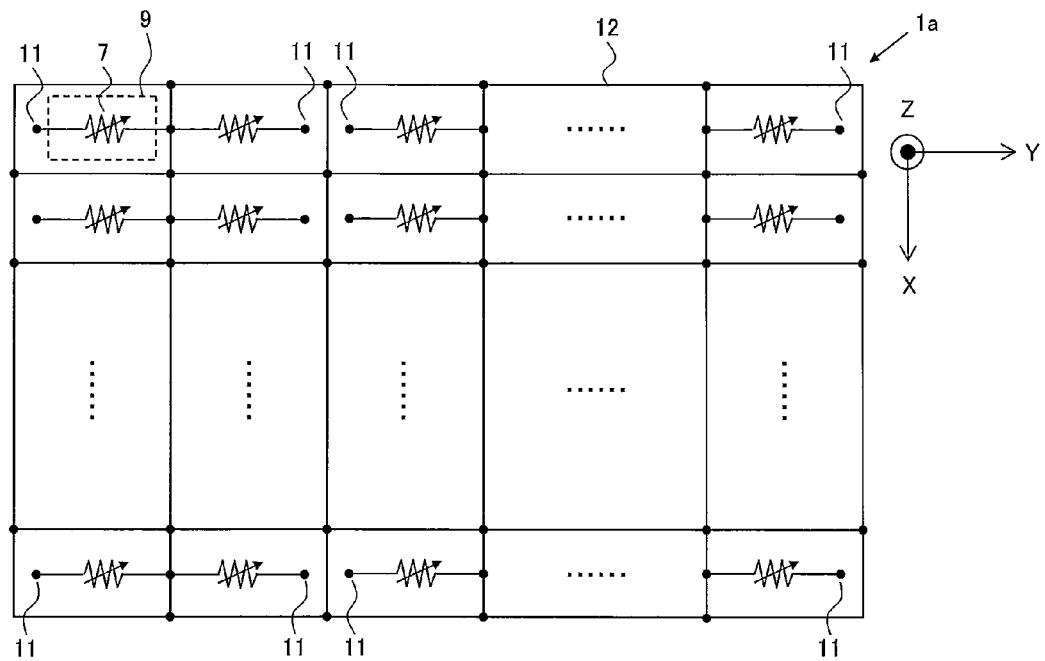
FIG. 23 is an equivalent circuit diagram showing the three-dimensional circuit structure of a three-dimensional memory cell array formed of 1R type memory cells.
Figure 23B:
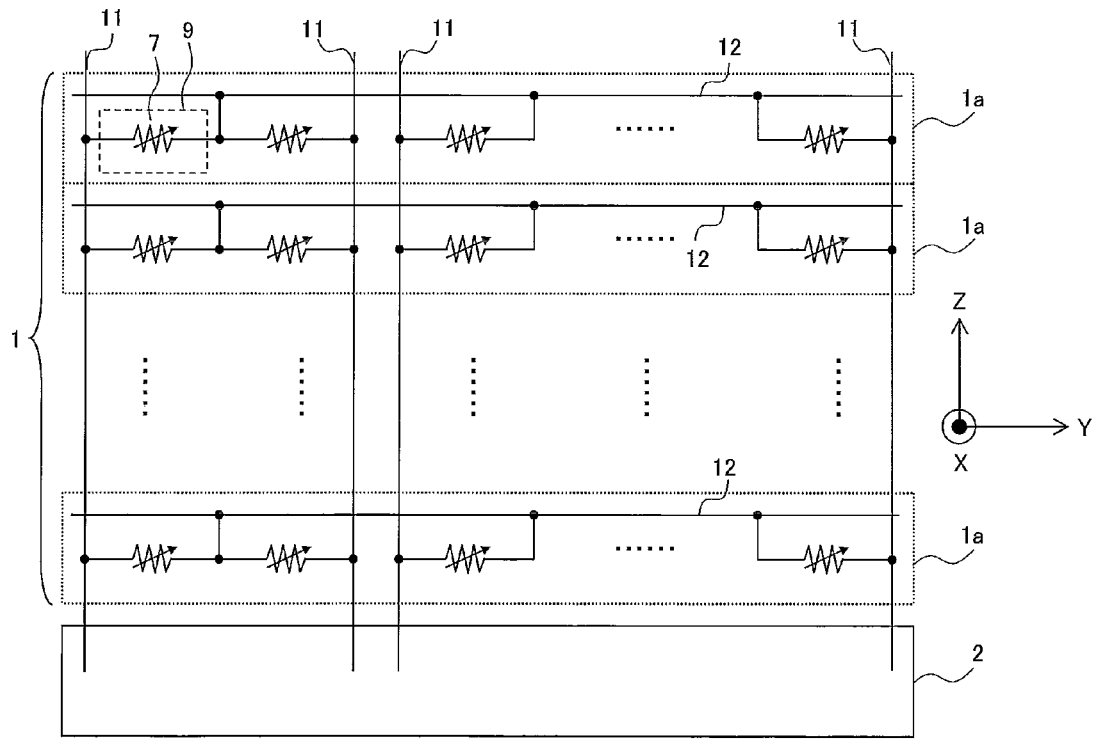

First, FIG. 23 shows an equivalent circuit diagram showing a three-dimensional memory cell array 1 formed of 1R type memory cells. FIG. 23A shows a two-dimensional memory cell array 1a in one layer in an XY plane in the three-dimensional memory cell array 1, and FIG. 23B shows a circuit structure in a YZ plane of a number of two-dimensional memory cell arrays 1a layered in the Z direction. When comparing this with the equivalent circuit diagram showing a three-dimensional memory cell array 1 formed of 1D1R type memory cells as shown in FIG. 2, there is a difference in each memory cell 9 in that one has a diode 8 and the other does not, and 1R type memory cells have a common plate 12 and a variable resistive element 7 directly connected so that the common plate 12 functions as one electrode (second electrode) of the variable resistive element 7.

Figure 24:
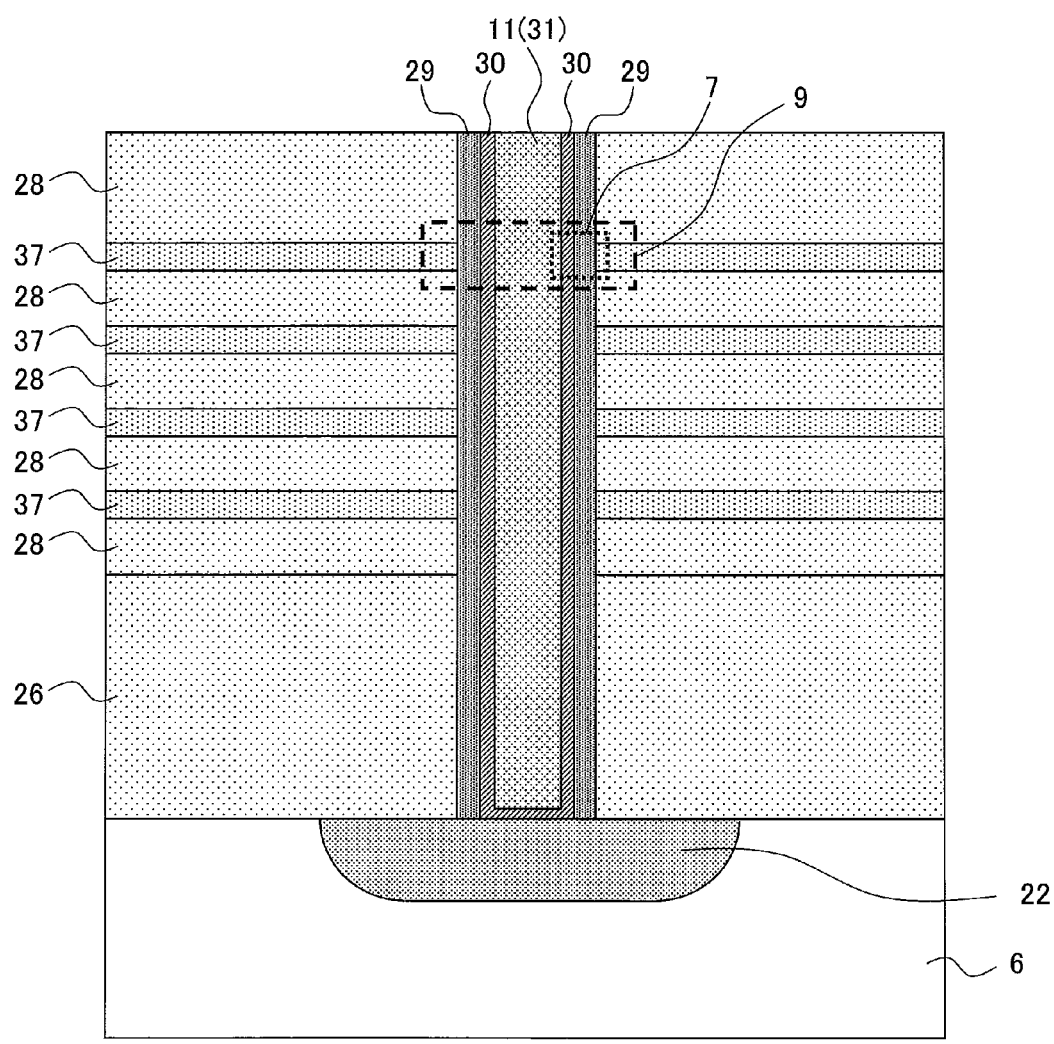
FIG. 24 is a schematic cross sectional diagram showing the structure of the main portion of the three-dimensional memory cell array according to the third embodiment in a YZ plane.

FIG. 24 shows an example of a structure of one middle selection line 11 and a number of 1R type memory cells 9 aligned in the Z direction and connected to the middle selection line 11 in a cross section along a YZ plane that passes through the middle selection line 11. In the same manner as in the first and second embodiments, memory cells 9 are formed in an annular form around the outer periphery of each middle selection line 11 at intersections between the common plate 12 in each layer and the middle selection line 11. Concretely, the memory cells 9 are formed of a middle selection line 11 made of metal column 31 that penetrates through the through hole 34 created in the common plate 12 in one layer in the Z direction, a metal electrode film 30 formed in cylindrical form around the outer periphery of the middle selection line 11, a variable resistor 29 formed in cylinder form around the outer periphery of the metal electrode film 30, and a common plate 12. In the third embodiment, the metal electrode films 30 and the common plates 12 respectively become the first and the second electrodes of the variable resistive elements 7.

In the third embodiment, metal films 37, which make non-ohmic contact in the interface between the variable resistor 29 and the metal film 37, are used for the common plates 12 instead of polycrystal silicon films. In the case where a metal oxide that becomes an n type semiconductor, such as $TiO_2$, $Ta_2O_5$, $HfO_2$ or $ZrO_2$, is used for the variable resistors 29, for example, a metal having a low work function value, such as Pt or TiN, is used for the common plates 12, while in the case where a metal oxide that becomes a p type semiconductor, such as NiO or CoO, is used for the variable resistors 29, a metal having a high work function value, such as Ti or Ta, is used for the common plates 12.

In addition, the variable resistors 29 have different levels of oxygen deficiency in the film in the direction of the diameter so that they can be separated into three portions 29c, 29d and 29e having different electrical properties. The portions 29c are the same as the variable resistors 29 before the reduction process and are made of a metal oxide having little oxygen deficiency exhibiting insulator-like properties. Meanwhile, the portions 29d are made of a metal oxide produced by reducing the variable resistors 29 and have a high level of oxygen deficiency exhibiting semiconductor- or conductor-like properties and making ohmic contact in the interface between the portion 29d and the metal electrode film 30. The metal electrode films 30 are made of a metal that can be more easily oxidized than the metal that forms the metal oxide for the variable resistors 29, and when the metal electrode films 30 make contact with the variable resistors 29 before the reduction process, oxygen is extracted from the insulating metal oxide through a solid phase reaction so that the inner peripheral portions of the variable resistors 29 that make contact with the metal electrode films 30 change to a metal oxide 29d.

Figure 25A:
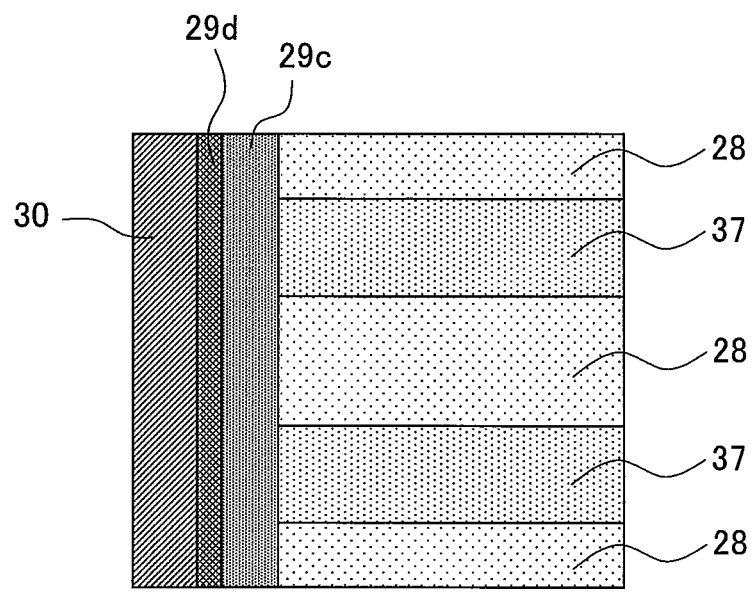
FIG. 25 is a schematic cross sectional diagram showing an enlargement of the main portion, where the memory cell in FIG. 24 is formed, before and after the initialization process.
Figure 25B:
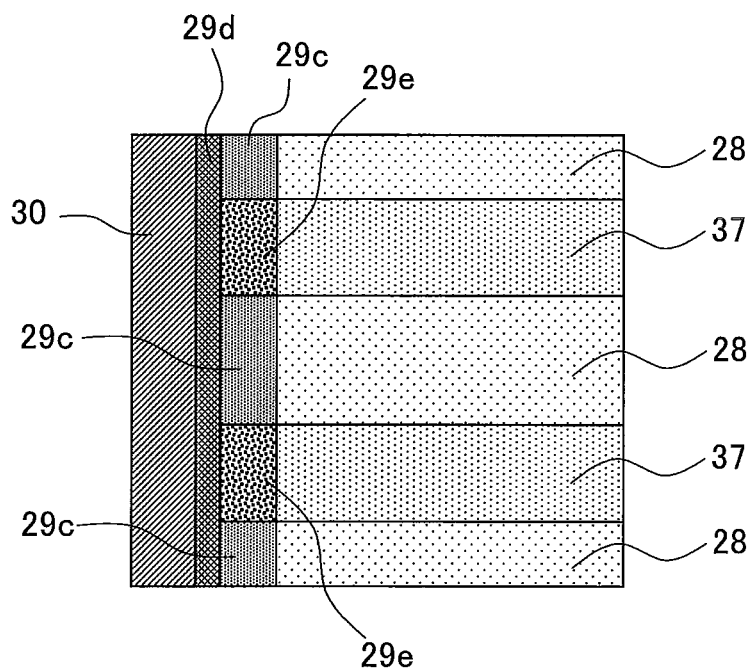

FIGS. 25A and 25B are diagrams showing an enlargement of the major portion of a variable resistor 29 in a location where a memory cell 9, as in FIG. 24, is formed in the states before and after the initialization process as described in the first embodiment. Variable resistive elements 7 are gained as a result of the above described reduction process where two metal oxides 29c and 29d having different levels of oxygen deficiency make contact with each other in the direction of the diameter and which make an excellent switching operation (transition of a resistance state) possible when a predetermined initialization voltage that is higher than the operation voltage at the time of write-in is applied across the two ends of the variable resistive element 7 with two terminals which is sandwiched between the first and second electrodes (metal electrode film 30 and common plate 12). That is to say, when an initialization voltage is applied between a metal electrode film 30 and a common plate 12, the metal oxide 29c located in between changes to a metal oxide 29e that allows for a switching operation. FIG. 25B shows a state of a variable resistive element 7 where a switching operation is possible as a result of an initialization process. The metal oxide 29e is in such a state that a certain level of oxygen deficiency is created through the application of an initialization voltage.

As shown in FIG. 25B, the metal oxide 29d having a conductance makes ohmic with the inside metal electrode film 30 in cylindrical form while the metal oxide 29e for an active switching operation makes non-ohmic contact with the outside common plate 12 (metal film 37). Here, the metal oxide 29e for an active switching operation is electrically separated in the Z direction by the metal oxide 29c having insulator-like properties, and therefore, a number of 1R type memory cells 9 are formed so as to be separated from each other in the Z direction along the middle selection line 11, and thus, a three-dimensional array structure shown in the equivalent circuit diagram in FIG. 23 is provided.

Next, the manufacturing process for the three-dimensional memory cell array 1 having the structure shown in FIG. 24 is described in reference to FIGS. 26 to 30. Here, FIGS. 26 to 30 are cross sectional diagrams of a memory cell in a cross section in a YZ plane that passes through a middle selection line 11 in the same manner as in FIG. 24.

Figure 26:
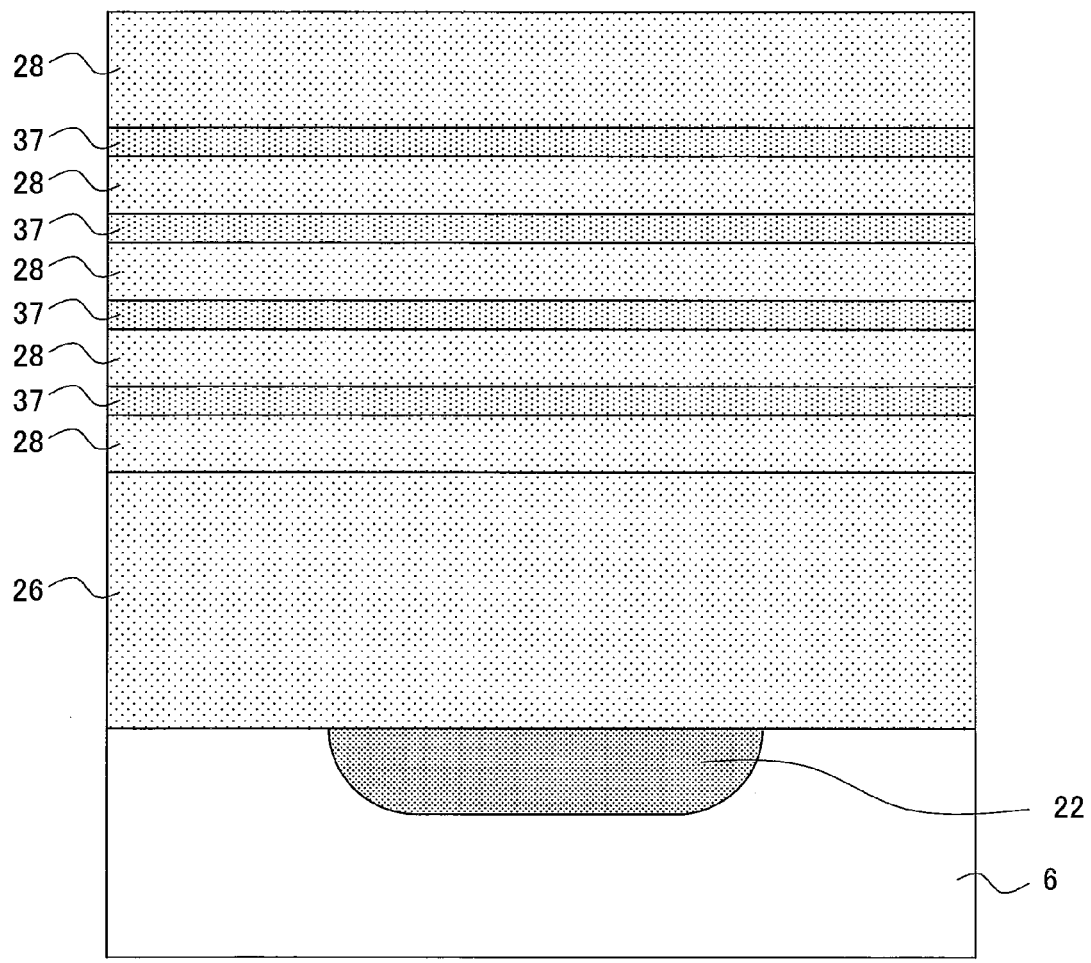
FIG. 26 is a schematic cross sectional diagram showing a step which is part of the manufacturing process for the three-dimensional memory cell array according to the third embodiment.

First, as shown in FIG. 26, a number of second interlayer insulating films 28 made of $SiO_2$ or the like and a number of metal films 37 which become common plates 12 (for example, TiN) are alternately layered on the first interlayer insulating film 26 on the silicon substrate 6 where a two-dimensional array 2 (not shown) is formed in the same manner as in the first embodiment. The film thickness of the interlayer insulating films 28 is approximately 50 nm to 500 nm, and the film thickness of the metal films is also approximately 50 nm to 500 nm. The number of layers of the metal films 37 becomes the number of layers of the complete memory cell 9 in the Z direction. FIG. 26 shows an example of the memory cell 9 where four layers are layered in the Z direction.

Figure 27:
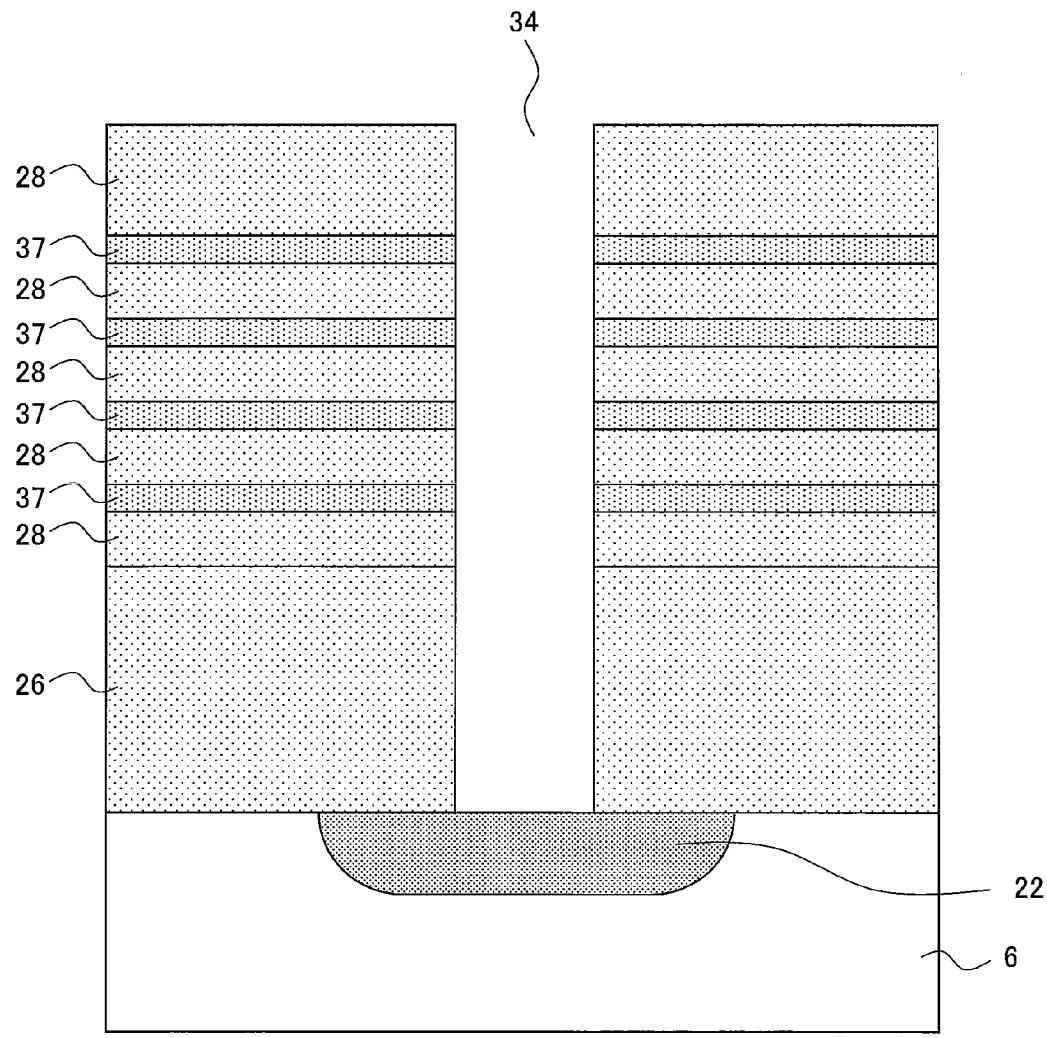
FIG. 27 is a schematic cross sectional diagram showing a step which is part of the manufacturing process for the three-dimensional memory cell array according to the third embodiment.

Next, as shown in FIG. 27, through holes 34 which penetrate through the multilayer structure of the second interlayer insulating film 28 and the metal films 37 as well as the first interlayer insulating film 26 so as to reach the surface of the silicon substrate 6 (the surface of the source 22 of the selection transistor 10 that forms the two-dimensional array 2 in the example of FIG. 27) is created through publicly known photolithography and dry etching. Metal films 37 in the layers are exposed from the sidewall of the through holes 34.

Figure 28:
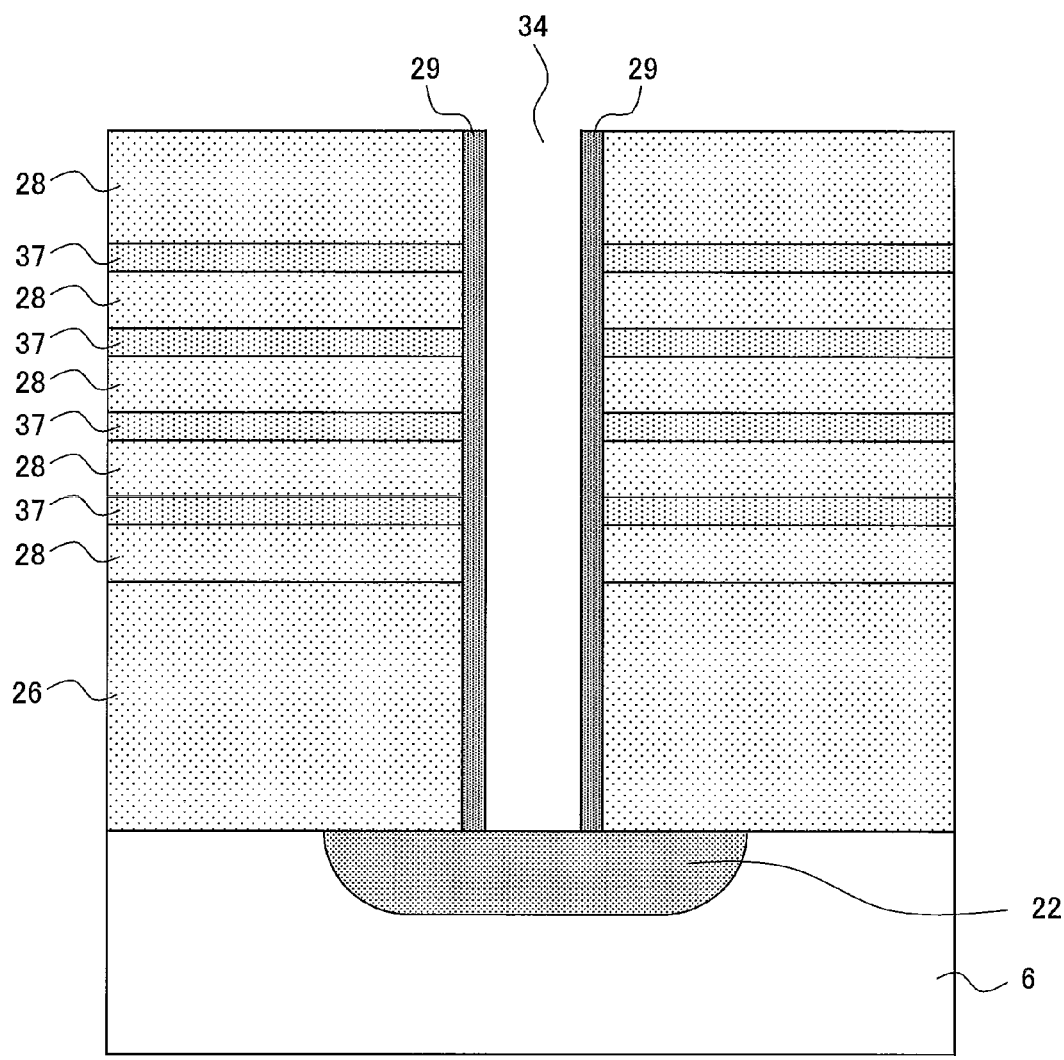
FIG. 28 is a schematic cross sectional diagram showing a step which is part of the manufacturing process for the three-dimensional memory cell array according to the third embodiment.

Next, as shown in FIG. 28, a metal oxide film that becomes a variable resistor 29 is deposited on the sidewall of through holes 34 through CVD (chemical vapor deposition method) or ALD (atomic layer deposition method), and after that, the metal oxide film deposited at the bottom of the through holes 34 is removed through RIE (reactive ion etching) so that the surface of the source 22 of the selection transistors 10 is exposed. The active region of the variable resistive elements 7 is formed on the sidewall of the through holes 34, and therefore, it is preferable for the metal oxide films to be formed through CVD or ALD as described above in accordance with which an isotropic film can be formed on the sidewall. In the case where TiN is used for the metal films 37, a metal oxide that becomes an n type semiconductor, such as $TiO_2$, $Ta_2O_5$, $HfO_2$ or $ZrO_2$, is used for the metal oxide films. In addition, in the case where a metal oxide that becomes a p type semiconductor, such as NiO or CoO, is used for the metal oxide films, a metal, such as Ti or Ta, is used for the metal films 37. It is desirable for the film thickness of the metal oxide films to be in a range of approximately 2 nm to 10 nm in order to keep the voltage value required for the write-in and erasure operations at approximately 2V.

Figure 29:
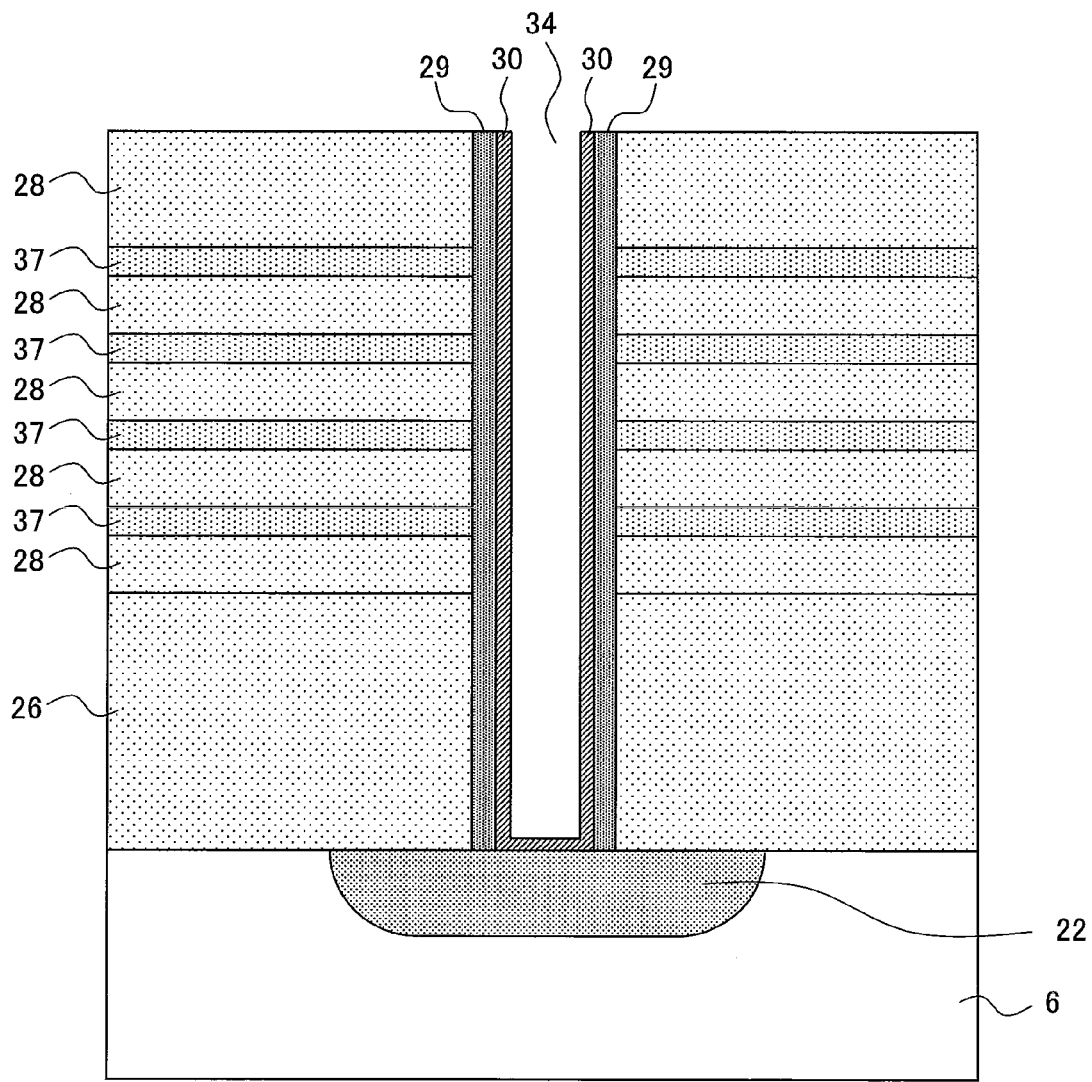
FIG. 29 is a schematic cross sectional diagram showing a step which is part of the manufacturing process for the three-dimensional memory cell array according to the third embodiment.

Next, as shown in FIG. 29, a metal electrode film 30 that becomes a first electrode of the variable resistive element 7 is formed on the sidewall of the through holes 34 where a variable resistor 29 is formed. A metal that is more easily oxidized by the metal oxide film that becomes the variable resistor 29 is used for the metal electrode film 30. In the case where a metal oxide, such as $TiO_2$, $Ta_2O_5$, $HfO_2$ or $ZrO_2$, is used for the metal oxide film, for example, Ti can be used for the metal electrode film 30 so that part of the oxygen in the variable resistor 29 that makes contact with the metal electrode film 30 is extracted through a solid phase reaction with the metal electrode film 30, and a metal oxide 29d having a conductance with a high level of oxygen deficiency is formed in the interface region between the variable resistor 29 and the metal electrode film 30, and thus, ohmic contact is made between the metal oxide 29d and the metal electrode film 30.

Figure 30:
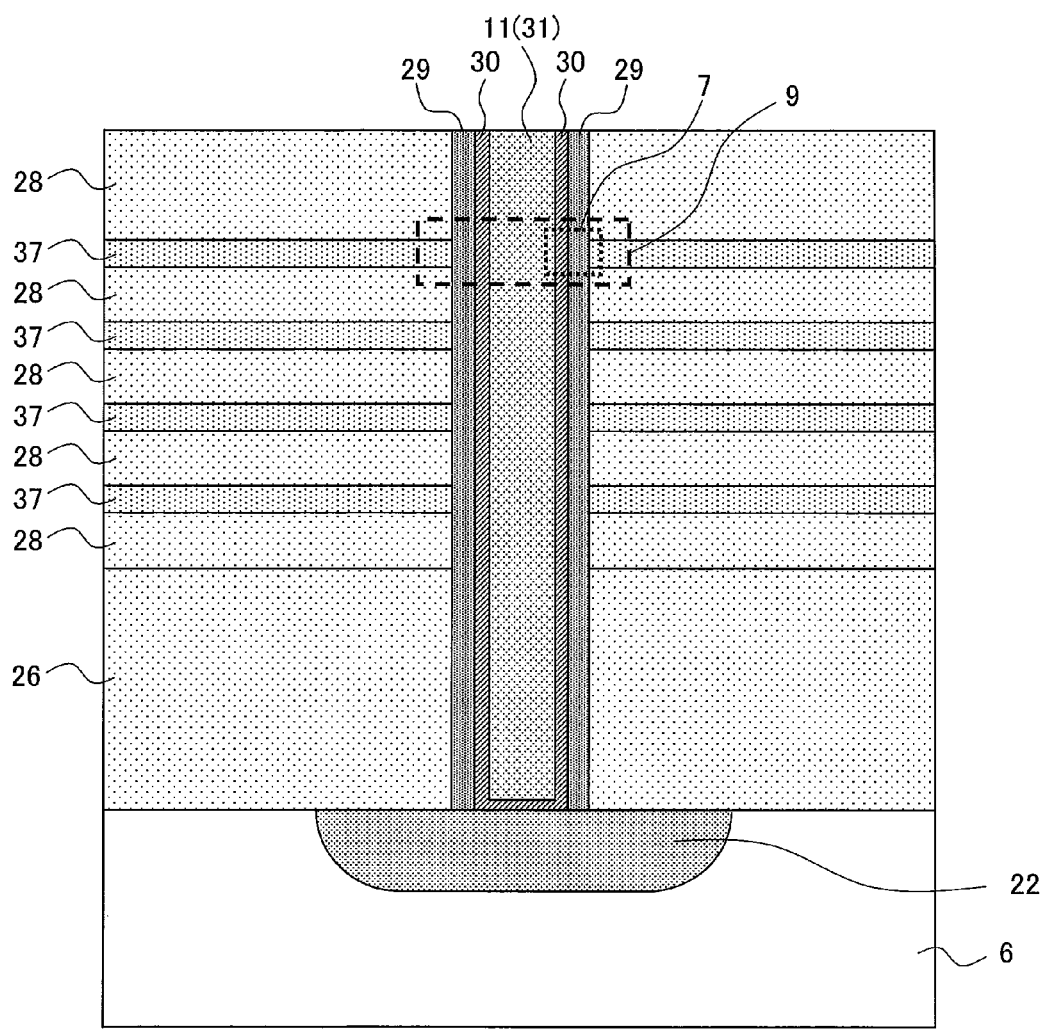
FIG. 30 is a schematic cross sectional diagram showing a step which is part of the manufacturing process for the three-dimensional memory cell array according to the third embodiment.

Next, as shown in FIG. 30, the hollow portions that remain in the through holes 34 after the formation of the metal electrode films 30 are filled in with a metal material 31, such as tungsten, in accordance with a CVD method so that middle selection lines 11 are formed of metal columns 31 that stand on the source 22 of the selection transistors 10 in the Z direction. The metal columns 31 may have a two-layer structure where TiN is provided between the outer peripheral surface of the tungsten and the metal electrode film 30.

Finally, a predetermined initialization voltage is applied between the common plates 12 and the middle selection lines 11, as shown in FIG. 25, when the insulating metal oxide 29c sandwiched between the common plates 12 and the middle selection lines 11 changes to a metal oxide 29e that allows for a switching operation. Here, an initialization process is complete on the metal oxide for the above described variable resistors 29 when the initialization voltage is in a range of approximately 3V to 5V and the time for the application thereof is in a range of 1 μsec to several msec, depending on the kind of metal oxide.

Fourth Embodiment

Next, the device according to the fourth embodiment of the present invention is described. Another example of the structure of 1R type memory cells 9 that is different from that in the third embodiment and used in the three-dimensional memory cell array 1 shown in FIG. 23 is described below. Here, in the following FIGS. 31 to 34, the same symbols are used for parts that form the three-dimensional memory cell array 1 corresponding to the parts in the first to third embodiments in order to make it easier to understand.

Figure 31:
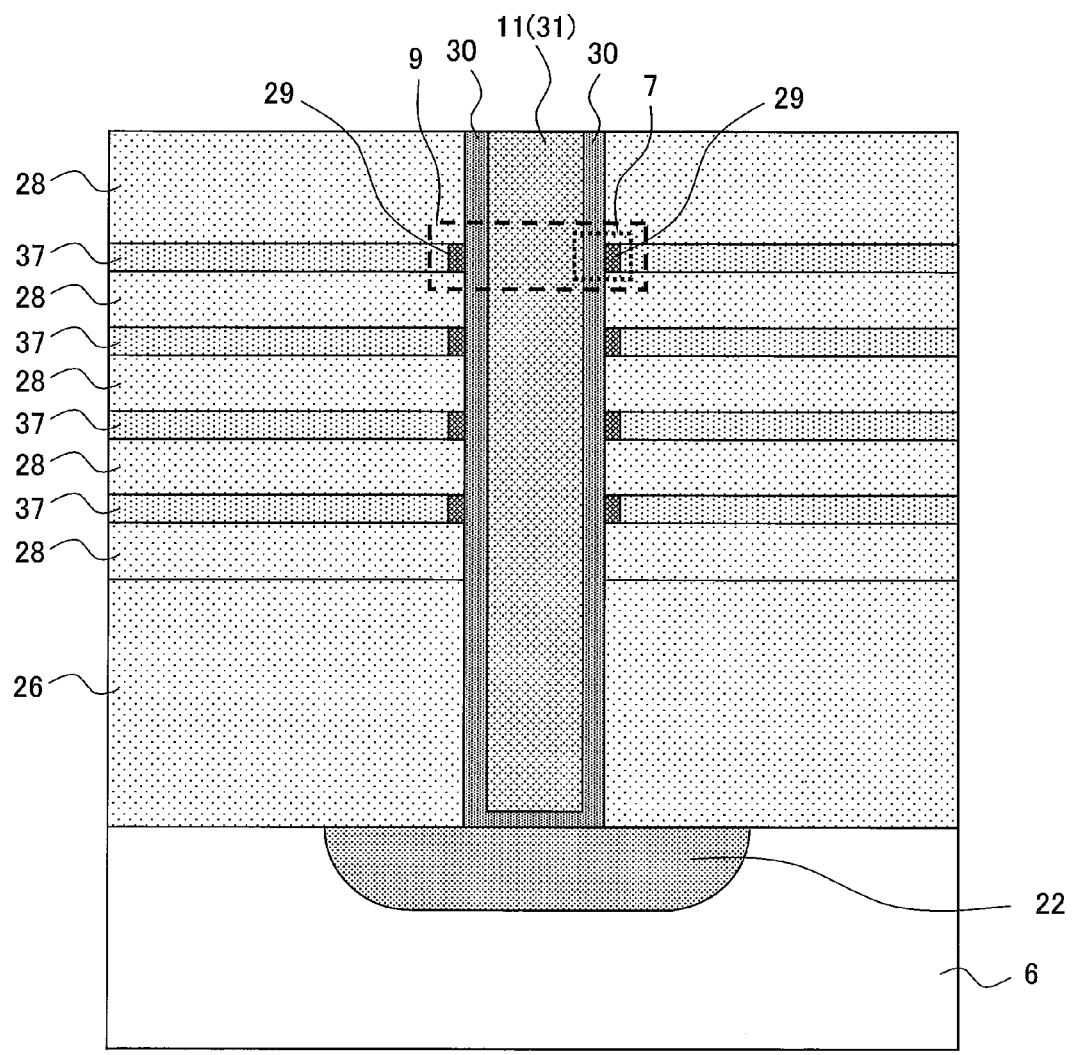
FIG. 31 is a schematic cross sectional diagram showing the structure of the main portion of the three-dimensional memory cell array according to the fourth embodiment in a YZ plane.

FIG. 31 shows another example of the structure of one middle selection line 11 and a number of 1R type memory cells 9 aligned in the Z direction and connected to the middle selection line 11 in a cross section in a YZ plane that passes through the middle selection line 11. In the same manner as in the first to third embodiments, memory cells 9 are formed in annular form around the periphery of a middle selection line 11 at intersections between a common plate 12 in one layer and one middle selection line 11. Concretely, the memory cells 9 are formed of a middle selection line 11 made of a metal column 31 that penetrates through the through hole 34 created in a common plate 12 in one layer in the Z direction, a metal electrode film 30 formed in cylindrical form around the outside of the middle selection line 11, a variable resistor 29 made of a metal oxide formed in annular form so as to make contact with the outer periphery of the metal electrode film 30, and a common plate 12. In the fourth embodiment, the variable resistors 29 are formed by oxidizing the end portion of the common plates 12 in annular form that is exposed from the inner wall of the through holes 34 so that the metal electrode film 30 and the common plate 12 respectively become the first and second electrodes of the variable resistive element.

In the fourth embodiment, the variable resistors 29 are formed so as to be separated in the Z direction in the same manner as the common plates 12 by the interlayer insulating films 28 which are alternately layered with common plates 12 in the Z direction. In this point, this embodiment is different from the third embodiment where the variable resistors 29 are formed in cylindrical form around the outside of the metal electrode films 30 and are not physically separated from each other in the Z direction. Separation of the variable resistors 29 by means of interlayer insulating films 28 is possible when, as described above, the variable resistors 29 are formed by oxidizing an end portion of the common plates 12 in annular form. The metal oxide in the variable resistors 29 is gained by partially oxidizing the common plates 12, and therefore, a change in the oxygen level is not steep between the variable resistors 29 and the common plates 12, and in many cases, the interface provides ohmic contact, and in the case where ohmic contact is provided between the variable resistors 29 and the common plates 12, the interface on the metal electrode film 30 side is a region where the resistance changes with the interface between the variable resistors 29 and the metal electrode films 30 providing a non-ohmic junction.

Though in the fourth embodiment, a region where the resistance changes is formed on the metal electrode film 30 side in the variable resistors 29 and the interface on the common plate 12 side provides ohmic contact, all of the variable resistors 29 are physically separated in the Z direction by means of interlayer insulating films 28, and therefore, no problem arises. In contrast, in the third embodiment, the region where the resistance changes is in the interface on the common plate 12 side in the variable resistors 29, and this region is separated in the Z direction by a metal oxide 29c with little oxygen deficiency that exhibit insulator-like properties, and therefore, no problem arises even in the case where the interface on the metal electrode film 30 side in the variable resistors 29 is not separated in the Z direction by ohmic contact.

Figure 32:
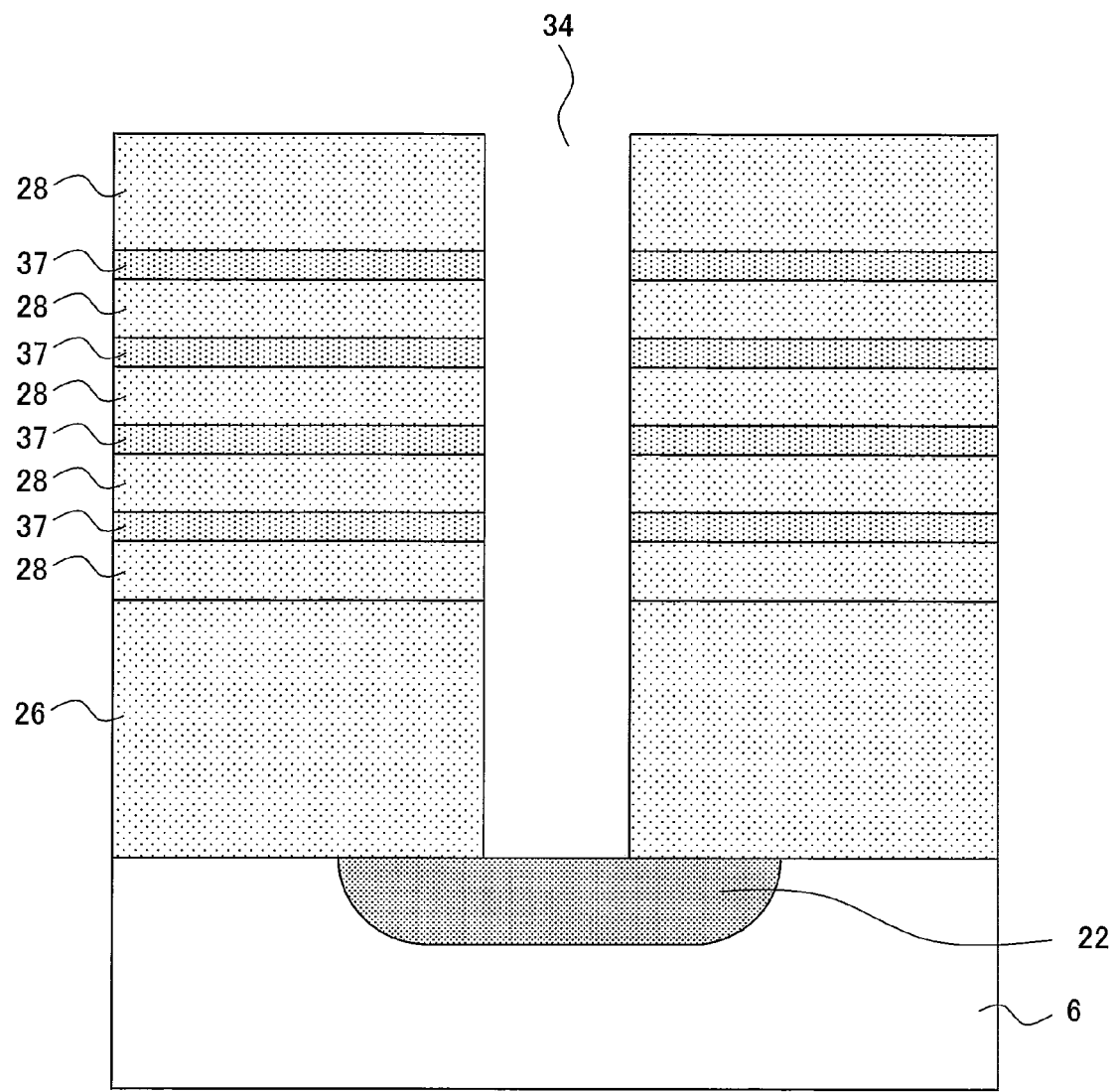
FIG. 32 is a schematic cross sectional diagram showing a step which is part of the manufacturing process for the three-dimensional memory cell array according to the fourth embodiment.
Figure 33:
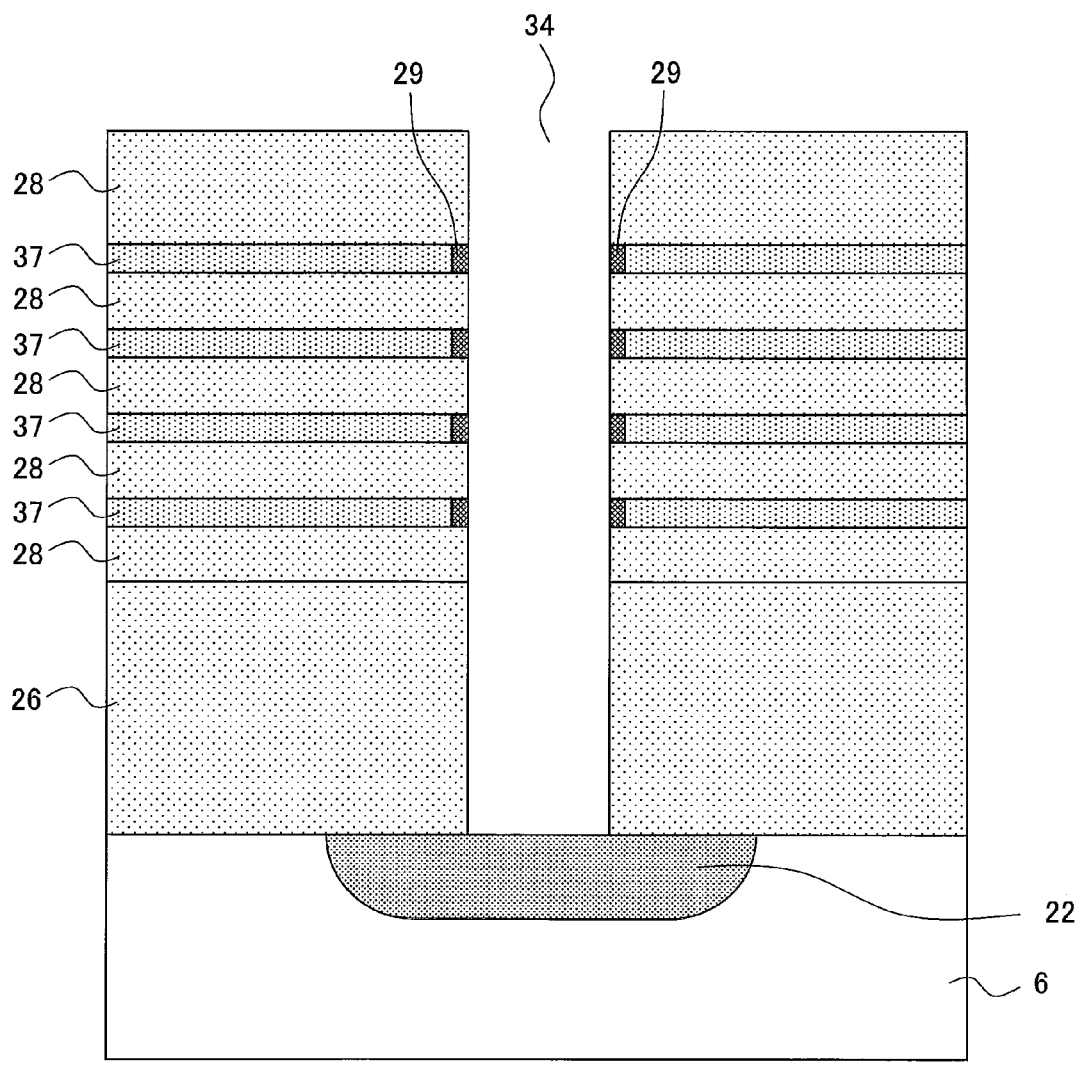
FIG. 33 is a schematic cross sectional diagram showing a step which is part of the manufacturing process for the three-dimensional memory cell array according to the fourth embodiment.
Figure 34:
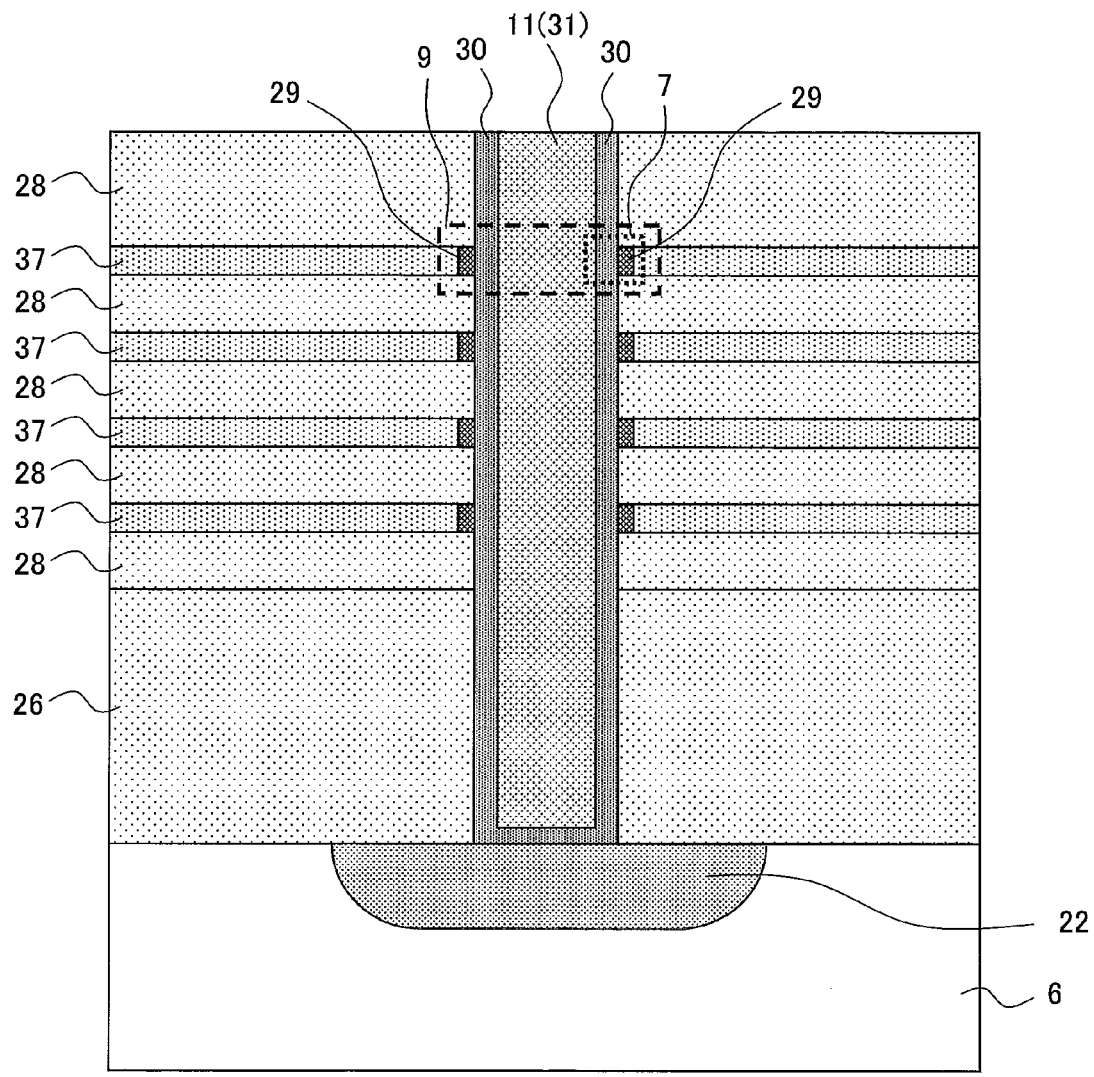
FIG. 34 is a schematic cross sectional diagram showing a step which is part of the manufacturing process for the three-dimensional memory cell array according to the fourth embodiment.

Next, the manufacturing process for the three-dimensional memory cell array 1 having the structure shown in FIG. 31 is described in reference to FIGS. 32 to 36. Here, FIGS. 32 to 34 are cross sectional diagrams in a YZ plane that passes through a middle selection line 11 in the same manner as in FIG. 31.

First, as shown in FIG. 32, a number of second interlayer insulating films 28 made of $SiO_2$ or the like and a number of metal films 37 that become common plates 12 are alternately layered on a first interlayer insulating film 26 on a silicon substrate 6 where a two-dimensional array 2 (not shown) is formed in the same manner as in the first and third embodiments. A metal that becomes a variable resistor when oxidized is used for the metal films 37. It is known that TiN and W, for example, become a metal oxide that is a variable resistor when oxidized, and this can be formed in an existing CMOS manufacturing process. The film thickness of the interlayer insulating films 28 is approximately 50 nm to 500 nm, and the film thickness of the metal films 37 is also approximately 50 nm to 500 nm. The number of layers of the metal films 37 is the number of layers of the complete memory cells 9 in the Z direction. FIG. 32 shows an example of a memory cell 9 where four layers are layered in the Z direction.

Next, as shown in FIG. 32, through holes 34 that penetrate through the multilayer structure of the second interlayer insulating films 28 and the metal films 37 as well as the first interlayer insulating film 26 so as to reach the surface of the silicon substrate 6 (the surface of the source 22 of a selection transistor 10 that forms the two-dimensional array 2 in the example of FIG. 32) are created through publicly known photolithography and dry etching. Metal films 37 in the respective layers are exposed from the sidewall of the through holes 34.

Next, as shown in FIG. 33, metal films 37 exposed from the sidewall of the through holes 34 are oxidized. This oxidization is possible as rapid oxidization, plasma oxidization or ozone oxidization through irradiation using a lamp in an existing device for oxidization during a semiconductor manufacturing process, for example. When end portions in annular form exposed from the sidewall of the through holes 34 in the metal films 37 are oxidized, variable resistors 29 are formed of a metal oxide in annular form. In the case where the metal films 37 are made of TiN or W, the metal oxide of the variable resistors 29 is TiOx or WOx.

Next, as shown in FIG. 34, metal electrode films 30 that become first electrodes of the variable resistive elements 7 are deposited on the sidewall of the through holes 34 after the formation of the variable resistors 29, and furthermore, the through holes 34 are filled in with a metal material 31. In the case where the variable resistors 29 are made of TiOx or WOx, the variable resistive elements can gain excellent switching properties when TiN is used for the metal electrode films 30. That is to say, the interface between the variable resistors 29 and the metal electrode films 30 provides non-ohmic contact. When the metal electrodes films 30 are made of Pt instead of TiN, equal or better switching properties can be gained. In accordance with a CVD method, the metal material 31 with which the through holes 34 are filled in may be tungsten in the same manner as in the third embodiment. Thus, middle selection lines 11 are formed of a metal material 31 in column form that stands on the source 22 of the selection transistors 10 in the Z direction.

Fifth Embodiment

Next, the device according to the fifth embodiment of the present invention is described. In the above described first and second embodiments, 1D1R type memory cells are formed of diodes with a PN junction or Schottky junction so that the elements have different resistances by several digits between when the element is biased in the forward direction and when the element is biased in the backward direction. That is to say, the direction of the current that flows through memory cells during operation, for example during the initialization operation for memory cells, the data write-in operation (set operation and reset operation), and the data readout operation, is limited to the forward direction of the diode, and therefore, it is necessary for the data write-in operation to be a unipolar operation where the voltage applied across the two ends of the variable resistive element is of the same polarity in the set operation and the reset operation.

Figure 35:
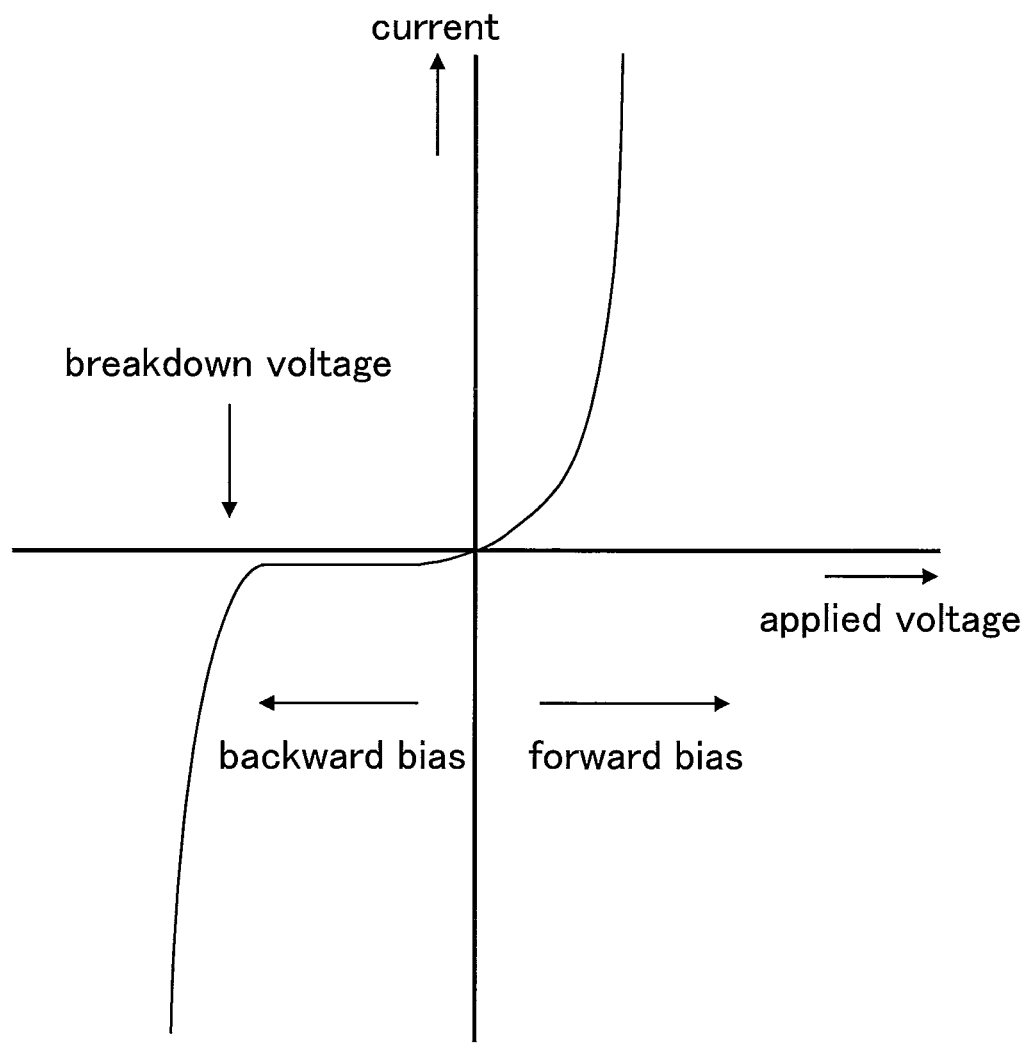
FIG. 35 is a graph schematically showing the current voltage properties of an example of a bidirectional current controlling element.

Incidentally, the reason why memory cells are formed of variable resistive elements and current limiting elements, such as diodes, that are connected in series is in order to eliminate the effects of the parasitic current that flows through non-selected memory cells in the case where a cross point type memory cell array is formed of 1R type memory cells. Accordingly, bidirectional current limiting elements, through which a current flows both when the elements are biased to the positive polarity and when they are biased to the negative polarity, by a certain threshold voltage or higher, can be used as the current limiting elements that form 1D1R type memory cells instead of elements having a different resistance by several digits between when the bias is in the forward direction and when it is in the backward direction. As the bidirectional current limiting elements, Zener diodes having a breakdown voltage for a bias in the backward direction, as shown in FIG. 35, and diodes having a double Schottky structure can be used. Memory cells are formed by connecting the bidirectional current limiting elements and variable resistive elements in series that can be written into through a bipolar operation where the voltage applied across the two ends of the variable resistive element have opposite polarities between the set operation and the reset operation, and the bipolar switching operation can be controlled by carrying out either the set operation or the reset operation under such conditions for voltage application that a bias of a breakdown voltage or higher is applied to the current limiting element when the bias across the current limiting element is in the backward direction, for example.

Variable resistive elements using cobalt monoxide (CoO) for the variable resistors 29 and Ta for the metal electrode films 30 that become first electrodes allow for a bipolar switching operation, and in this case, the bipolar switching operation is possible under the voltage conditions shown in the respective rows for the set operation and the reset operation in FIG. 36. According to the voltage conditions shown in FIG. 36, a set operation is carried out when the current limiting element is biased in the backward direction. Furthermore, in the case where bidirectional current limiting elements are used, the initialization operation is possible with the bias in the backward direction, and initialization is possible under the voltage conditions shown in the initialization operation row in FIG. 36.

In addition, it is also possible to form bidirectional current limiting elements from MIM type tunnel elements where an insulating film is sandwiched between an electrode metal, as shown in FIG. 35. When the tunnel barrier and the tunnel film thickness are adjusted so that the current that flows between the electrodes at the two ends of the tunnel element becomes a Fowler-Nordheim tunnel current, voltage and current properties that are nonlinear to the voltage applied across the electrodes are gained, and thus, it is possible to form bidirectional current limiting elements having the same properties as the current voltage properties in FIG. 35.

An example of the configuration when bidirectional MIM type tunnel elements are used as current limiting elements for forming 1D1R type memory cells is described below in reference to FIG. 37. Here, in the following FIG. 37, the same symbols are used for parts that form the three-dimensional memory cell array 1 corresponding to the parts in the first to third embodiments, in order to make the description easier to understand.

In the example of the configuration shown in FIG. 37, a tunnel insulating film 44 that becomes an MIM type tunnel element is inserted between the variable resistor 29 in the 1R type memory cell according to the third embodiment shown in FIG. 24, and the side wall of the through hole 34 (see FIG. 27) created in the multilayer structure of the metal films 37 and the interlayer insulating films 28 (that is to say, the respective end surfaces of the metal films 37 and the interlayer insulating films 28 on the side wall side). Here, the variable resistors 29 are made of a metal oxide in annular form having oxygen deficiency, as in the above described third embodiment, and the level of oxygen deficiency on the inner peripheral side is higher than on the outer peripheral side. Here, oxygen deficiency in the metal oxide film causes the conductivity. In this structure, the MIM tunnel element is formed of a variable resistor 29, which is one electrode, a metal film 37, which is the other electrode, and a tunnel insulating film 44 that is sandwiched between these electrodes. The tunnel insulating film 44 is formed of a metal oxide, such as $HfO_2$, $Al_2O_3$ or $TiO_2$ having as stoichiometric a composition as possible under such conditions that the oxygen deficiency is low. The thickness of the tunnel oxide film 44 is 2 nm to 10 nm, so that the structure allows a Fowler-Nordheim tunnel current to flow under desired conditions for applying a voltage for operation.

Next, the manufacturing method for the three-dimensional memory cell array 1 having the structure shown in FIG. 37 is described. As described above, the three-dimensional memory cell array 1 having the structure shown in FIG. 37 is formed by adding a tunnel insulating film 44 to the 1R type memory cells in the third embodiment shown in FIG. 24, and therefore, FIG. 27 is referred to for the manufacturing process for the three-dimensional memory cell array 1 according to the third embodiment. After through holes 34 are created as shown in FIG. 27, tunnel insulating films 44 are formed on the side walls of the through holes 34 in accordance with a deposition method that allows a film to be deposited uniformly on the side walls, such as ALD, and then variable resistors 29 are formed, and the variable resistors 29 and the tunnel insulating films 44 deposited at the bottom of the through holes 34 are removed through anisotropic etching, for example through RIE. Hereinafter, metal electrode films 30 and metal columns 31 are formed so as to fill the through holes 34, as in the third embodiment. Here, the material and method for formation are the same for the metal films 37, the variable resistors 29, the metal electrode films 30 and the metal columns 31 as in the third embodiment, and therefore, the descriptions are not repeated.

Sixth Embodiment

Next, the device according to the sixth embodiment of the present invention is described. Another example of the configuration in the case where bidirectional MIM type tunnel elements are used as current limiting elements for forming 1D1R type memory cells is described in reference to FIG. 38. Here, in the following FIG. 38, the same symbols are used for parts that form the three-dimensional memory cell array 1 corresponding to those in the first to fifth embodiments in order to make the description easier to understand.

Though in the fifth embodiment, a tunnel insulating film 44 is inserted between a variable resistor 29 and a metal film 37 so that a bidirectional current limiting element is formed in the 1R type memory cell according to the third embodiment, in the sixth embodiment, a tunnel insulating film 44 is inserted between a variable resistor 29 and a metal electrode film 30, so that a bidirectional current limiting element is formed in the 1R type memory cell according to the fourth embodiment shown in FIG. 31. That is to say, in the example of the configuration shown in FIG. 38, a tunnel insulating film 44 that becomes an MIM type tunnel element is inserted between the side wall of the through hole 34 created in the multilayer structure of metal films 37 and interlayer insulating films 28 after an oxidation process (that is to say, the end surfaces of the variable resistors 29 the interlayer insulating films 28 on the side wall side (see FIG. 33)) and the metal electrode film 30. In this structure, the MIM type tunnel element is formed of a variable resistor 29, which is one electrode, a metal electrode film 30, which is the other electrode, and a tunnel insulating film 44 that is sandwiched between these two electrodes. The tunnel insulating film 44 is formed of a metal oxide having as stoichiometric a composition as possible, such as $HfO_2$, $Al_2O_3$ or $TiO_2$, under such conditions that the oxygen deficiency is low. The thickness of the tunnel oxide film 44 is 2 nm to 10 nm, so that the structure allows a Fowler-Nordheim tunnel current to flow under desired conditions for applying a voltage for operation.

Figure 38:
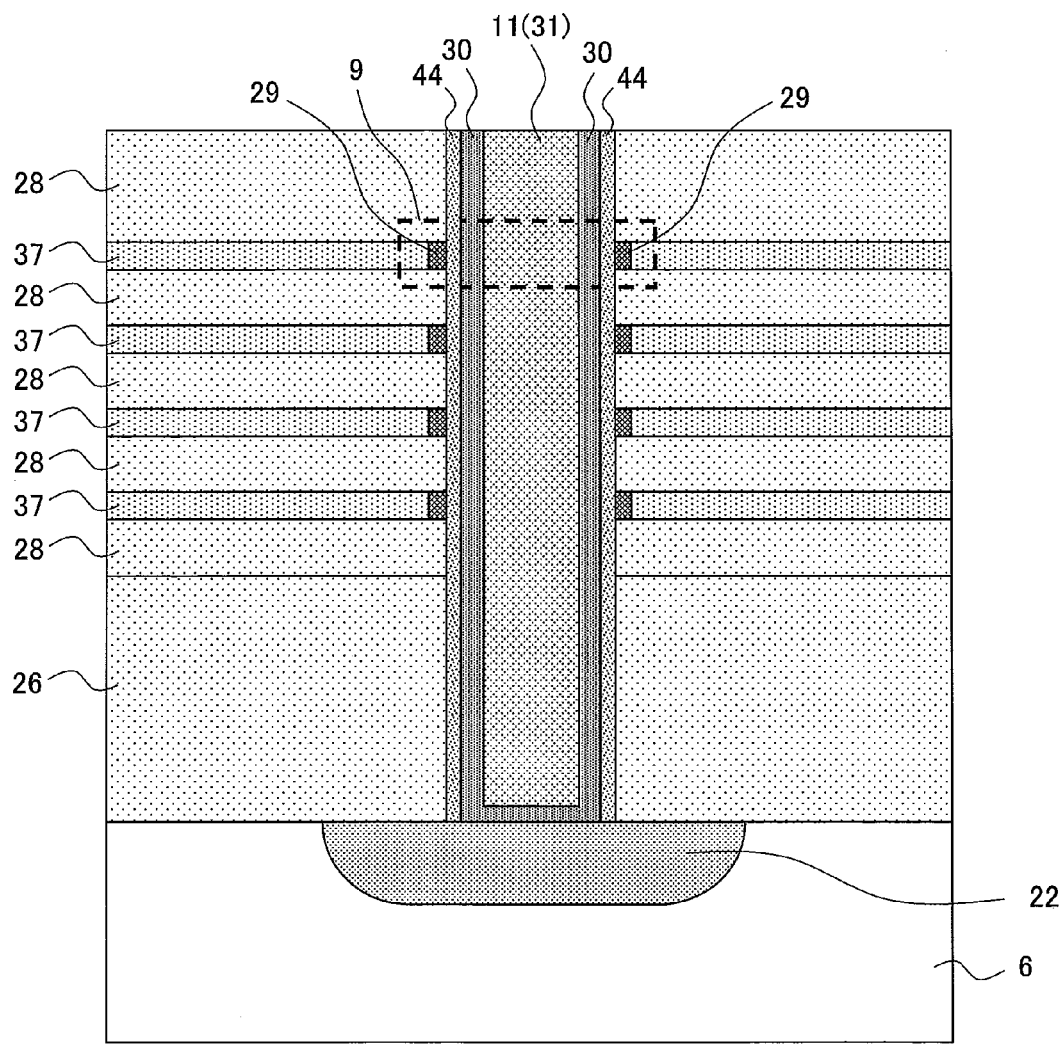
FIG. 38 is a schematic cross sectional diagram showing the structure of the main portion of the three-dimensional memory cell array according to the sixth embodiment in a YZ plane.

Next, the manufacturing method for the three-dimensional memory cell array 1 having the structure shown in FIG. 38 is described. As described above, the three-dimensional memory cell array 1 having the structure shown in FIG. 38 is formed by adding a tunnel insulating film 44 to the 1R type memory cell according to the fourth embodiment shown in FIG. 31, and therefore, FIGS. 32 and 33 are referred to for the manufacturing process for the three-dimensional memory cell array 1 according to the fourth embodiment. The metal films 37 exposed from the side wall of the through hole 34 shown in FIG. 32 are oxidized, so that variable resistors 29 that are sandwiched between interlayer insulating films 28 from the top and bottom are formed as shown in FIG. 33, and after that, a tunnel insulating film 44 is formed on the side wall of the through hole 34 in accordance with a deposition method that allows a film to be uniformly formed on the side wall, such as ALD, and then the tunnel insulating film 44 deposited at the bottom of the through hole 34 is removed through anisotropic etching, for example through RIE. Hereinafter, a metal electrode film 30 and a metal column 31 are formed and the through hole 34 is filled in, as in the fourth embodiment. Here, the material and method for formation are the same for the metal films 37, the variable resistors 29, the metal electrode films 30 and the metal columns 31 as in the fourth embodiment, and therefore, the descriptions are not repeated. In addition, it is preferable for the variable resistors 29 to be made of a metal oxide in annular form having oxygen deficiency, as in the above described third and fifth embodiments, so that the oxygen deficiency in the film causes the conductivity.

Next, the devices according to other embodiments of the present invention are described.

(1) In the above described first and second embodiments, in the case where a non-ohmic junction is formed in the interface between the polycrystal silicon film 33 and the variable resistor 29, and a region in which the resistance changes is formed in the variable resistor 29 on the side of the interface between the variable resistor 29 and the polycrystal silicon film 33, it is preferable for the metal electrode film 30 to be made of a material that oxidizes more easily than the metal oxide film of the variable resistor 29, so that the level of oxygen deficiency becomes different in the direction of the diameter, as in the third embodiment, in order to make the interface between the variable resistor 29 and the metal electrode film 30 an ohmic junction without fail.

(2) Instead of the step of forming PN junctions by introducing an impurity of the opposite conductivity as in the above described first and second embodiments, metal or metal silicide may be selectively formed on the end surface of the polycrystal silicon films 32 exposed from the side wall of the through hole 34, so that Schottky junctions in annular form can be formed in the interface between the metal or metal silicide and the polycrystal silicon films 32 during the process for forming diodes 8 shown in FIG. 8. Diodes 8 are formed on both sides of the Schottky junctions in annular form. Metal or metal silicide can be selectively formed on the end surface of the polycrystal silicon films 32 in accordance with a publicly known selective silicide method (generally referred to as salicide). Ni or Co is deposited on p type or n type polycrystal silicon having an impurity concentration of approximately $10^{18}/cm^3$ or less, for example, and the Ni or Co reacts with the polycrystal silicon through the surface where the two make contact when heat is applied using a lamp, and unreacted metal is removed, so that silicide can be fabricated in a self-aligned manner. Though a Schottky barrier can be formed from Ti silicide for p type polycrystal silicon, or from Pt silicide for n type polycrystal silicon, Ni and Co have are average in terms of their work function, which makes it possible to form a Schottky barrier for both p type and n type polycrystal silicon, and therefore, the process is easy.

Here, in the case where diodes 8 are formed of Schottky junctions, by forming Ti silicide on the end surface of the p type polycrystal silicon films 32, and an n type metal oxide of $TiO_2$, $HfO_2$ or $Ta_2O_5$ is used as the metal oxide for the variable resistors 29, the interface between the variable resistors 29 and the Ti silicide provides ohmic junctions, and therefore, it is desirable for the metal electrode films 30 to be made of a metal that provides a non-ohmic junction in the interface between the metal and the variable resistors 29. As the metal film 30, TiN can be used, as in the fourth embodiment, for example, and thus, excellent switching properties can be gained for the variable resistive elements.

(3) Though in the above described embodiments, n type MOS transistors are used for the selection transistors 10, the selection transistors 10 may be p type MOS transistors. In addition, it is also possible to form selection transistors 10 from bipolar transistors instead of from MOS transistors.

(4) The configuration of the logic circuit for the X decoder 3, the Y decoder 4 and the Z decoder 5 in FIG. 4 is an example of a case where the conditions for voltage application are as shown in FIG. 17, and the circuit configuration may be modified if necessary, for example in the case where a bipolar switching operation is used for the write-in operation.

(5) Though in the above described embodiments, a number of selection transistors 10 are aligned linearly in the X direction and Y direction, selection transistors 10 may be aligned in the X direction and Y direction in such a manner that the selective transistors 1 alternate in one and the other direction or every other transistor is on a different line. In such cases, through holes 34 may be aligned in zigzag in the X direction and Y direction instead of being aligned linearly. Furthermore, word lines 13 and bit lines 14 may also be formed in zigzag instead of extending linearly.

The nonvolatile semiconductor memory device and manufacturing method for the same according to the present invention are applicable for nonvolatile semiconductor memory devices with a three-dimensional memory cell array where a number of memory cells with two terminals having nonvolatile variable resistive elements are aligned in a three-dimensional matrix where the first direction, the second direction and the third direction are perpendicular to each other.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising
a three-dimensional memory cell array where memory cells with two terminals are aligned in a three-dimensional matrix where a first direction, a second direction and a third direction are perpendicular to each other, the memory cells each having a nonvolatile variable resistive element of which resistive properties change when a voltage is applied, wherein
two or more plate electrodes are layered in the third direction with interlayer insulating films in between, the plate electrodes being formed of conductors or semiconductors in plate form that expand planewise in the first and second directions,
a number of through holes are created in each of the plate electrodes, the through holes penetrating through the two or more layered plate electrodes and the interlayer insulating films between the plate electrodes in the third direction,
columnar electrodes formed of conductors in columnar form extend in the third direction and penetrate through the through holes without making contact with the plate electrodes,
each annular portion sandwiched between one of the plate electrodes and one of the columnar electrodes corresponds to one of the memory cells,
a variable resistive material that becomes the variable resistive element is formed in annular form in the annular portion so that an outer peripheral surface of the variable resistive material in annular form is electrically connected to each of the plate electrodes and an inner peripheral surface is electrically connected to each of the columnar electrodes, and thus the variable resistive element is formed for each of the memory cells,
the memory cells aligned at a same point in the third direction are connected to each other via one of the plate electrodes, the memory cells aligned at a same point in the first and second directions are connected to each other via one of the columnar electrodes, an interface with a Schottky junction is formed on either the outer peripheral surface or the inner peripheral surface of the variable resistive material in the annular portion, and at least part of the variable resistive material on a Schottky junction side is formed so as to be separate in the third direction, the variable resistive element is converted to an active state, in which a switching operation is possible, by initialization operation, at least part of the variable resistive material on the Schottky junction side is separate in the third direction with a non-active region formed of a same material as the variable resistive material in between, and the non-active region is a region of the variable resistive material which is not converted to the active state by the initialization operation.

2. The nonvolatile semiconductor memory device according to claim 1, wherein the through holes are aligned in a two-dimensional matrix in the first and second directions.

3. The nonvolatile semiconductor memory device according to claim 1, wherein each of the memory cells is formed such that the variable resistive element and a current controlling element with two terminals are connected in series, and the current controlling element is formed in annular form around an outer periphery of the variable resistive material in annular form as a diode with a PN junction of polycrystal silicon, a Schottky junction between polycrystal silicon and a metal or a metal silicide, or a Schottky junction between a metal oxide semiconductor and a metal.

4. The nonvolatile semiconductor memory device according to claim 3, wherein a PN junction is formed in annular form in an interface between an end portion in annular form of each of the plate electrodes which makes contact with the variable resistive material in annular form and a main body portion excluding the end portion, and one of the end portion and the main body portion is polycrystal silicon in which a p type impurity is diffused, and other thereof is polycrystal silicon in which an n type impurity is diffused.

5. The nonvolatile semiconductor memory device according to claim 3, wherein a main body portion of each of the plate electrodes excluding an end portion in annular form that makes contact with the variable resistive material in annular form is formed of polycrystal silicon in which a p type or n type impurity is diffused, a metal or a metal silicide is formed in the end portion in annular form, and a Schottky junction is formed in an interface between the polycrystal silicon and the metal or the metal silicide.

6. A nonvolatile semiconductor memory device comprising a three-dimensional memory cell array where memory cells with two terminals are aligned in a three-dimensional matrix where a first direction, a second direction and a third direction are perpendicular to each other, the memory cells each having a nonvolatile variable resistive element of which resistive properties change when a voltage is applied, wherein two or more plate electrodes are layered in the third direction with interlayer insulating films in between, the plate electrodes being formed of conductors or semiconductors in plate form that expand planewise in the first and second directions, a number of through holes are created in each of the plate electrodes, the through holes penetrating through the two or more layered plate electrodes and the interlayer insulating films between the plate electrodes in the third direction, columnar electrodes formed of conductors in columnar form extend in the third direction and penetrate through the through holes without making contact with the plate electrodes, each annular portion sandwiched between one of the plate electrodes and one of the columnar electrodes corresponds to one of the memory cells, a variable resistive material that becomes the variable resistive element is formed in annular form in the annular portion so that an outer peripheral surface of the variable resistive material in annular form is electrically connected to each of the plate electrodes and an inner peripheral surface is electrically connected to each of the columnar electrodes, and thus the variable resistive element is formed for each of the memory cells, the memory cells aligned at a same point in the third direction are connected to each other via one of the plate electrodes, the memory cells aligned at a same point in the first and second directions are connected to each other via one of the columnar electrodes, an interface with a Schottky junction is formed on either the outer peripheral surface or the inner peripheral surface of the variable resistive material in the annular portion, and at least part of the variable resistive material on a Schottky junction side is formed so as to be separate in the third direction the variable resistive material in annular is a metal oxide, and the metal oxide has a distribution of oxygen deficiency in a direction of a diameter of a ring so that the oxygen deficiency on an outer peripheral side is lower than that on an inner peripheral side.

7. The nonvolatile semiconductor memory device according to claim 1, wherein each of the memory cells is formed such that the variable resistive element and a bidirectional current controlling element with two terminals are connected in series, a tunnel insulating film is inserted in annular form in a border portion between the outer peripheral surface of the variable resistive material in annular form and each of the plate electrodes, so that the current controlling element has such a structure that the tunnel insulating film is sandwiched between the variable resistive material and each of the plate electrodes, the variable resistive material in annular is a metal oxide, the metal oxide has a distribution of oxygen deficiency in a direction of a diameter of a ring so that the oxygen deficiency on an outer peripheral side is lower than that on an inner peripheral side.

8. The nonvolatile semiconductor memory device according to claim 1, wherein at least part of the variable resistive material on the Schottky junction side is formed so as to be separate in the third direction with each of the interlayer insulating films in between.

9. The nonvolatile semiconductor memory device according to claim 1, wherein the plate electrodes are formed of metal conductors, the variable resistive material in annular form is a metal oxide, and the metal oxide is an oxide of a conductive material that forms the plate electrodes.

10. The nonvolatile semiconductor memory device according to claim 9, wherein
each of the memory cells is formed such that the variable resistive element and a bidirectional current controlling element with two terminals are connected in series,
a tunnel insulating film is inserted in annular form in a border portion between the inner peripheral surface of the variable resistive material in annular form and each of the columnar electrodes, so that the current controlling element has a structure where the tunnel insulating film is sandwiched between the variable resistive material and each of the columnar electrodes.

11. The nonvolatile semiconductor memory device according to claim 1, wherein
the variable resistive material in annular form is a metal oxide, and the metal oxide is made of an oxide of one element selected from among Ni, Co, Ti, Ta, Hf, Cu, Zr, Al and Nb.

* * * * *